United States Patent
McLaurin et al.

(10) Patent No.: US 9,871,350 B2
(45) Date of Patent: Jan. 16, 2018

(54) MANUFACTURABLE RGB LASER DIODE SOURCE

(71) Applicant: Soraa Laser Diode, Inc., Goleta, CA (US)

(72) Inventors: Melvin McLaurin, Santa Barbara, CA (US); Alexander Sztein, Santa Barbara, CA (US); Po Shan Hsu, Acradia, CA (US); Eric Goutain, Fremont, CA (US); James W. Raring, Santa Barbara, CA (US); Paul Rudy, Goleta, CA (US); Vlad Novotny, Los Gatos, CA (US)

(73) Assignee: Soraa Laser Diode, Inc., Goleta, CA (US)

( * ) Notice: Subject to any disclaimer, the term of this patent is extended or adjusted under 35 U.S.C. 154(b) by 0 days.

(21) Appl. No.: 15/180,737

(22) Filed: Jun. 13, 2016

(65) Prior Publication Data
US 2016/0372893 A1 Dec. 22, 2016

Related U.S. Application Data

(63) Continuation-in-part of application No. 14/312,427, filed on Jun. 23, 2014, now Pat. No. 9,379,525, which
(Continued)

(51) Int. Cl.
*H01L 21/00* (2006.01)
*H01S 5/40* (2006.01)
(Continued)

(52) U.S. Cl.
CPC ............ *H01S 5/4093* (2013.01); *H01L 24/83* (2013.01); *H01L 24/95* (2013.01);
(Continued)

(58) Field of Classification Search
USPC .............. 438/33, 68, 113, 460, 91, 237, 458
See application file for complete search history.

(56) References Cited

U.S. PATENT DOCUMENTS

| 4,341,592 A | 7/1982 | Shortes et al. |
| 4,860,687 A | 8/1989 | Frijlink |
(Continued)

FOREIGN PATENT DOCUMENTS

| CN | 104836117 | 8/2015 |
| CN | 104836118 | 8/2015 |
(Continued)

OTHER PUBLICATIONS

U.S. Appl. No. 14/175,622, Non-Final Office Action dated Apr. 27, 2015, 13 pages.
(Continued)

*Primary Examiner* — Timor Karimy
(74) *Attorney, Agent, or Firm* — Kilpatrick Townsend & Stockton LLP

(57) ABSTRACT

A multi-wavelength light emitting device is manufactured by forming first and second epitaxial materials overlying first and second surface regions. The first and second epitaxial materials are patterned to form a plurality of first and second epitaxial dice. At least one of the first plurality of epitaxial dice and at least one of the second plurality of epitaxial dice are transferred from first and second substrates, respectively, to a carrier wafer by selectively etching a release region, separating from the substrate each of the epitaxial dice that are being transferred, and selectively bonding to the carrier wafer each of the epitaxial dice that are being transferred. The transferred first and second epitaxial dice are processed on the carrier wafer to form a plurality of light emitting devices capable of emitting at least a first wavelength and a second wavelength.

36 Claims, 43 Drawing Sheets

Example of transfer of die from multiple substrates

Example of transfer of die from multiple substrates

Related U.S. Application Data is a continuation-in-part of application No. 14/176,403, filed on Feb. 10, 2014, now Pat. No. 9,362,715.

(51) Int. Cl.

| | |
|---|---|
| *H01L 33/00* | (2010.01) |
| *H01S 5/323* | (2006.01) |
| *H01L 23/00* | (2006.01) |
| *H01S 5/02* | (2006.01) |
| *H01S 5/022* | (2006.01) |
| *H01S 5/22* | (2006.01) |

(52) U.S. Cl.
CPC ...... *H01L 33/0045* (2013.01); *H01L 33/0075* (2013.01); *H01S 5/0203* (2013.01); *H01S 5/0217* (2013.01); *H01S 5/0224* (2013.01); *H01S 5/32341* (2013.01); *H01L 2224/16225* (2013.01); *H01L 2224/48091* (2013.01); *H01L 2224/48465* (2013.01); *H01L 2924/16152* (2013.01); *H01S 5/0216* (2013.01); *H01S 5/2201* (2013.01); *H01S 5/4025* (2013.01)

(56) References Cited

U.S. PATENT DOCUMENTS

| | | |
|---|---|---|
| 4,911,102 A | 3/1990 | Manabe et al. |
| 5,331,654 A | 7/1994 | Jewell et al. |
| 5,334,277 A | 8/1994 | Nakamura |
| 5,366,953 A | 11/1994 | Char et al. |
| 5,474,021 A | 12/1995 | Tsuno et al. |
| 5,527,417 A | 6/1996 | Iida et al. |
| 5,562,127 A | 10/1996 | Fanselow et al. |
| 5,607,899 A | 3/1997 | Yoshida et al. |
| 5,632,812 A | 5/1997 | Hirabayashi |
| 5,696,389 A | 12/1997 | Ishikawa et al. |
| 5,821,555 A | 10/1998 | Saito et al. |
| 5,888,907 A | 3/1999 | Tomoyasu et al. |
| 5,926,493 A | 7/1999 | O'Brien et al. |
| 5,951,923 A | 9/1999 | Horie et al. |
| 5,985,687 A | 11/1999 | Bowers et al. |
| 6,069,394 A | 5/2000 | Hashimoto et al. |
| 6,147,953 A | 11/2000 | Duncan |
| 6,153,010 A | 11/2000 | Kiyoku et al. |
| 6,239,454 B1 | 5/2001 | Glew et al. |
| 6,379,985 B1 | 4/2002 | Cervantes et al. |
| 6,451,157 B1 | 9/2002 | Hubacek |
| 6,489,636 B1 | 12/2002 | Goetz et al. |
| 6,562,127 B1 | 5/2003 | Kud et al. |
| 6,586,762 B2 | 7/2003 | Kozaki |
| 6,635,904 B2 | 10/2003 | Goetz et al. |
| 6,680,959 B2 | 1/2004 | Tanabe et al. |
| 6,734,461 B1 | 5/2004 | Shiomi et al. |
| 6,755,932 B2 | 6/2004 | Masuda et al. |
| 6,809,781 B2 | 10/2004 | Setlur et al. |
| 6,814,811 B2 | 11/2004 | Ose |
| 6,833,564 B2 | 12/2004 | Shen et al. |
| 6,858,081 B2 | 2/2005 | Biwa et al. |
| 6,920,166 B2 | 7/2005 | Akasaka et al. |
| 7,009,199 B2 | 3/2006 | Hall |
| 7,033,858 B2 | 4/2006 | Chai et al. |
| 7,053,413 B2 | 5/2006 | D'Evelyn et al. |
| 7,063,741 B2 | 6/2006 | D'Evelyn |
| 7,128,849 B2 | 10/2006 | Setlur et al. |
| 7,220,324 B2 | 5/2007 | Baker et al. |
| 7,303,630 B2 | 12/2007 | Motoki et al. |
| 7,312,156 B2 | 12/2007 | Granneman et al. |
| 7,323,723 B2 | 1/2008 | Ohtsuka et al. |
| 7,338,828 B2 | 3/2008 | Imer et al. |
| 7,358,542 B2 | 4/2008 | Radkov et al. |
| 7,358,543 B2 | 4/2008 | Chua et al. |
| 7,390,359 B2 | 6/2008 | Miyanaga et al. |
| 7,470,555 B2 | 12/2008 | Matsumura |
| 7,483,466 B2 | 1/2009 | Uchida et al. |
| 7,489,441 B2 | 2/2009 | Scheible et al. |
| 7,555,025 B2 | 6/2009 | Yoshida |
| 7,691,658 B2 | 4/2010 | Kaeding et al. |
| 7,727,332 B2 | 6/2010 | Habel et al. |
| 7,733,571 B1 | 6/2010 | Li |
| 7,749,326 B2 | 7/2010 | Kim et al. |
| 7,806,078 B2 | 10/2010 | Yoshida |
| 7,858,408 B2 | 12/2010 | Mueller et al. |
| 7,862,761 B2 | 1/2011 | Okushima et al. |
| 7,923,741 B1 | 4/2011 | Zhai et al. |
| 7,939,354 B2 | 5/2011 | Kyono et al. |
| 7,968,864 B2 | 6/2011 | Akita et al. |
| 8,017,932 B2 | 9/2011 | Okamoto et al. |
| 8,044,412 B2 | 10/2011 | Murphy et al. |
| 8,143,148 B1 | 3/2012 | Raring et al. |
| 8,247,887 B1 | 8/2012 | Raring et al. |
| 8,252,662 B1 | 8/2012 | Poblenz et al. |
| 8,259,769 B1 | 9/2012 | Raring et al. |
| 8,314,429 B1 | 11/2012 | Raring et al. |
| 8,351,478 B2 | 1/2013 | Raring et al. |
| 8,355,418 B2 | 1/2013 | Raring et al. |
| 8,422,525 B1 | 4/2013 | Raring et al. |
| 9,209,596 B1 | 12/2015 | McLaurin et al. |
| 9,246,311 B1 | 1/2016 | Raring et al. |
| 9,362,715 B2 | 6/2016 | Sztein et al. |
| 9,368,939 B2 | 6/2016 | McLaurin et al. |
| 9,379,525 B2 | 6/2016 | McLaurin et al. |
| 9,401,584 B1 | 7/2016 | McLaurin et al. |
| 9,520,695 B2 | 12/2016 | Hsu et al. |
| 9,520,697 B2 | 12/2016 | Steigerwald et al. |
| 9,653,642 B1 | 5/2017 | Raring et al. |
| 9,666,677 B1 | 5/2017 | Raring et al. |
| 9,711,949 B1 | 7/2017 | Raring |
| 9,755,398 B2 | 9/2017 | Sztein |
| 9,774,170 B2 | 9/2017 | McLaurin |
| 2002/0050488 A1 | 5/2002 | Nikitin et al. |
| 2002/0085603 A1 | 7/2002 | Okumura |
| 2002/0171092 A1 | 11/2002 | Goetz et al. |
| 2003/0000453 A1 | 1/2003 | Unno et al. |
| 2003/0001238 A1 | 1/2003 | Ban |
| 2003/0012243 A1 | 1/2003 | Okumura |
| 2003/0020087 A1 | 1/2003 | Goto et al. |
| 2003/0140846 A1 | 7/2003 | Biwa et al. |
| 2003/0216011 A1 | 11/2003 | Nakamura et al. |
| 2004/0025787 A1 | 2/2004 | Selbrede et al. |
| 2004/0060518 A1 | 4/2004 | Nakamura et al. |
| 2004/0104391 A1 | 6/2004 | Maeda et al. |
| 2004/0112866 A1 | 6/2004 | Maleville et al. |
| 2004/0151222 A1 | 8/2004 | Sekine |
| 2004/0196877 A1 | 10/2004 | Kawakami et al. |
| 2004/0222357 A1 | 11/2004 | King et al. |
| 2004/0247275 A1 | 12/2004 | Vakhshoori et al. |
| 2004/0259331 A1 | 12/2004 | Ogihara et al. |
| 2004/0262624 A1 | 12/2004 | Akita et al. |
| 2005/0040384 A1 | 2/2005 | Tanaka et al. |
| 2005/0072986 A1 | 4/2005 | Sasaoka |
| 2005/0158896 A1 | 7/2005 | Hayashi et al. |
| 2005/0168564 A1 | 8/2005 | Kawaguchi et al. |
| 2005/0199893 A1 | 9/2005 | Lan et al. |
| 2005/0224826 A1 | 10/2005 | Keuper et al. |
| 2005/0229855 A1 | 10/2005 | Raaijmakers |
| 2005/0285128 A1 | 12/2005 | Scherer et al. |
| 2006/0030738 A1 | 2/2006 | Vanmaele et al. |
| 2006/0037529 A1 | 2/2006 | D'Evelyn |
| 2006/0038193 A1 | 2/2006 | Wu et al. |
| 2006/0060131 A1 | 3/2006 | Atanackovic |
| 2006/0066319 A1 | 3/2006 | Dallenbach et al. |
| 2006/0078022 A1 | 4/2006 | Kozaki et al. |
| 2006/0079082 A1 | 4/2006 | Bruhns et al. |
| 2006/0086319 A1 | 4/2006 | Kasai et al. |
| 2006/0110926 A1 | 5/2006 | Hu et al. |
| 2006/0118799 A1 | 6/2006 | D'Evelyn et al. |
| 2006/0126688 A1 | 6/2006 | Kneissl |
| 2006/0144334 A1 | 7/2006 | Yim et al. |
| 2006/0175624 A1 | 8/2006 | Sharma et al. |
| 2006/0189098 A1 | 8/2006 | Edmond |
| 2006/0193359 A1 | 8/2006 | Kuramoto |
| 2006/0205199 A1 | 9/2006 | Baker et al. |
| 2006/0216416 A1 | 9/2006 | Sumakeris et al. |
| 2006/0256482 A1 | 11/2006 | Araki et al. |

(56) References Cited

U.S. PATENT DOCUMENTS

| | | |
|---|---|---|
| 2006/0288928 A1 | 12/2006 | Eom et al. |
| 2007/0081857 A1 | 4/2007 | Yoon |
| 2007/0086916 A1 | 4/2007 | LeBoeuf et al. |
| 2007/0093073 A1 | 4/2007 | Farrell et al. |
| 2007/0109463 A1 | 5/2007 | Hutchins |
| 2007/0110112 A1 | 5/2007 | Sugiura |
| 2007/0120141 A1 | 5/2007 | Moustakas et al. |
| 2007/0163490 A1 | 7/2007 | Habel et al. |
| 2007/0166853 A1 | 7/2007 | Guenthe et al. |
| 2007/0217462 A1 | 9/2007 | Yamasaki |
| 2007/0242716 A1 | 10/2007 | Samal et al. |
| 2007/0252164 A1 | 11/2007 | Zhong et al. |
| 2007/0280320 A1 | 12/2007 | Feezell et al. |
| 2008/0087919 A1 | 4/2008 | Tysoe et al. |
| 2008/0092812 A1 | 4/2008 | McDiarmid et al. |
| 2008/0095492 A1 | 4/2008 | Son et al. |
| 2008/0121916 A1 | 5/2008 | Teng et al. |
| 2008/0124817 A1 | 5/2008 | Bour et al. |
| 2008/0138919 A1 | 6/2008 | Mueller et al. |
| 2008/0149949 A1 | 6/2008 | Nakamura et al. |
| 2008/0149959 A1 | 6/2008 | Nakamura et al. |
| 2008/0164578 A1 | 7/2008 | Tanikella et al. |
| 2008/0173735 A1 | 7/2008 | Mitrovic et al. |
| 2008/0191192 A1 | 8/2008 | Feezell et al. |
| 2008/0191223 A1 | 8/2008 | Nakamura et al. |
| 2008/0198881 A1 | 8/2008 | Farrell et al. |
| 2008/0210958 A1 | 9/2008 | Senda et al. |
| 2008/0217745 A1 | 9/2008 | Miyanaga et al. |
| 2008/0219309 A1 | 9/2008 | Hata et al. |
| 2008/0232416 A1 | 9/2008 | Okamoto et al. |
| 2008/0267238 A1 | 10/2008 | Takeuchi |
| 2008/0285609 A1 | 11/2008 | Ohta et al. |
| 2008/0291961 A1 | 11/2008 | Kamikawa et al. |
| 2008/0303033 A1 | 12/2008 | Brandes |
| 2008/0308815 A1 | 12/2008 | Kasai et al. |
| 2008/0315179 A1 | 12/2008 | Kim et al. |
| 2009/0058532 A1 | 3/2009 | Kikkawa et al. |
| 2009/0078944 A1 | 3/2009 | Kubota et al. |
| 2009/0080857 A1 | 3/2009 | St. John-Larkin |
| 2009/0081857 A1 | 3/2009 | Hanser et al. |
| 2009/0081867 A1 | 3/2009 | Taguchi et al. |
| 2009/0141765 A1 | 6/2009 | Kohda et al. |
| 2009/0159869 A1 | 6/2009 | Ponce et al. |
| 2009/0173957 A1 | 7/2009 | Brunner et al. |
| 2009/0229519 A1 | 9/2009 | Saitoh |
| 2009/0250686 A1 | 10/2009 | Sato et al. |
| 2009/0267100 A1 | 10/2009 | Miyake et al. |
| 2009/0273005 A1 | 11/2009 | Lin |
| 2009/0291518 A1 | 11/2009 | Kim et al. |
| 2009/0298265 A1 | 12/2009 | Fujiwara |
| 2009/0301387 A1 | 12/2009 | D'Evelyn |
| 2009/0301388 A1 | 12/2009 | D'Evelyn |
| 2009/0309110 A1 | 12/2009 | Raring et al. |
| 2009/0309127 A1 | 12/2009 | Raring et al. |
| 2009/0320744 A1 | 12/2009 | D'Evelyn |
| 2009/0321778 A1 | 12/2009 | Chen et al. |
| 2010/0001300 A1 | 1/2010 | Raring et al. |
| 2010/0003492 A1 | 1/2010 | D'Evelyn |
| 2010/0006873 A1 | 1/2010 | Raring et al. |
| 2010/0008391 A1 | 1/2010 | Nakagawa et al. |
| 2010/0025656 A1 | 2/2010 | Raring et al. |
| 2010/0031875 A1 | 2/2010 | D'Evelyn |
| 2010/0044718 A1 | 2/2010 | Hanser et al. |
| 2010/0059790 A1 | 3/2010 | Takeuchi |
| 2010/0096615 A1 | 4/2010 | Okamoto et al. |
| 2010/0104495 A1 | 4/2010 | Kawabata et al. |
| 2010/0140745 A1 | 6/2010 | Khan et al. |
| 2010/0151194 A1 | 6/2010 | D'Evelyn |
| 2010/0195687 A1 | 8/2010 | Okamoto et al. |
| 2010/0220262 A1 | 9/2010 | DeMille et al. |
| 2010/0295054 A1 | 11/2010 | Okamoto et al. |
| 2010/0302464 A1 | 12/2010 | Raring et al. |
| 2010/0309943 A1 | 12/2010 | Chakraborty et al. |
| 2010/0316075 A1 | 12/2010 | Raring et al. |
| 2010/0327291 A1 | 12/2010 | Preble et al. |
| 2010/0329297 A1 | 12/2010 | Rumpler et al. |
| 2011/0044022 A1 | 2/2011 | Ko et al. |
| 2011/0056429 A1 | 3/2011 | Raring et al. |
| 2011/0057167 A1 | 3/2011 | Ueno et al. |
| 2011/0064100 A1 | 3/2011 | Raring et al. |
| 2011/0064101 A1 | 3/2011 | Raring et al. |
| 2011/0064102 A1 | 3/2011 | Raring et al. |
| 2011/0075694 A1 | 3/2011 | Yoshizumi et al. |
| 2011/0103418 A1 | 5/2011 | Hardy et al. |
| 2011/0133489 A1 | 6/2011 | Hemeury et al. |
| 2011/0164637 A1 | 7/2011 | Yoshizumi et al. |
| 2011/0164646 A1 | 7/2011 | Maeda et al. |
| 2011/0180781 A1 | 7/2011 | Raring et al. |
| 2011/0186874 A1 | 8/2011 | Shum |
| 2011/0186887 A1 | 8/2011 | Trottier et al. |
| 2011/0204376 A1 | 8/2011 | Su et al. |
| 2011/0216795 A1 | 9/2011 | Hsu et al. |
| 2011/0233587 A1 | 9/2011 | Unno |
| 2011/0247556 A1 | 10/2011 | Raring et al. |
| 2012/0178198 A1 | 7/2012 | Raring et al. |
| 2012/0187412 A1 | 7/2012 | D'evelyn et al. |
| 2012/0314398 A1 | 12/2012 | Raring et al. |
| 2013/0214284 A1 | 8/2013 | Holder et al. |
| 2013/0234111 A1 | 9/2013 | Pfister et al. |
| 2013/0313516 A1 | 11/2013 | David et al. |
| 2014/0023102 A1 | 1/2014 | Holder et al. |
| 2015/0111325 A1 | 4/2015 | Hsu et al. |
| 2015/0140710 A1 | 5/2015 | McLaurin et al. |
| 2015/0229100 A1 | 8/2015 | Sztein et al. |
| 2015/0229107 A1 | 8/2015 | McLaurin et al. |
| 2015/0229108 A1 | 8/2015 | Steigerwald et al. |
| 2016/0294162 A1 | 10/2016 | Mclaurin et al. |
| 2016/0359294 A1 | 12/2016 | Sztein et al. |
| 2017/0063045 A1 | 3/2017 | McLaurin et al. |
| 2017/0063047 A1 | 3/2017 | Steigerwald et al. |

FOREIGN PATENT DOCUMENTS

| | | |
|---|---|---|
| CN | 204732408 | 10/2015 |
| CN | 204732675 | 10/2015 |
| CN | 204760748 | 11/2015 |
| CN | 204793617 | 11/2015 |
| CN | 205508818 | 8/2016 |
| CN | 205509229 | 8/2016 |
| CN | 106165218 | 11/2016 |
| DE | 102014223196 | 8/2015 |
| EP | 3105829 | 12/2016 |
| JP | 2007-173467 A1 | 7/2007 |
| JP | 2007-068398 | 4/2008 |
| KR | 1020160121558 | 10/2016 |
| WO | 2008-041521 A1 | 4/2008 |
| WO | 2015120118 | 8/2015 |

OTHER PUBLICATIONS

U.S. Appl. No. 14/175,622, Notice of Allowance dated Aug. 10, 2015, 9 pages.
U.S. Appl. No. 14/175,622, Restriction Requirement dated Feb. 10, 2015, 8 pages.
U.S. Appl. No. 14/176,403, Corrected Notice of Allowability dated Mar. 28, 2016, 2 pages.
U.S. Appl. No. 14/312,427, Corrected Notice of Allowability dated Mar. 31, 2016, 2 pages.
U.S. Appl. No. 14/312,427, Restriction Requirement dated May 18, 2015, 7 pages.
U.S. Appl. No. 14/480,398, Restriction Requirement dated Oct. 22, 2015, 5 pages.
U.S. Appl. No. 14/559,149, Corrected Notice of Allowability dated Mar. 21, 2016, 2 pages.
U.S. Appl. No. 14/559,149, Restriction Requirement dated Oct. 29, 2015, 6 pages.
U.S. Appl. No. 14/600,506, Restriction Requirement dated Nov. 25, 2015, 6 pages.
U.S. Appl. No. 14/931,743, Notice of Allowance dated Mar. 31, 2016, 10 pages.
U.S. Appl. No. 15/173,441, Non-Final Office Action dated Dec. 29, 2016, 6 pages.

(56) References Cited

OTHER PUBLICATIONS

U.S. Appl. No. 15/176,076, Restriction Requirement dated Dec. 30, 2016, 4 pages.
U.S. Appl. No. 15/177,710, Non-Final Office Action dated Dec. 30, 2016.
U.S. Appl. No. 15/177,710, First Action Interview Pilot Program Pre-Interview Communication dated Jan. 12, 2017, 29 pages.
U.S. Appl. No. 15/209,309, Notice of Allowance dated Dec. 19, 2016, 12 pages.
U.S. Appl. No. 14/580,693, Notice of Allowance dated Jan. 17, 2017, 11 pages.
U.S. Appl. No. 15/559,149, filed Jun. 9, 2016.
Chinese Application No. 201520095427.4, Office Action dated Apr. 29, 2015, 2 pages.
Chinese Application No. 201520095428.9, Office Action dated Apr. 29, 2015, 2 pages.
Chinese Application No. 201520096855.9, Office Action dated Apr. 27, 2015, 2 pages.
Chinese Application No. 201520096866.7, Office Action dated Apr. 29, 2015, 1 page.
Chinese Application No. 201520758768.5, Office Action dated Mar. 23, 2016, 2 pages.
Chinese Application No. 201520826757.6, Office Action dated Mar. 3, 2016, 3 pages (1 page For the original document and 2 pages for the English translation).
International Application No. PCT/US2015/014567, International Preliminary Report on Patentability dated Aug. 25, 2016, 14 pages.
Wierer et al., High-power AlGaInN flip-chip light-emitting diodes, Applied Physics Letters, vol. 78, No. 22, 2001, pp. 3379-3381.
Yamaguchi, Anisotropic optical matrix elements in strained GaN-quantum wells with various substrate orientations, Physica Status Solidi (PSS), vol. 5, No. 6, May 2008, pp. 2329-2332.
Yang, Micromachining of Gan Using Photoelectrochemical Etching, Graduate Program in Electronic Engineering, Notre Dame, Indiana, 2005, 168 pages.
Yoshizumi et al., Continuous-Wave Operation of 520 nm Green InGaN-Based Laser Diodes on Semi-Polar {2021} GaN Substrates, Applied Physics Express, vol. 2, No. 9, Aug. 2009, pp. 1-3.
Yu et al., Multiple Wavelength Emission from Semipolar InGaN/GaN Quantum Wells Selectively Grown by MOCVD, Conference on Lasers and Electro-Optics/Quantum Electronics and Laser Science Conference and Photonic Applications Systems Technologies, OSA Technical Digest (CD), 2007, pp. 1-2.
Zhong et al., Demonstration of High Power Blue-Green Light Emitting Diode on Semipolar (1122) bulk GaN substrate, Electronics Letters, vol. 43, No. 15, Jul. 2007, pp. 825-826.
Zhong et al., High power and high efficiency blue light emitting diode on freestanding semipolar (1011) bulk GaN substrate, Applied Physics Letter, vol. 90, No. 23, 2007, pp. 233504-1-233504-3.
U.S. Appl. No. 14/968,710, Notice of Allowance dated Mar. 3, 2017, 17 pages.
U.S. Appl. No. 15/173,441, Notice of Allowance dated Apr. 13, 2017, 15 pages.
U.S. Appl. No. 15/356,302, Non-Final Office Action dated May 5, 2017, 8 pages.
U.S. Appl. No. 15/176,076, Non-Final Office Action dated Jun. 6, 2017, 14 pages.
U.S. Appl. No. 15/177,710, Notice of Allowance dated May 2, 2017, 10 pages.
Abare "Cleaved and Etched Facet Nitride Laser Diodes," IEEE Journal of Selected Topics in Quantum Electronics, vol. 4, No. 3, pp. 505-509 (May 1998).
Aoki et al., "InGaAs/InGaAsP MQW Electroabsorption Modulator Integrated with a DFB Laser Fabricated by Band-Gap Energy Control Selective Area MOCVD, 1993," IEEE J Quantum Electronics, vol. 29, pp. 2088-2096.
Asano et al., "100-mW kink-Free Blue-Violet Laser Diodes with Low Aspect Ratio," 2003, IEEE Journal of Quantum Electronics, vol. 39, No. 1, pp. 135-140.
Asif Khan "Cleaved cavity optically pumped InGaN—GaN laser grown on spinel substrates," Appl. Phys. Lett. 69 (16), pp. 2418-2420 (Oct. 14, 1996).
Bernardini et al., "Spontaneous Polarization and Piezoelectric Constants of III-V Nitrides," 1997, Physical Review B, vol. 56, No. 16, pp. 10024-10027.
Caneau et al., "Studies on Selective OMVPE of (Ga,In)/(As,P)," 1992, Journal of Crystal Growth, vol. 124, pp. 243-248.
Chen et al., "Growth and Optical Properties of Highly Uniform and Periodic InGaN Nanostructures," 2007, Advanced Materials, vol. 19, pp. 1707-1710.
D'Evelyn et al., "Bulk GaN Crystal Growth by the High-Pressure Ammonothermal Method," Journal of Crystal Growth, 2007, vol. 300, pp. 11-16.
Founta et al., 'Anisotropic Morphology of Nonpolar a-Plane GaN Quantum Dots and Quantum Wells,' Journal of Applied Physics, vol. 102, vol. 7, 2007, pp. 074304-1-074304-6.
Fujii et al., "Increase in the Extraction Efficiency of GaN-based Light-Emitting Diodes Via Surface Roughening," 2004, Applied Physics Letters, vol. 84, No. 6, pp. 855-857.
Funato et al., "Blue, Green, and Amber InGaN/GaN Light-Emitting Diodes on Semipolar (1122) GaN Substrates," 2006, Journal of Japanese Applied Physics, vol. 45, No. 26, pp. L659-L662.
Funato et al., "Monolithic Polychromatic Light-Emitting Diodes Based on InGaN Microfacet Quantum Wells toward Tailor-Made Solid-State Lighting," 2008, Applied Physics Express, vol. 1, pp. 011106-1-011106-3.
Gallium nitride, retrieved from http://en.wikipedia.org/wiki/Gallium_nitride on Dec. 31, 2014, 6 pages.
Gardner et al. "Blue-emitting InGaN—GaN double-heterostructure light-emitting diodes reaching maximum quantum efficiency above 200 A/ cm2", Applied Physics Letters 91, 243506 (2007).
Amano et al., "p-type conduction in Mg-doped GaN treated with low-energy electron beam irradiation (LEEBI)," Jpn. J. Appl. Phys. vol. 28, pp. L2112-L2114, 1989.
hap ://techon.nikkeibp. co jp/english/NEWS_EN/20080122/146009.
Hiramatsu et al., Selective Area Growth and Epitaxial Lateral Overgrowth of GaN by Metalorganic Vapor Phase Epitaxy and Hydride Vapor Phase Epitaxy. Materials Science and Engineering B, vol. 59, May 6, 1999. pp. 104-111.
Hjort, K., "Sacrificial etching of III-V compounds for micromechanical devices," J. Micromech. Microeng., 6 (1996), pp. 370-375.
Holder et al., "Demonstration of Nonpolar GaN-Based Vertical-Cavity Surface-Emitting Lasers," Appl. Phys. Express 5, 092104 (2012).
International Search Report & Written Opinion of PCT Application No. PCT/US2010/049172, dated Nov. 17, 2010, 7 pages.
International Search Report & Written Opinion ofPCT Application No. PCT/US2010/030939, dated Jun. 16, 2010, 9 pages.
International Search Report and Written Opinion of the International Searching Authority for PCT/US15/14567 dated Jul. 8, 2015, 23 pages.
International Search Report of PCT Application No. PCT/US2009/046786, dated May 13, 2010, 2 pages.
International Search Report of PCT Application No. PCT/US2009/047107, dated Sep. 29, 2009, 4 pages.
International Search Report of PCT Application No. PCT/US2009/52611, dated Sep. 29, 2009, 3 pages.
International Search Report of PCT Application No. PCT/US2011/037792, dated Sep. 8, 2011, 2 pages.
International Searching Authority Communication for PCT Application No. PCT/US15/14567 dated May 1, 2015, 2 pages.
Iso et al., "High Brightness Blue InGaN/GaN Light Emitting Diode on Nonpolar m-plane Bulk GaN Substrate," 2007, Japanese Journal of Applied Physics, vol. 46, No. 40, pp. L960-L962.
Kendall et al., "Energy Savings Potential of Solid State Lighting in General Lighting Applications," 2001, Report for the Department of Energy, pp. 1-35.
Kim et al, "Improved Electroluminescence on Nonpolar m-plane InGaN/GaN Qantum Well LEDs", 2007, Physica Status Solidi (RRL), vol. 1, No. 3, pp. 125-127.

(56) References Cited

OTHER PUBLICATIONS

Kuramoto et al., "Novel Ridge-Type InGaN Multiple-Quantum-Well Laser Diodes Fabricated by Selective Area Re-Growth on n-GaN Substrates," 2007, Journal of Japanese Applied Physics, vol. 40, pp. 925-927.
Lidow et al., Gallium Nitride (GaN) Technology Overview, EPC White Paper, (2012) 6 pages.
Light-emitting diode, retried from http://en.wikipedia.org/wiki/Light-emitting_diode on Dec. 31, 2014, 44 pages.
Lin et al. "Influence of Separate Confinement Heterostructure Layer on Carrier Distribution in InGaAsP Laser Diodes with Nonidentical Multiple Quantum Wells," Japanese Journal of Applied Physics, vol. 43, No. 10, pp. 7032-7035 (2004).
Masui et al. "Electrical Characteristics of Nonpolar InGaN-Based Light-Emitting Diodes Evaluated at Low Temperature," Jpn. J. Appl. Phys. 46 pp. 7309-7310 (2007).
Michiue et al. "Recent development of nitride LEDs and LDs," Proceedings of SPIE, vol. 7216, 72161Z (2009).
Nakamura et al., "InGaN/Gan/AlGaN-based Laser Diodes with Modulation-doped Strained-layer Superlattices Grown on an Epitaxially Laterally Grown GaN Substrate", 1998, Applied Physics Letters, vol. 72, No. 12, pp. 211-213.
Nam et al., "Later Epitaxial Overgrowth of GaN films on SiO2 Areas Via Metalorganic Vapor Phase Epitaxy," 1998, Journal of Electronic Materials, vol. 27, No. 4, pp. 233-237.
Okamoto et al. in "High-Efficiency Continuous-Wave Operation of Blue-Green Laser Diodes Based on Nonpolar m-Plane Gallium Nitride," The Japan Society of Applied Physics, Applied Physics Express 1 (Jun. 2008).
Okamoto et al., "Pure Blue Laser Diodes Based on Nonpolar m-Plane Gallium Nitride with InGaN Waveguiding Layers," 2007, Journal of Japanese Applied Physics, vol. 46, No. 35, pp. 820-822.
Okamoto et. al "Continuous-Wave Operation of m-Plane InGaN Multiple Quantum Well Laser Diodes" The Japan Society of I Applied Physics JJAP Express LEtter, vol. 46, No. 9, 2007 pp. L 187-L 189.
Park, "Crystal orientation effects on electronic properties of wurtzite InGaN/GaN quantum wells,",Journal of Applied Physics vol. 91, No. 12, pp. 9904-9908 (Jun. 2002).
Power electronics, retrieved from http://en.wikipedia.org/wiki/Power_electronics on Dec. 31, 2014, 24 pages.
Purvis, "Changing the Crystal Face of Gallium Nitride." The Advance Semiconductor Magazine, vol. 18, No. 8, Nov. 2005.
Romanov "Strain-induced polarization in wurtzite III-nitride semipolar layers," Journal of Applied Physics 100, pp. 023522-1 through 023522-10 (Jul. 25, 2006).
Nakamura et al., "p-GaN/n-InGaN/n-GaN double-heterostructure blue-light-emitting diodes," Jpn. J. Appl. Phys., vol. 32, pp. L8-L11, 1993.
Nakamura et al., "Candela-class high-brightness InGaN/AlgaN double-heterostructure blue-light-emitting diodes," Appl. Phys. Lett., vol. 64, pp. 1687-1689, 1994.
Sato et al., "High Power and High Efficiency Green Light Emitting Diode on free-Standing Semipolar (1122) Bulk GaN Substrate," 2007.Physica Status Solidi (RRL), vol. 1, pp. 162-164.
Sato et al., "Optical Properties of Yellow Light-Emitting-Diodes Grown on Semipolar (1122) Bulk GaN Substrate," 2008, Applied Physics Letter, vol. 92, No. 22, pp. 221110-1-221110-3.
Schmidt et al., "Demonstration of Nonpolar m-plane InGaN/GaN Laser Diodes," 2007, Journal of Japanese Applied Physics, vol. 46, No. 9, pp. 190-191.
Schmidt et al., "High Power and High External Efficiency m-plane InGaN Light Emitting Diodes," 2007, Japanese Journal of Applied Physics, vol. 46, No. 7, pp. L126-L128.
Schoedl "Facet degradation of GaN heterostructure laser diodes," Journal of Applied Physics vol. 97, issue 12, pp. 123102-1 to 123102-8 (2005).
Shchekin et al., "High Performance Thin-film Flip-Chip InGaN—GaN Light-emitting Diodes," 2006, Applied Physics Letters, vol. 89, pp. 071109-071109-3.
Shen et al. "Auger recombination in InGaN measured by photoluminescence," Applied Physics Letters, 91, 141101 (2007).
Sink, R., "Cleaved-Facet Group-III Nitride Lasers." University of California, Santa Barbara, Ph.D. Dissertation, Dec. 2000, 251 pages.
Sizov et al., "500-nm Optical Gain Anisotropy of Semipolar (1122) InGaN Quantum Wells," 2009, Applied Physics Express, vol. 2, pp. 071001-1-071001-3.
Tamboli, A. Photoelectrochemical etching of gallium nitride for high quality optical devices. (2009), 207 pages.
Tomiya et. al. Dislocation related issues in the degradation of GaN-based laser diodes, IEEE Journal of Selected Topics in Quantum Electronics vol. 10, No. 6 (2004).
Transistor, retrieved from http://en.wikipedia.org/wiki/Transistor on Dec. 31, 2014, 25 pages.
Tyagi et al., "High Brightness Violet InGaN/GaN Light Emitting Diodes on Semipolar (1011) Bulk GaN Substrates," 2007, Japanese Journal of Applied Physics, vol. 46, No. 7, pp. L129-L131.
U.S. Appl. No. 14/968,710, filed Dec. 14, 2015, Raring et al., unpublished.
U.S. Appl. No. 15/177,710, filed Jun. 9, 2016, unpublished.
U.S. Appl. No. 14/580,693, filed Dec. 23, 2014, unpublished.
U.S. Appl. No. 15/173,441, filed Jun. 3, 2016, unpublished.
U.S. Appl. No. 15/176,076, filed Jun. 7, 2016, unpublished.
U.S. Appl. No. 15/209,309, filed Jul. 13, 2016, unpublished.
U.S. Appl. No. 12/573,820, filed Oct. 5, 2009, Raring et al., Unpublished.
U.S. Appl. No. 12/727,148, filed Mar. 18, 2010, Raring, Unpublished.
U.S. Appl. No. 12/880,889, filed Sep. 13, 2010, Raring et al., Unpublished.
U.S. Appl. No. 61/164,409, filed Mar. 28, 2009, Raring et al., Unpublished.
U.S. Appl. No. 61/182,105, filed May 29, 2009, Raring, Unpublished.
U.S. Appl. No. 61/249,568, filed Oct. 7, 2009, Raring et al. Unpublished.
Uchida et al., "Recent Progress in High-Power Blue-violet Lasers," 2003, IEEE Journal of Selected Topics in Quantum Electronics, vol. 9, No. 5, pp. 1252-1259.
USPTO Notice of Allowance for U.S. Appl. No. 12/762,278 dated Nov. 7, 2011.
USPTO Notice of Allowance for U.S. Appl. No. 12/497,289 dated May 22, 2012.
USPTO Notice of Allowance for U.S. Appl. No. 12/502,058 dated Apr. 16, 2012.
USPTO Notice of Allowance for U.S. Appl. No. 12/534,829 dated Dec. 5, 2011.
USPTO Notice of Allowance for U.S. Appl. No. 12/534,829 dated Dec. 21, 2011.
USPTO Notice of Allowance for U.S. Appl. No. 12/534,829 dated Oct. 28, 2011.
USPTO Notice of Allowance for U.S. Appl. No. 12/749,476 dated May 4, 2012.
USPTO Notice of Allowance for U.S. Appl. No. 12/762,269 dated Apr. 23, 2012.
USPTO Notice of Allowance for U.S. Appl. No. 12/778,718 dated Apr. 3, 2012.
USPTO Notice of Allowance for U.S. Appl. No. 12/778,718 dated Jun. 13, 2012.
USPTO Notice of Allowance for U.S. Appl. No. 12/883,093 dated Nov. 21, 2012.
USPTO Notice of Allowance for U.S. Appl. No. 12/884,993 dated Nov. 26, 2012.
USPTO Office action for U.S. Appl. No. 12/484,924 dated Oct. 31, 2011.
USPTO Office action for U.S. Appl. No. 12/497,289 dated Feb. 2, 2012.
USPTO Office action for U.S. Appl. No. 12/749,466 dated Feb. 3, 2012.
USPTO Office action for U.S. Appl. No. 12/759,273 dated Nov. 21, 2011.

(56) References Cited

OTHER PUBLICATIONS

USPTO Office action for U.S. Appl. No. 12/762,269 (dated Oct. 12, 2011).
USPTO Office action for U.S. Appl. No. 12/762,271 dated Dec. 23, 2011.
USPTO Office action for U.S. Appl. No. 12/778,718 dated Nov. 25, 2011.
USPTO Office action for U.S. Appl. No. 12/873,820 dated Oct. 11, 2012.
USPTO Office action for U.S. Appl. No. 13/046,565 dated Feb. 2, 2012.
USPTO Office action for U.S. Appl. No. 13/046,565 dated Nov. 7, 2011.
USPTO Office Action for U.S. Appl. No. 12/481,543 dated Jun. 27, 2011.
USPTO Office Action for U.S. Appl. No. 12/482,440 dated Aug. 12, 2011.
USPTO Office Action for U.S. Appl. No. 12/482,440 dated Feb. 23, 2011.
USPTO Office Action for U.S. Appl. No. 12/484,924 dated Apr. 14,2011.
USPTO Office Action for U.S. Appl. No. 12/491,169 dated May 11, 2011.
USPTO Office Action for U.S. Appl. No. 12/491,169 dated Oct. 22, 2010.
USPTO Office Action for U.S. Appl. No. 12/502,058 dated Aug. 19, 2011.
USPTO Office Action for U.S. Appl. No. 12/502,058 dated Dec. 8, 2010.
USPTO Office Action for U.S. Appl. No. 12/534,829 dated Apr. 19, 2011.
USPTO Office Action for U.S. Appl. No. 12/573,820 dated Mar. 2, 2011.
USPTO Office Action for U.S. Appl. No. 12/573,820 dated Oct. 11, 2011.
USPTO Office Action for U.S. Appl. No. 12/749,466 dated Jun. 29, 2011.
USPTO Office Action for U.S. Appl. No. 12/749,476 dated Apr. 11, 2011.
USPTO Office Action for U.S. Appl. No. 12/749,476 dated Nov. 8, 2011.
USPTO Office Action for U.S. Appl. No. 12/762,271 dated Jun. 6, 2012.
USPTO Office Action for U.S. Appl. No. 12/868,441 dated Apr. 30, 2012.
USPTO Office Action for U.S. Appl. No. 12/880,803 dated Feb. 22, 2012.
USPTO Office Action for U.S. Appl. No. 12/883,093 dated Aug. 3, 2012.
USPTO Office Action for U.S. Appl. No. 12/883,093 dated Mar. 13, 2012.
USPTO Office Action for U.S. Appl. No. 12/883,652 dated Apr. 17, 2012.
USPTO Office Action for U.S. Appl. No. 12/884,993 dated Aug. 2, 16, 2012.
USPTO Office Action for U.S. Appl. No. 12/884,993 dated Mar. 16, 2012.
USPTO Office Action for U.S. Appl. No. 13/014,622 dated Apr. 30, 2012.
USPTO Office Action for U.S. Appl. No. 13/014,622 dated Nov. 28, 2011.
USPTO Office Action for U.S. Appl. No. 13/046,565 dated Apr. 13, 2012.
Waltereit et al., "Nitride Semiconductors Free of Electrostatic Fields for Efficient White Light-emitting Diodes," 2000, Nature: International Weekly Journal of Science, vol. 406, pp. 865-868.
Non-Final Office Action dated Sep. 11, 2015 for U.S. Appl. No. 14/176,403, 27 pages.
Non-Final Office Action dated Aug. 21, 2015 for U.S. Appl. No. 14/312,427, 28 pages.
Non-Final Office Action of Jun. 3, 2015 for U.S. Appl. No. 14/534,636, 24 pages.
Notice of Allowance dated Sep. 15, 2015 for U.S. Appl. No. 14/534,636, 11 pages.
Final Office Action dated Dec. 16, 2015 for U.S. Appl. No. 14/312,427, 18 pages.
Notice of Allowance dated Feb. 17, 2016 for U.S. Appl. No. 14/559,149, 35 pages.
Notice of Allowance dated Feb. 12, 2016 for U.S. Appl. No. 14/176,403, 14 pages.
Notice of Allowance dated Mar. 4, 2016 for U.S. Appl. No. 14/312,427, 15 pages.
Non-Final Office Action dated Mar. 8, 2016 for U.S. Appl. No. 14/600,506, 36 pages.
U.S. Appl. No. 14/480,398, Non-Final Office Action dated Mar. 17, 2016, 16 pages.
U.S. Appl. No. 14/580,693, Non-Final Office Action dated Jun. 16, 2016, 22 pages.
U.S. Appl. No. 14/480,398, Notice of Allowance dated Aug. 12, 2016, 14 pages.
U.S. Appl. No. 14/600,506, Notice of Allowance dated Aug. 9, 2016, 14 pages.
U.S. Appl. No. 15/480,239 Non-Final Office Action dated Jul. 3, 2017, 13 pages.
U.S. Appl. No. 15/351,326 Non-Final Office Action dated Jul. 14, 2017, 15 pages.
U.S. Appl. No. 15/356,302 Notice of Allowance dated Sep. 19, 2017, 8 pages.
Extended European Search Report dated Jul. 11, 2017, 11 pages.
U.S. Appl. No. 15/480,239 Final Office Action dated Oct. 24, 2017, 15 pages.

Die Expanded Laser Diode

Schematic diagram of ridge type laser diode fabricated on a semipolar substrate showing cavity architecture and mirrors.

Schematic cross-section of ridge laser diode

Schematic cross-section diagram of ridge type laser diode showing various features associated with the device.

Top-side bond pad

Top-side bond pad

Number of devices per wafer for various die dimensions

| | Wafer Size | 25.4 mm diameter | 32 mm diameter | 2x2 cm$^2$ |
|---|---|---|---|---|
| | Area [mm$^2$] | 506.61189 | 804.096 | 400 |
| LD length [mm] | die pitch [mm] | # of devices | # of devices | # of devices |
| 1 | 0.3 | 1689 | 2680 | 1333 |
| 1 | 0.2 | 2533 | 4020 | 2000 |
| 1 | 0.15 | 3377 | 5361 | 2667 |
| 1 | 0.1 | 5066 | 8041 | 4000 |
| 1 | 0.05 | 10132 | 16082 | 8000 |

FIG. 16

Number of devices per carrier for various die dimensions

| die pitch on susbtrate [mm] | LD length [mm] | Wafer Size | 25.4 mm diameter | 32 mm diameter | 2x2 cm² |
|---|---|---|---|---|---|
| | | Area [cm²] | 5.0661189 | 8.04096 | 4 |
| | | # of tranfers per 100 mm carrier | 9 | 7 | 12 |
| | | die pitch [mm] | # of devices | # of devices | # of devices |
| 0.05 | 1 | 0.3 | 15198 | 18762 | 16000 |
| 0.05 | 1 | 0.2 | 22798 | 28143 | 24000 |
| 0.05 | 1 | 0.15 | 30397 | 37524 | 32000 |
| 0.05 | 1 | 0.1 | 45595 | 56287 | 48000 |

FIG. 18

Typical laser die compared to laser device on integrated submount fabricated via wafer-level processing after transfer of laser die Example of RGB laser chip Example of transfer of die from multiple substrates Example of layout of multi die chip with one common electrode Example of layout of multi die chip with carrier wafer
containing metal-filled trough vias Example of layout of multi die chip with common electrode and facets
produced via cleaving carrier wafer

MANUFACTURABLE RGB LASER DIODE SOURCE

CROSS-REFERENCE TO RELATED APPLICATIONS

The present application is a continuation-in-part of U.S. application Ser. No. 14/312,427, filed Jun. 23, 2014, which is a continuation-in-part of U.S. application Ser. No. 14/176,403, filed Feb. 10, 2014, the entire contents of each of which are incorporated herein by reference in their entirety for all purposes.

BACKGROUND

In 1960, the laser was first demonstrated by Theodore H. Maiman at Hughes Research Laboratories in Malibu. This laser utilized a solid-state flash lamp-pumped synthetic ruby crystal to produce red laser light at 694 nm. By 1964, blue and green laser output was demonstrated by William Bridges at Hughes Aircraft utilizing a gas laser design called an Argon ion laser. The Ar-ion laser utilized a noble gas as the active medium and produced laser light output in the UV, blue, and green wavelengths including 351 nm, 454.6 nm, 457.9 nm, 465.8 nm, 476.5 nm, 488.0 nm, 496.5 nm, 501.7 nm, 514.5 nm, and 528.7 nm. The Ar-ion laser had the benefit of producing highly directional and focusable light with a narrow spectral output, but the wall plug efficiency was <0.1%, and the size, weight, and cost of the lasers were undesirable as well.

As laser technology evolved, more efficient lamp pumped solid state laser designs were developed for the red and infrared wavelengths, but these technologies remained a challenge for blue and green lasers. As a result, lamp pumped solid state lasers were developed in the infrared, and the output wavelength was converted to the visible using specialty crystals with nonlinear optical properties. A green lamp pumped solid state laser had 3 stages: electricity powers lamp, lamp excites gain crystal which lases at 1064 nm, 1064 nm goes into frequency conversion crystal which converts to visible 532 nm. The resulting green and blue lasers were called "lamped pumped solid state lasers with second harmonic generation" (LPSS with SHG) had wall plug efficiency of ~1%, and were more efficient than Ar-ion gas lasers, but were still too inefficient, large, expensive, fragile for broad deployment outside of specialty scientific and medical applications. Additionally, the gain crystal used in the solid state lasers typically had energy storage properties which made the lasers difficult to modulate at high speeds which limited its broader deployment.

To improve the efficiency of these visible lasers, high power diode (or semiconductor) lasers were utilized. These "diode pumped solid state lasers with SHG" (DPSS with SHG) had 3 stages: electricity powers 808 nm diode laser, 808 nm excites gain crystal, which lases at 1064 nm, 1064 nm goes into frequency conversion crystal which converts to visible 532 nm. The DPSS laser technology extended the life and improved the wall plug efficiency of the LPSS lasers to 5-10%, and further commercialization ensued into more high-end specialty industrial, medical, and scientific applications. However, the change to diode pumping increased the system cost and required precise temperature controls, leaving the laser with substantial size and power consumption while not addressing the energy storage properties which made the lasers difficult to modulate at high speeds.

As high power laser diodes evolved and new specialty SHG crystals were developed, it became possible to directly convert the output of the infrared diode laser to produce blue and green laser light output. These "directly doubled diode lasers" or SHG diode lasers had 2 stages: electricity powers 1064 nm semiconductor laser, 1064 nm goes into frequency conversion crystal which converts to visible 532 nm green light. These lasers designs are meant to improve the efficiency, cost and size compared to DPSS-SHG lasers, but the specialty diodes and crystals required make this challenging today. Additionally, while the diode-SHG lasers have the benefit of being directly modulate-able, they suffer from severe sensitivity to temperature which limits their application.

Currently the only viable direct blue and green laser diode structures are fabricated from the wurtzite AlGaInN material system. The manufacturing of light emitting diodes from GaN related materials is dominated by the heteroepitaxial growth of GaN on foreign substrates such as Si, SiC and sapphire. Laser diode devices operate at such high current densities that the crystalline defects associated with heteroepitaxial growth are not acceptable. Because of this, very low defect-density, free-standing GaN substrates have become the substrate of choice for GaN laser diode manufacturing. Unfortunately, such substrates are costly and inefficient.

SUMMARY

Embodiments of the invention provide methods for fabricating semiconductor laser diodes. Typically these devices are fabricated using an epitaxial deposition, followed by processing steps on the epitaxial substrate and overlying epitaxial material. Merely by way of example, the invention can be applied to applications such as white lighting, white spot lighting, flash lights, automobile headlights, all-terrain vehicle lighting, light sources used in recreational sports such as biking, surfing, running, racing, boating, light sources used for drones, planes, robots, other mobile or robotic applications, safety, counter measures in defense applications, multi-colored lighting, lighting for flat panels, medical, metrology, beam projectors and other displays, RGB displays, high intensity lamps, spectroscopy, entertainment, theater, music, and concerts, analysis fraud detection and/or authenticating, tools, water treatment, laser dazzlers, targeting, communications, visible light communications (VLC), LiFi, transformations, transportations, leveling, curing and other chemical treatments, heating, cutting and/or ablating, pumping other optical devices, other optoelectronic devices and related applications, and source lighting and the like. What follows is a general description of the typical configuration and fabrication of these devices.

In an example, the present invention provides a method for manufacturing a gallium and nitrogen containing laser diode device with low cost. The method includes providing a gallium and nitrogen containing substrate having a surface region and forming epitaxial material overlying the surface region, the epitaxial material comprising an n-type cladding region, an active region comprising at least one active layer overlying the n-type cladding region, and a p-type cladding region overlying the active region. The method includes patterning the epitaxial material to form a plurality of dice, each of the dice corresponding to at least one laser device, characterized by a first pitch between a pair of dice, the first pitch being less than a design width. The method includes transferring each of the plurality of dice to a carrier wafer such that each pair of dice is configured with a second pitch between each pair of dice, the second pitch being larger than the first pitch corresponding to the design width. The method includes singulating the carrier wafer into a plurality of laser diode devices on carrier chips. The carrier chips effectively serve as the submount of the laser diode device and can be integrated directly into a wide variety of package types.

In an example, using basic assumptions about processing and material costs, it can be shown that blue-light emitting, GaN-based laser device costs below $0.50 per optical Watt and could be as low as $0.10 per optical Watt by transferring die from 4.5 cm$^2$ GaN substrates to 200 mm SiC carriers. This price is highly competitive with state of the art light emitting diodes and could enable widespread penetration of laser light sources into markets currently served by LEDs such as general lighting.

In an example, the present die configured with carrier, which can serve as a submount, can be packaged into a module without any further liftoff process or the like. The process is efficient and uses conventional process technology. Depending upon the embodiment, these and other benefits may be achieved.

The present invention achieves these benefits and others in the context of known process technology. However, a further understanding of the nature and advantages of the present invention may be realized by reference to the latter portions of the specification and attached drawings.

In other embodiments, superluminescent diodes or superluminescent light emitting diodes (SLEDs) are fabricated according to the present invention. In some applications SLEDs may offer improved spectral properties such as wider spectral output for a shorter coherence length, and/or an improved safety such as eye safety.

BRIEF DESCRIPTION OF THE DRAWINGS

FIG. 16 is a table showing number of laser or SLED devices that can be processed on a substrate at a given die pitch in accordance with an embodiment of this invention.

FIG. 18 is a table showing number of laser or SLED devices that can be processed on 50 micron wide die after epi transfer to a carrier in accordance with an embodiment of this invention.

DETAILED DESCRIPTION

Embodiments of the invention provide methods for fabricating semiconductor laser diodes. Typically these devices are fabricated using an epitaxial deposition, followed by processing steps on the epitaxial substrate and overlying epitaxial material. Merely by way of example, the invention can be applied to applications such as white lighting, white spot lighting, flash lights, automobile headlights, all-terrain vehicle lighting, light sources used in recreational sports such as biking, surfing, running, racing, boating, light sources used for drones, planes, robots, other mobile or robotic applications, safety, counter measures in defense applications, multi-colored lighting, lighting for flat panels, medical, metrology, beam projectors and other displays, RGB displays, high intensity lamps, spectroscopy, entertainment, theater, music, and concerts, analysis fraud detection and/or authenticating, tools, water treatment, laser dazzlers, targeting, communications, LiFi, visible light communications (VLC), transformations, transportations, leveling, curing and other chemical treatments, heating, cutting and/or ablating, pumping other optical devices, other optoelectronic devices and related applications, and source lighting and the like. What follows is a general description of the typical configuration and fabrication of these devices.

Reference can be made to the following description of the drawings, as provided below.

Figure 1:
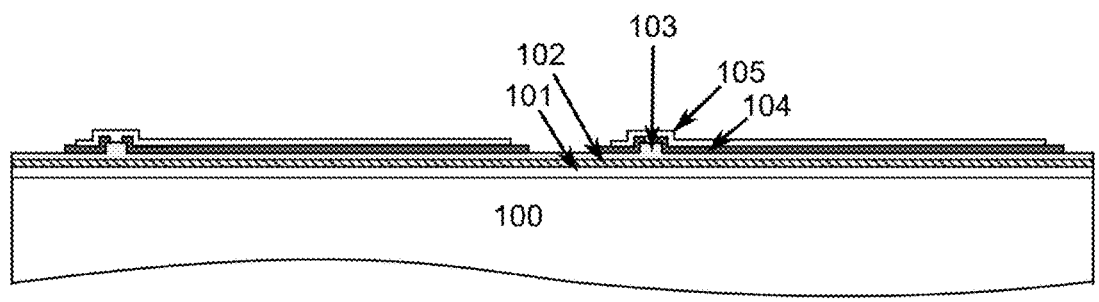
FIG. 1 is a simplified illustration of a laser diode according to an example of the present invention.

FIG. 1 is a side view illustration of a state of the art GaN based laser diode after processing. Laser diodes are fabricated on an original gallium and nitrogen containing epitaxial substrate 100, typically with epitaxial n-GaN and n-side cladding layers 101, active region 102, p-GaN and p-side cladding 103, insulating layers 104 and contact/pad layers 105. Laser die pitch is labeled. All epitaxy material not directly under the laser ridge is wasted in this device design. In an example, n-type cladding may be comprised of GaN, AlGaN, or InAlGaN.

Figure 2A:
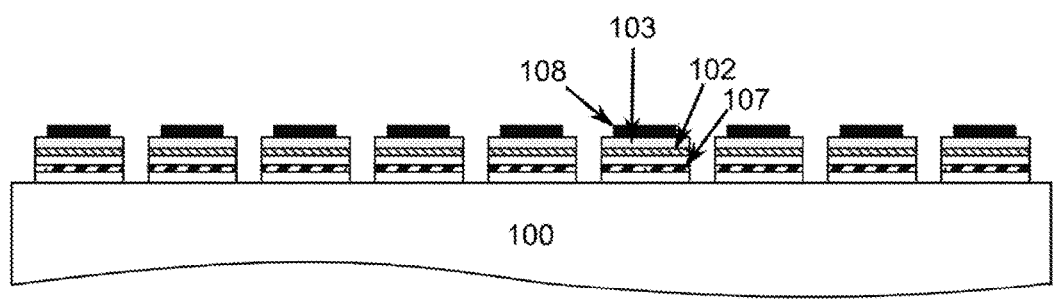
FIGS. 2A-2B are simplified illustrations of a die expanded laser diode according to an example of the present invention.
Figure 2B:
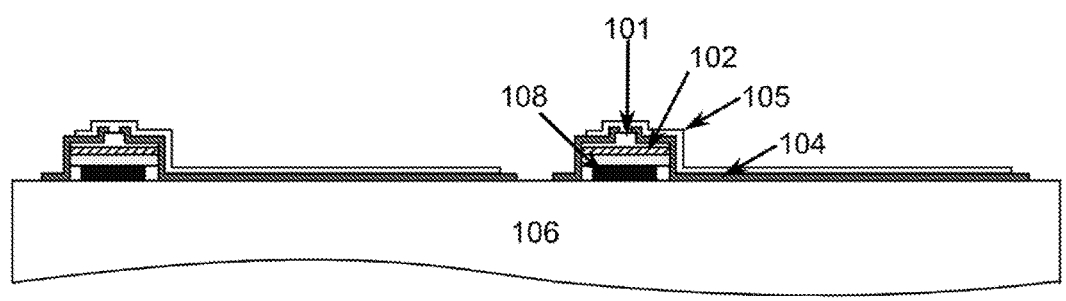

FIG. 2A is a side view illustration of gallium and nitrogen containing epitaxial wafer 100 before the die expansion process and FIG. 2B is a side view illustration of carrier wafer 106 after the die expansion process. These figures demonstrates a roughly five times expansion and thus five times improvement in the number of laser diodes, which can be fabricated from a single gallium and nitrogen containing substrate and overlying epitaxial material. Typical epitaxial and processing layers are included for example purposes and include n-GaN and n-side cladding layers 101, active region 102, p-GaN and p-side cladding 103, insulating layers 104, and contact/pad layers 105. Additionally, a sacrificial region 107 and bonding material 108 are used during the die expansion process.

Figure 3:
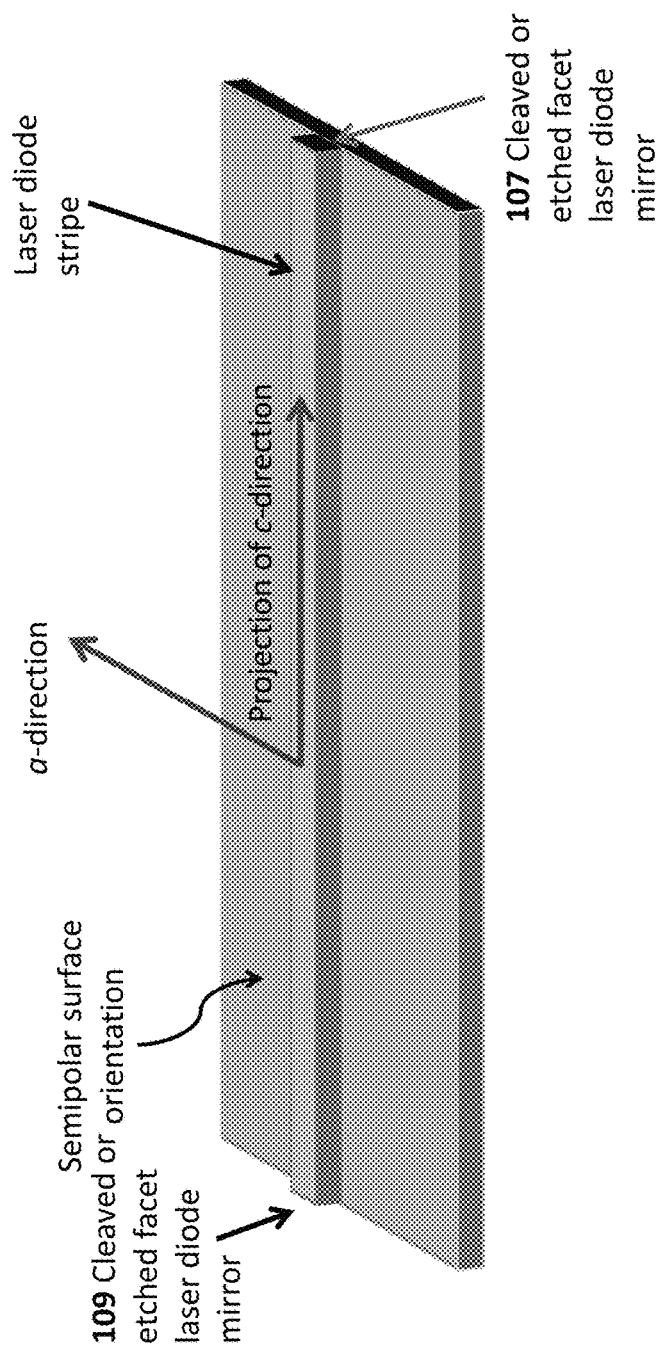
FIG. 3 is a schematic diagram of semipolar laser diode with the cavity aligned in the projection of c-direction with cleaved or etched mirrors in an example.

FIG. 3 is a schematic diagram of semipolar laser diode with the cavity aligned in the projection of c-direction with cleaved or etched mirrors. Shown is a simplified schematic diagram of semipolar laser diode with the cavity aligned in the projection of c-direction with cleaved or etched mirrors. The laser stripe region is characterized by a cavity orientation substantially in a projection of a c-direction, which is substantially normal to an a-direction. The laser strip region has a first end 107 and a second end 109 and is formed on a projection of a c-direction on a {20-21} gallium and nitrogen containing substrate having a pair of cleaved mirror structures, which face each other.

Figure 4:
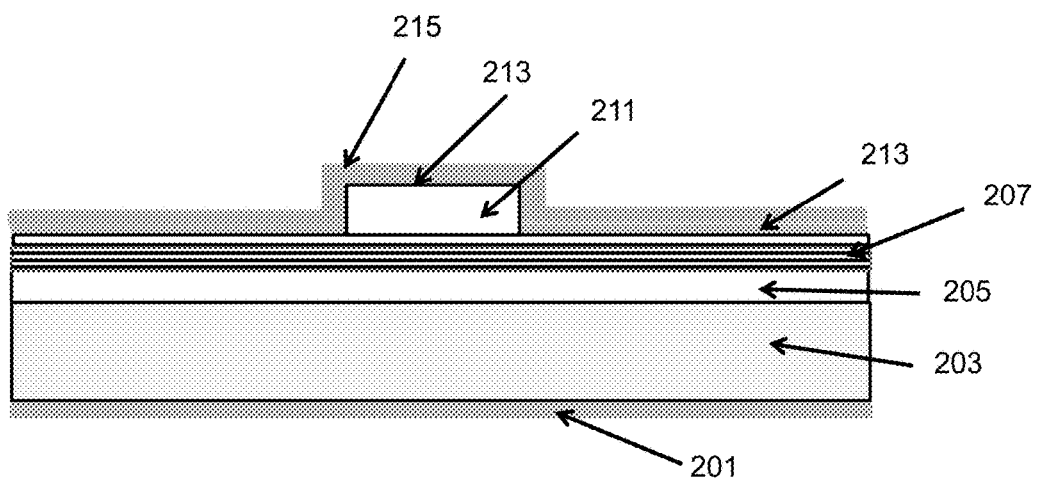
FIG. 4 is a schematic cross-section of ridge laser diode in an example.

FIG. 4 is a Schematic cross-section of ridge laser diode in an example, and shows a simplified schematic cross-sectional diagram illustrating a state of the art laser diode structure. This diagram is merely an example, which should not unduly limit the scope of the claims herein. As shown, the laser device includes gallium nitride substrate 203, which has an underlying n-type metal back contact region 201. In an embodiment, the metal back contact region is made of a suitable material such as those noted below and others. In an embodiment, the device also has an overlying n-type gallium nitride layer 205, an active region 207, and an overlying p-type gallium nitride layer structured as a laser stripe region 211. Additionally, the device may also include an n-side separate confinement heterostructure (SCH), p-side guiding layer or SCH, p-AlGaN EBL, among other features. In an embodiment, the device also has a p++ type gallium nitride material 213 to form a contact region.

Figure 5:
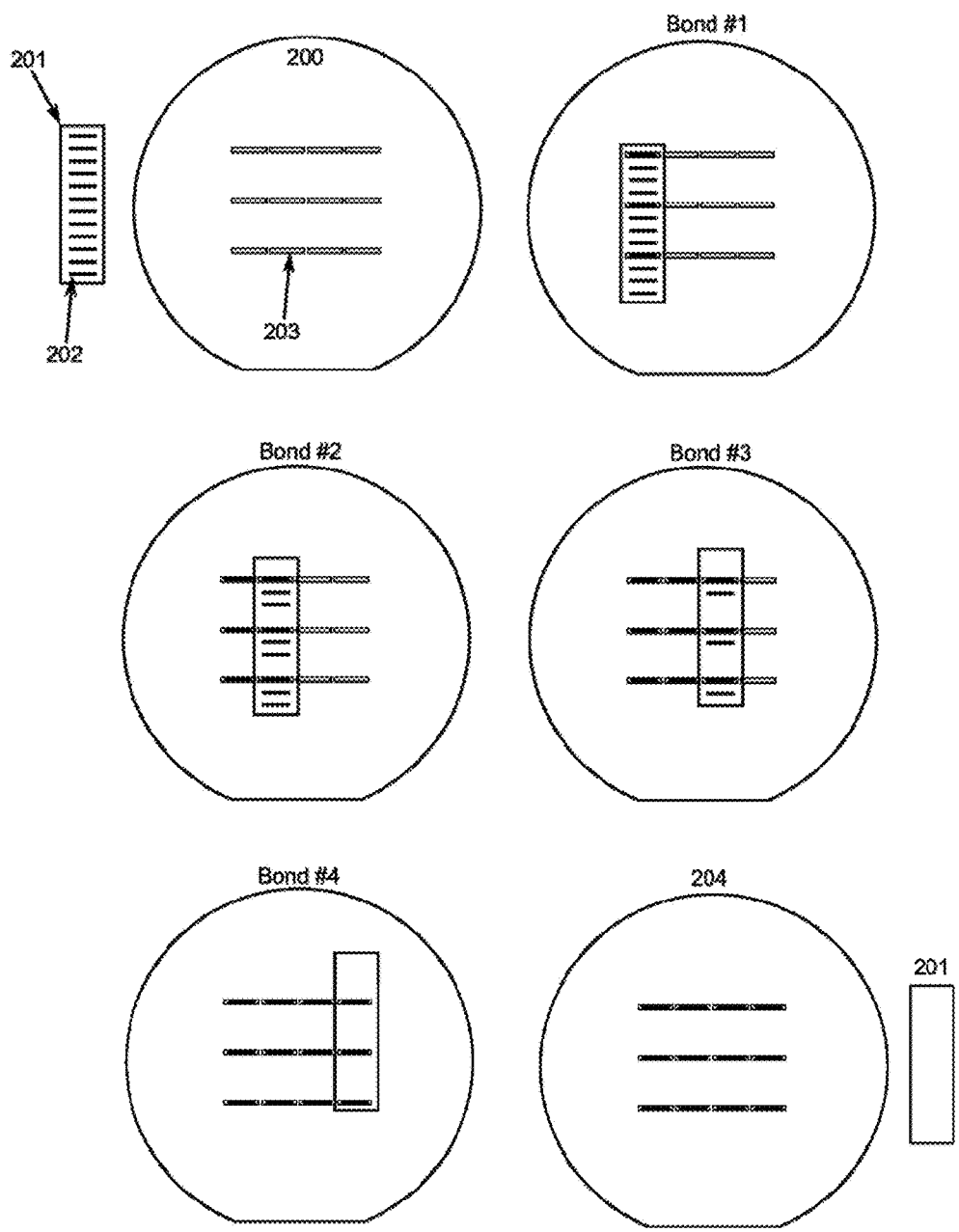
FIG. 5 is a top view of a selective area bonding process in an example.

FIG. 5 is a simplified top view of a selective area bonding process and illustrates a die expansion process via selective area bonding. The original gallium and nitrogen containing epitaxial wafer 201 has had individual die of epitaxial material and release layers defined through processing. Individual epitaxial material die are labeled 202 and are spaced at pitch 1. A round carrier wafer 200 has been prepared with patterned bonding pads 203. These bonding pads are spaced at pitch 2, which is an even multiple of pitch 1 such that selected sets of epitaxial die can be bonded in each iteration of the selective area bonding process. The selective area bonding process iterations continue until all epitaxial die have been transferred to the carrier wafer 204. The gallium and nitrogen containing epitaxy substrate 201 can now optionally be prepared for reuse.

Figure 6:
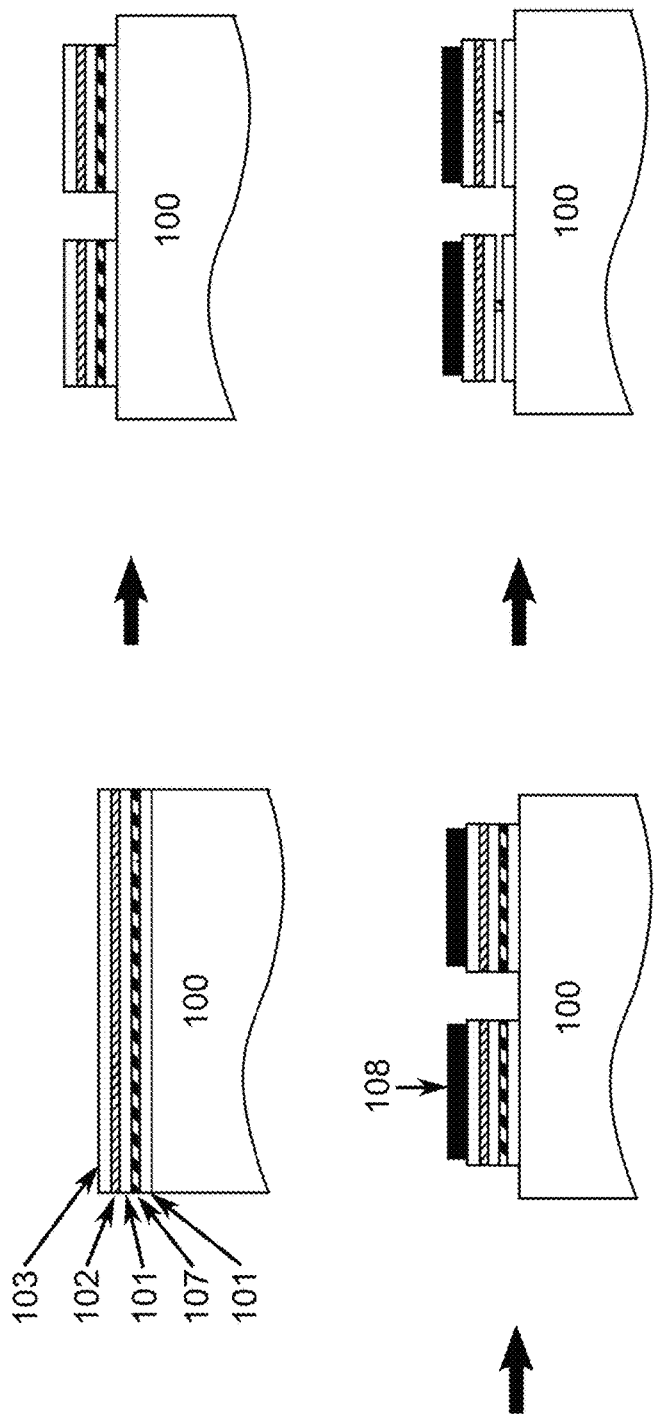
FIG. 6 is a simplified process flow for epitaxial preparation in an example.

In an example, FIG. 6 is a simplified diagram of process flow for epitaxial preparation including a side view illustration of an example epitaxy preparation process flow for the die expansion process. The gallium and nitrogen containing epitaxy substrate 100 and overlying epitaxial material are defined into individual die, bonding material 108 is deposited, and sacrificial regions 107 are undercut. Typical epitaxial layers are included for example purposes and are n-GaN and n-side cladding layers 101, active region 102, and p-GaN and p-side cladding 103.

Figure 7:
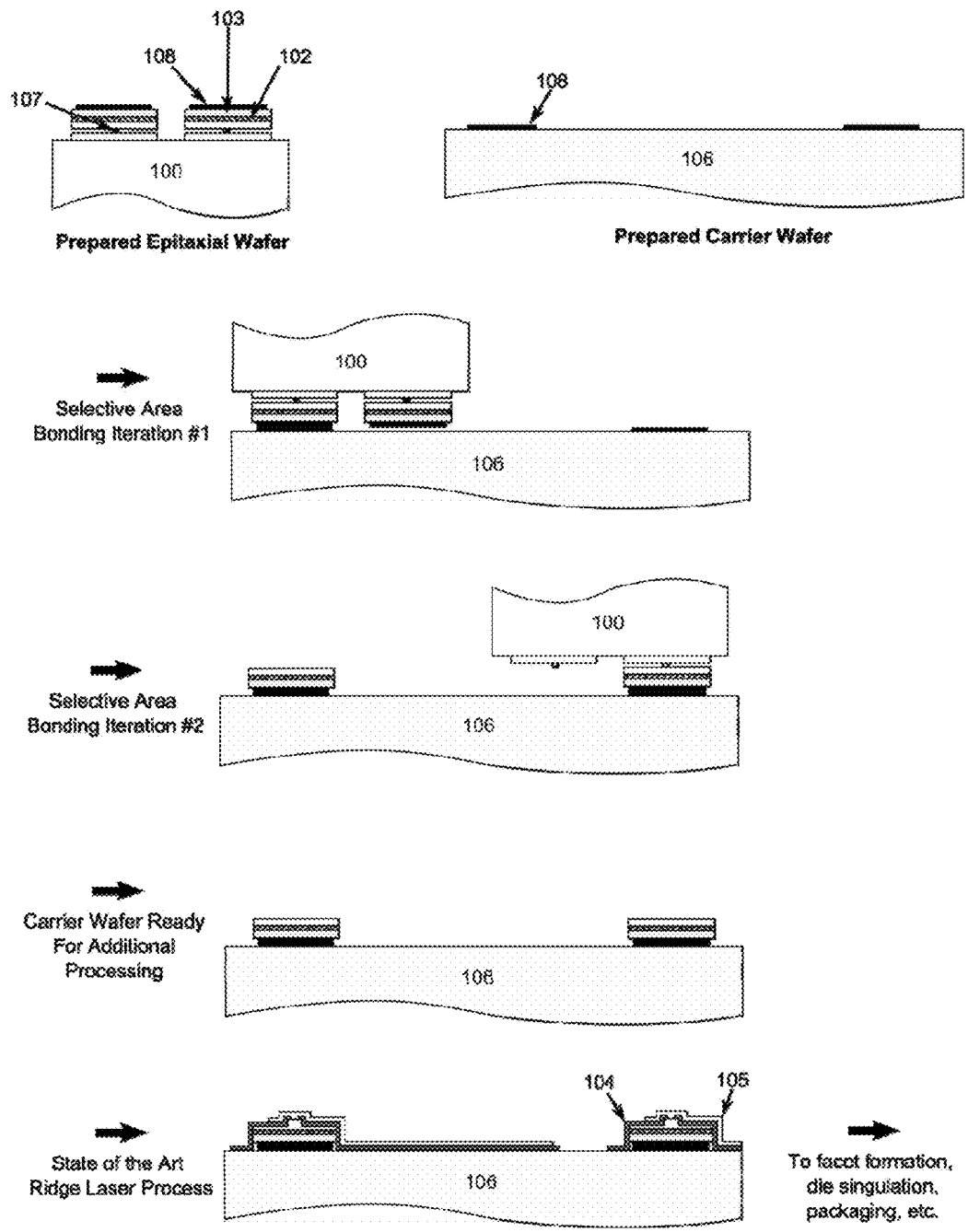
FIG. 7 is a simplified side view illustration of selective area bonding in an example.

In an example, FIG. 7 is a simplified illustration of a side view of a selective area bonding process in an example. Prepared gallium and nitrogen containing epitaxial wafer 100 and prepared carrier wafer 106 are the starting components of this process. The first selective area bonding iteration transfers a fraction of the epitaxial die, with additional iterations repeated as needed to transfer all epitaxial die. Once the die expansion process is completed, state of the art laser processing can continue on the carrier wafer. Typical epitaxial and processing layers are included for example purposes and are n-GaN and n-side cladding layers 101, active region 102, p-GaN and p-side cladding 103, insulating layers 104 and contact/pad layers 105. Additionally, a sacrificial region 107 and bonding material 108 are used during the die expansion process.

Figure 8:
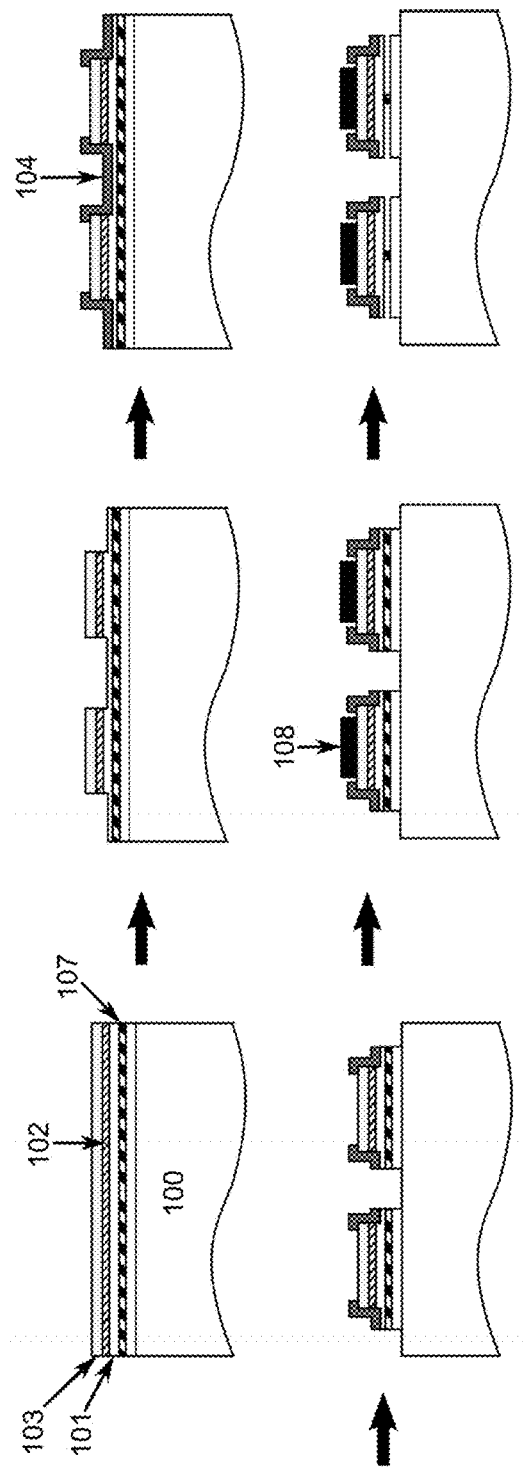
FIG. 8 is a simplified process flow of epitaxial preparation with active region protection in an example.

In an example, FIG. 8 is a simplified diagram of an epitaxy preparation process with active region protection. Shown is a side view illustration of an alternative epitaxial wafer preparation process flow during which sidewall passivation is used to protect the active region during any PEC undercut etch steps. This process flow allows for a wider selection of sacrificial region materials and compositions. Typical substrate, epitaxial, and processing layers are included for example purposes and are the gallium and nitrogen containing substrate 100, n-GaN and n-side cladding layers 101, active region 102, p-GaN and p-side cladding 103, insulating layers 104 and contact/pad layers 105. Additionally, a sacrificial region 107 and bonding material 108 are used during the die expansion process.

Figure 9:
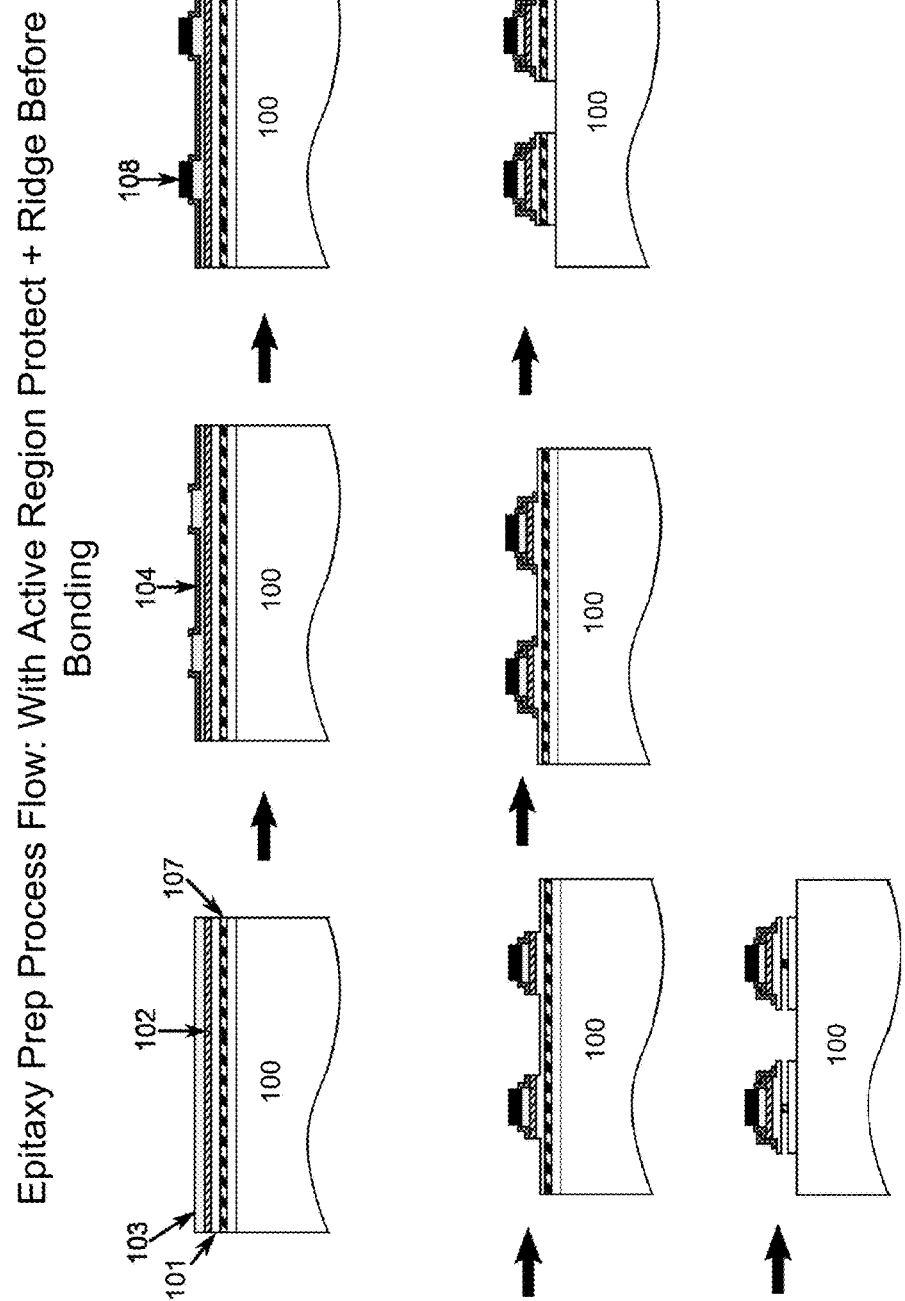
FIG. 9 is a simplified process flow of epitaxial preparation with active region protection and with ridge formation before bonding in an example.

In an example, FIG. 9 is a simplified diagram of epitaxy preparation process flow with active region protection and ridge formation before bonding. Shown is a side view illustration of an alternative epitaxial wafer preparation process flow during which sidewall passivation is used to protect the active region during any PEC undercut etch steps and laser ridges are defined on the denser epitaxial wafer before transfer. This process flow potentially allows cost saving by performing additional processing steps on the denser epitaxial wafer. Typical substrate, epitaxial, and processing layers are included for example purposes and are the gallium and nitrogen containing substrate 100, n-GaN and n-side cladding layers 101, active region 102, p-GaN and p-side cladding 103, insulating layers 104 and contact/pad layers 105. Additionally, a sacrificial region 107 and bonding material 108 are used during the die expansion process.

Figure 10:
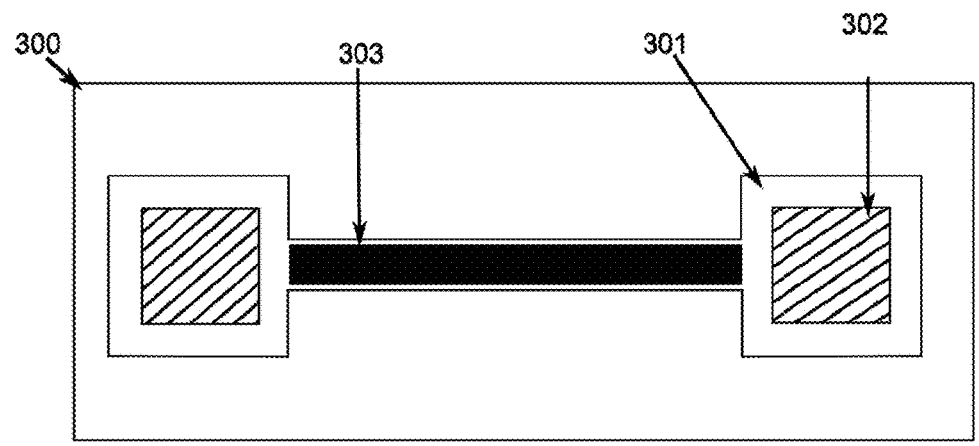
FIG. 10 is a simplified illustration of anchored PEC undercut (top-view) in an example.
Figure 10:
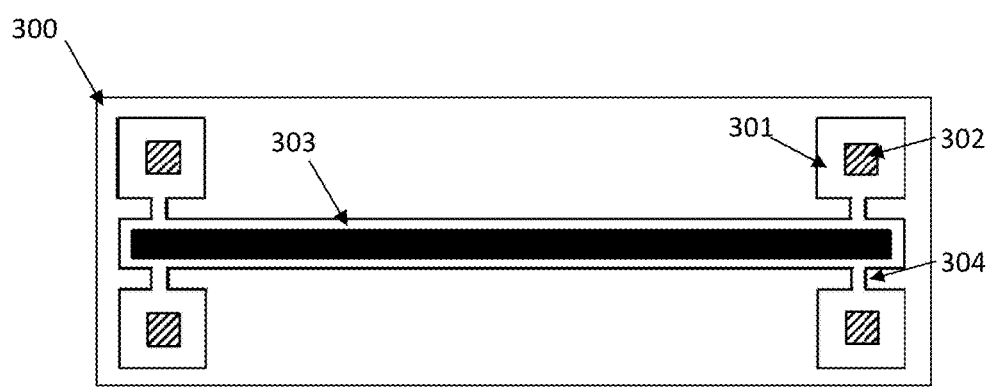
Figure 10:
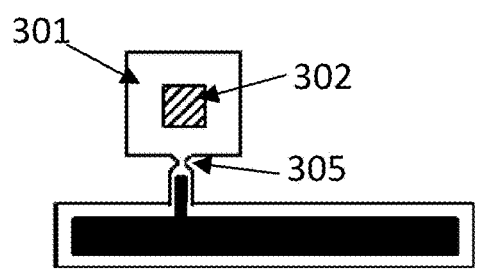

FIG. 10 is a simplified example of anchored PEC undercut (top-view). Shown is a top view of an alternative release process during the selective area bonding of narrow mesas. In this embodiment a top down etch is used to etch away the area 300, followed by the deposition of bonding metal 303. A PEC etch is then used to undercut the region 301, which is wider than the lateral etch distance of the sacrificial layer. The sacrificial region 302 remains intact and serves as a mechanical support during the selective area bonding process. Anchors such as these can be placed at the ends of narrow mesas as in the "dog-bone" version. Anchors can also be placed at the sides of mesas (see peninsular anchor) such that they are attached to the mesa via a narrow connection 304 which is undercut and will break preferentially during transfer. Geometric features that act as stress concentrators 305 can be added to the anchors to further restrict where breaking will occur. The bond media can also be partially extended onto the anchor to prevent breakage near the mesa.

Figure 11:
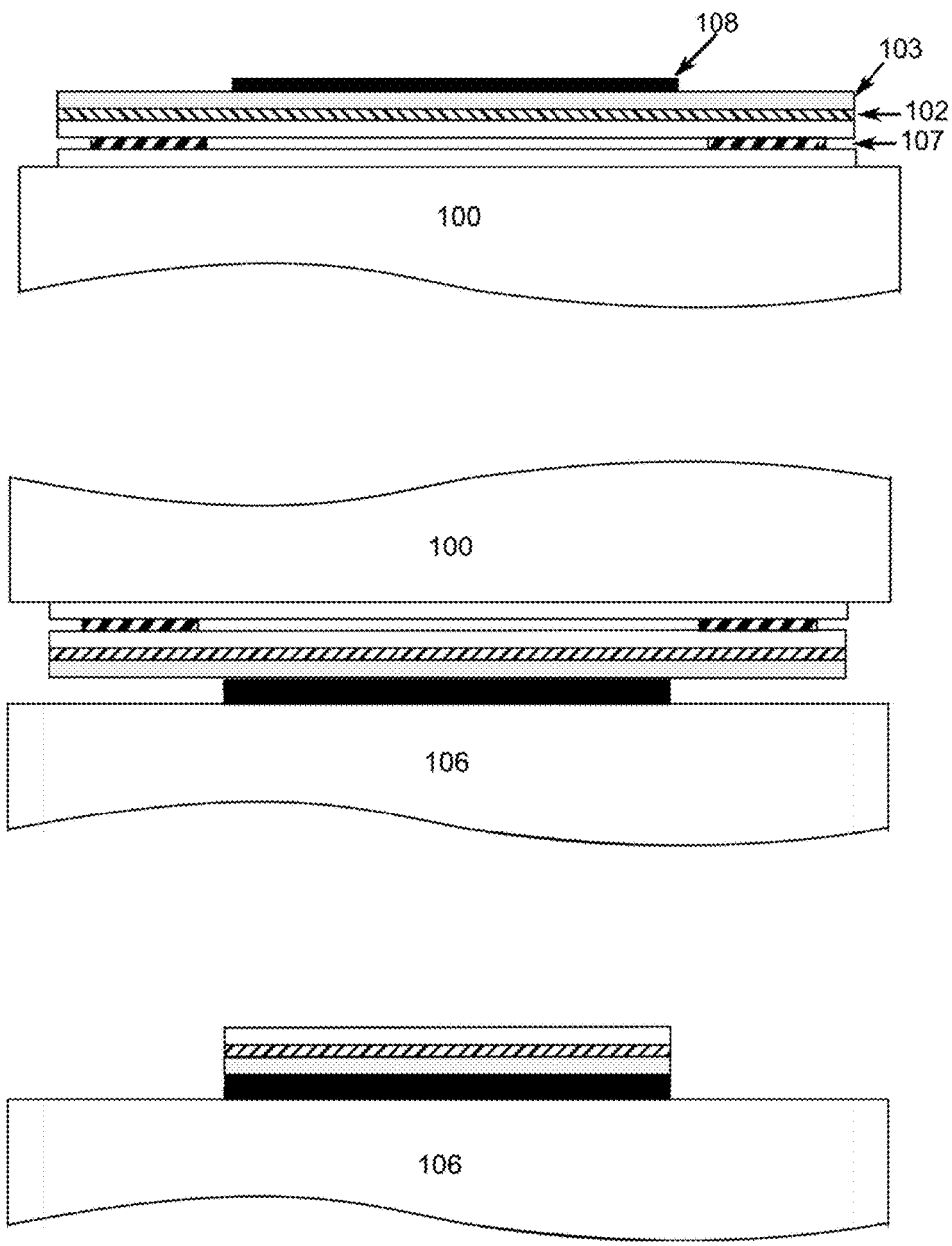
FIG. 11 is a simplified illustration of anchored PEC undercut (side-view) in an example.

FIG. 11 is a simplified view of anchored PEC undercut (side-view) in an example. Shown is a side view illustration of the anchored PEC undercut. Posts of sacrificial region are included at each end of the epitaxial die for mechanical support until the bonding process is completed. After bonding the epitaxial material will cleave at the unsupported thin film region between the bond pads and intact sacrificial regions, enabling the selective area bonding process. Typical epitaxial and processing layers are included for example purposes and are n-GaN and n-side cladding layers 101, active region 102, p-GaN and p-side cladding 103, insulating layers 104 and contact/pad layers 105. Additionally, a sacrificial region 107 and bonding material 108 are used during the die expansion process. Epitaxial material is transferred from the gallium and nitrogen containing epitaxial wafer 100 to the carrier wafer 106. Further details of the present method and structures can be found more particularly below.

Figure 11A:
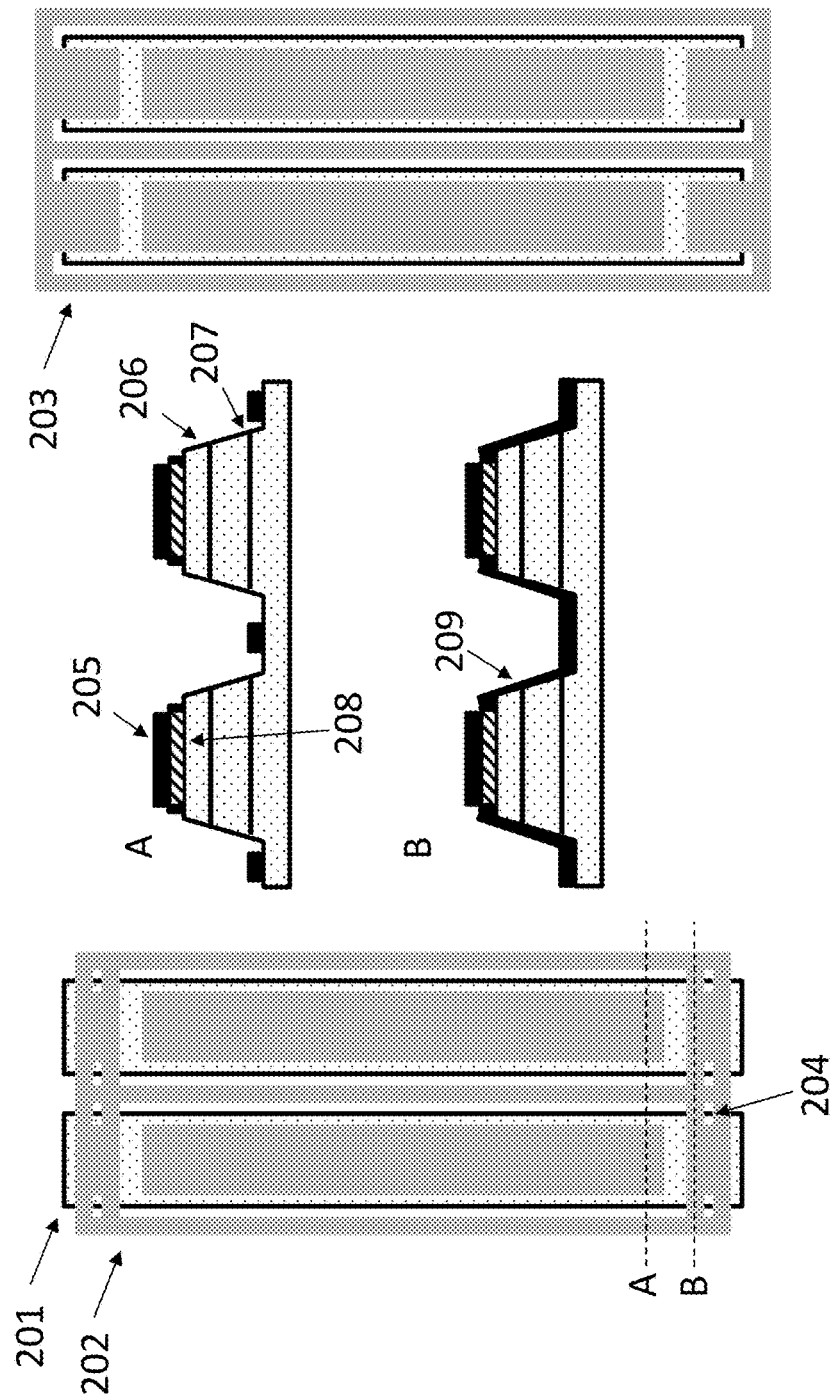
FIG. 11a is a simplified illustration of non-epitaxial, electrically conductive anchored PEC (top view and side-view) in an example.

FIG. 11a schematic representation of electrically-conductive, non-epitaxial anchor layouts. Device layer mesas 201 are etched into the donor wafer. The mesas are then overlaid with bond media 203. The bond media is comprised of a plurality of regions, with one region isolated to the top of the device layer mesa, a second region overlays the ends of the mesa and comprises the anchor region of the mesas. Bond media extends over the edge of the mesa in the anchor regions. Schematic representations of the cross sections A and B are shown. Cross-section A shows a region of the mesa far from the anchors. Bond media 205 is isolated to the top of the mesas and the etched trenches. On the tops of the mesas, the bond media overlays the p-contact metal layers 208. Both the active region 206 and the sacrificial layers 207 are exposed to the side of the mesa. Cross-section B shows the anchor region of the mesa. Here the bond media overlays the mesa tops as well as the trenches. Regions of bond media 209 connect the bond media on the mesa tops to that in the trenches; acting as both anchors as well as conducting paths for shorting the active region.

Figure 11B:
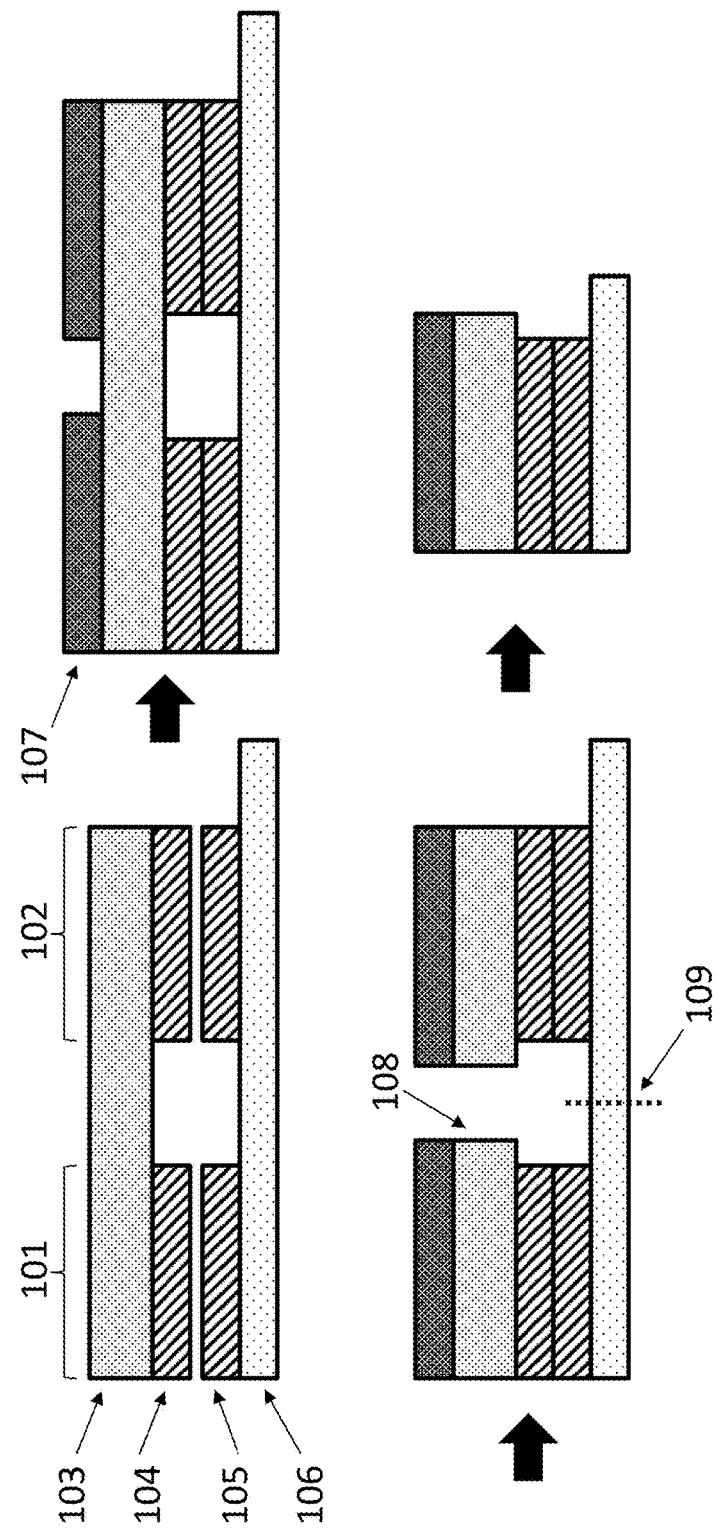
FIG. 11b is a simplified illustration of the present invention including an etched facet where the bonding media is comprised of a plurality of regions with no bonding media underlying the facet region (side-view) in an example.

FIG. 11b schematically shows an embodiment including an etched facet where the bonding media is comprised of a plurality of regions with no bonding media underlying the region of the device layers where the facet is etched. A carrier wafer 106 is provided and overlaid by a plurality of regions comprised of bond media 105. A device layer mesa is provided, also overlaid by a plurality of regions of bond material 104. The mesa is comprised by two regions: a cavity region 101 and an anchor region 102. Only one end of the cavity region is shown. The opposite end would also have an anchor region. The cavity and anchor regions are separated by a region that is not over laid by bond media. A silicon oxide hard mask 107 is overlaid on the device layer mesa and patterned with a window that will define the facet etch region. A dry etch process is used to etch the device layers to form a first facet 108. The carrier wafer is then separated along a separation-line 109 to form a laser bar.

Figure 12:
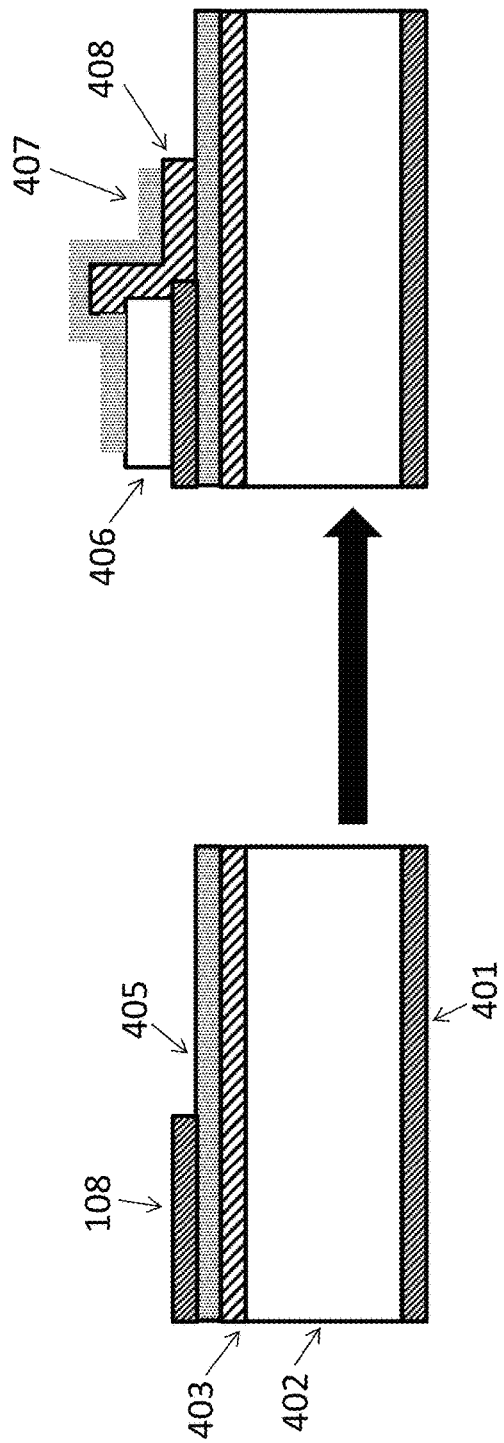
FIG. 12 is a simplified illustration of a carrier wafer processed to act as a submount.

FIG. 12 is a simplified illustration of a carrier wafer processed to act as a submount. The carrier wafer 402 is processed such that the backside contains a bonding media 401 which could be epoxy, gold-tin solder or the like. The carrier is also processed with a first passivating layer 403 that electrically isolates the carrier wafer from the overlaying layers. A conductive bond pad 405 overlays the passivating layer and allows for electrical access via a probe or wire bond to the bond pad 108 used during the laser die transfer process. After transfer of the laser die 406 a second electrical contact and bond-pad layer 407 is added overlaying both the laser device patterned on the die as well as part of the bottom side contact pad 405. A second passivating layer 408 separates the two bond pads.

Figure 13:
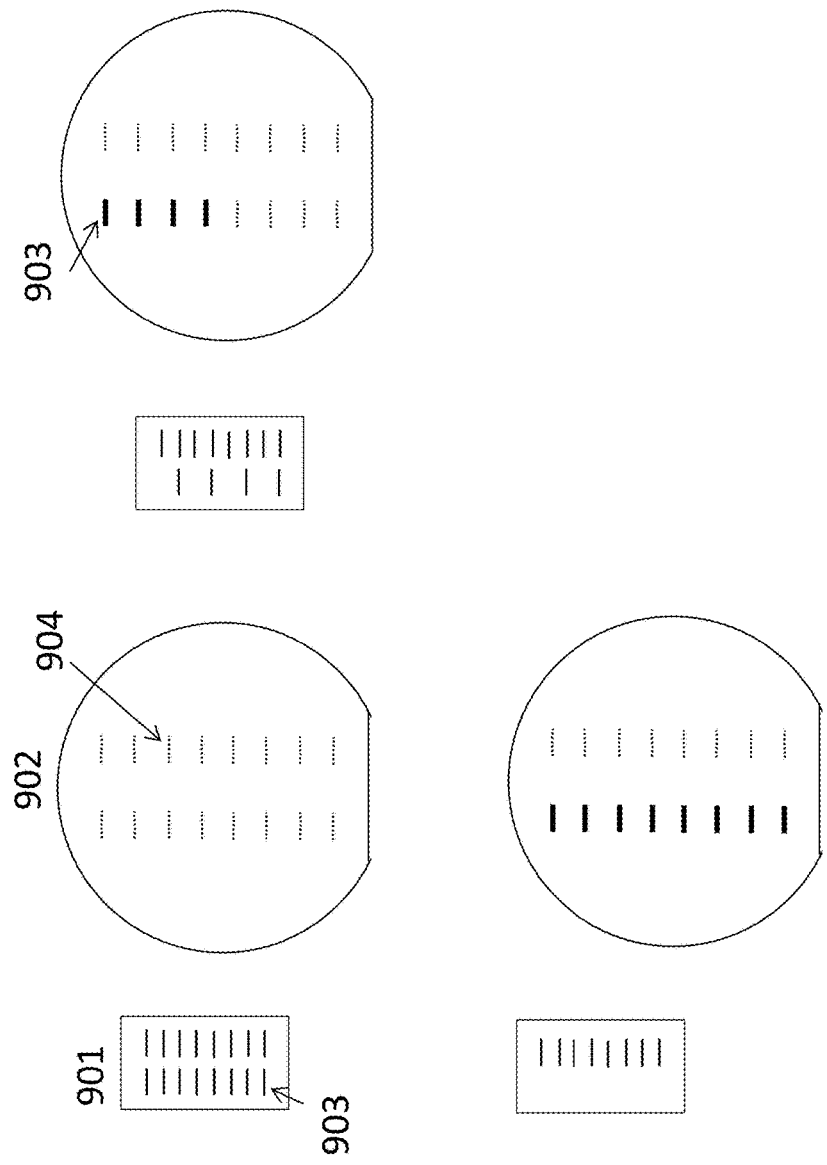
FIG. 13 is top view of a selective area bonding process with die expansion in two dimensions in an example.

FIG. 13 is top view of a selective area bonding process with die expansion in two dimensions in an example. The substrate 901 is patterned with transferable die 903. The carrier wafer 902 is patterned with bond pads 904 at both a second and fourth pitch that are larger than the die pitches on the substrate. After the first bonding, a subset of the laser die is transferred to the carrier. After the second bonding a complete row of die are transferred.

Figure 13A:
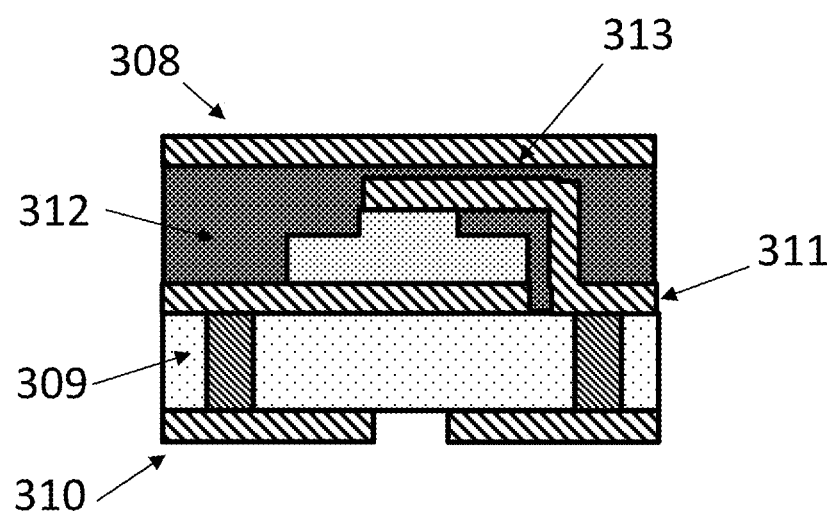
FIG. 13a is a cross-section schematic representation of a laser or SLED device in accordance with an embodiment of this invention.

FIG. 13*a* Schematic representation of a laser device in accordance with an embodiment of this invention. The carrier wafer contains multiple, conductive through-vias 309 per die, with each through-via being overlaid on both sides of the carrier wafer with a metallic pad 310. The device mesa is transferred to the carrier wafer and patterned with a ridge. The bond pad on the carrier wafer is electrically connected to one of the through vias. A metal electrode is deposited on top of the ridge and is connected to the metal pad of one of the through-vias. A dielectric material is overlaid on the carrier such that the device mesa and electrical interconnects are fully encapsulated by the dielectric. A planarization process such as lapping is used to planarized the dielectric and leave a thin (less than 10 micron thick and preferably less than 1 micron thick) layer of dielectric above the metal electrode on top of the laser ridge. The planarized dielectric is then overlaid with a bond pad 308 which is used to solder the device to a heat sink such that the backside metal contacts are accessible for electrically contacting the laser device.

Figure 13B:
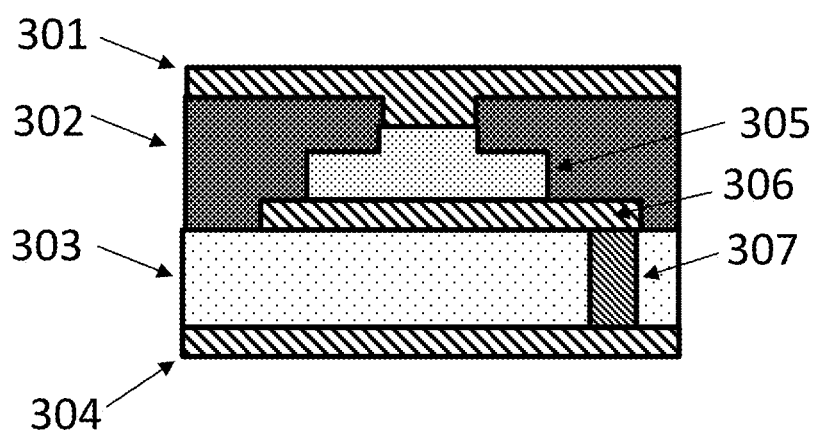
FIG. 13b is a cross-section schematic representation of a laser or SLED device in accordance with an embodiment of this invention.

FIG. 13*b* schematically shows an embodiment including an etched facet where the bonding media is comprised of a plurality of regions with no bonding media underlying the region of the device layers where the facet is etched. A carrier wafer 106 is provided and overlaid by a plurality of regions comprised of bond media 105. A device layer mesa is provided, also overlaid by a plurality of regions of bond material 104. The mesa is comprised by two regions: a cavity region 101 and an anchor region 102. Only one end of the cavity region is shown. The opposite end would also have an anchor region. The cavity and anchor regions are separated by a region that is not over laid by bond media. A silicon oxide hard mask 107 is overlaid on the device layer mesa and patterned with a window that will define the facet etch region. A dry etch process is used to etch the device layers to form a first facet 108. The carrier wafer is then separated along a separation-line 109 to form a laser bar.

Figure 14:
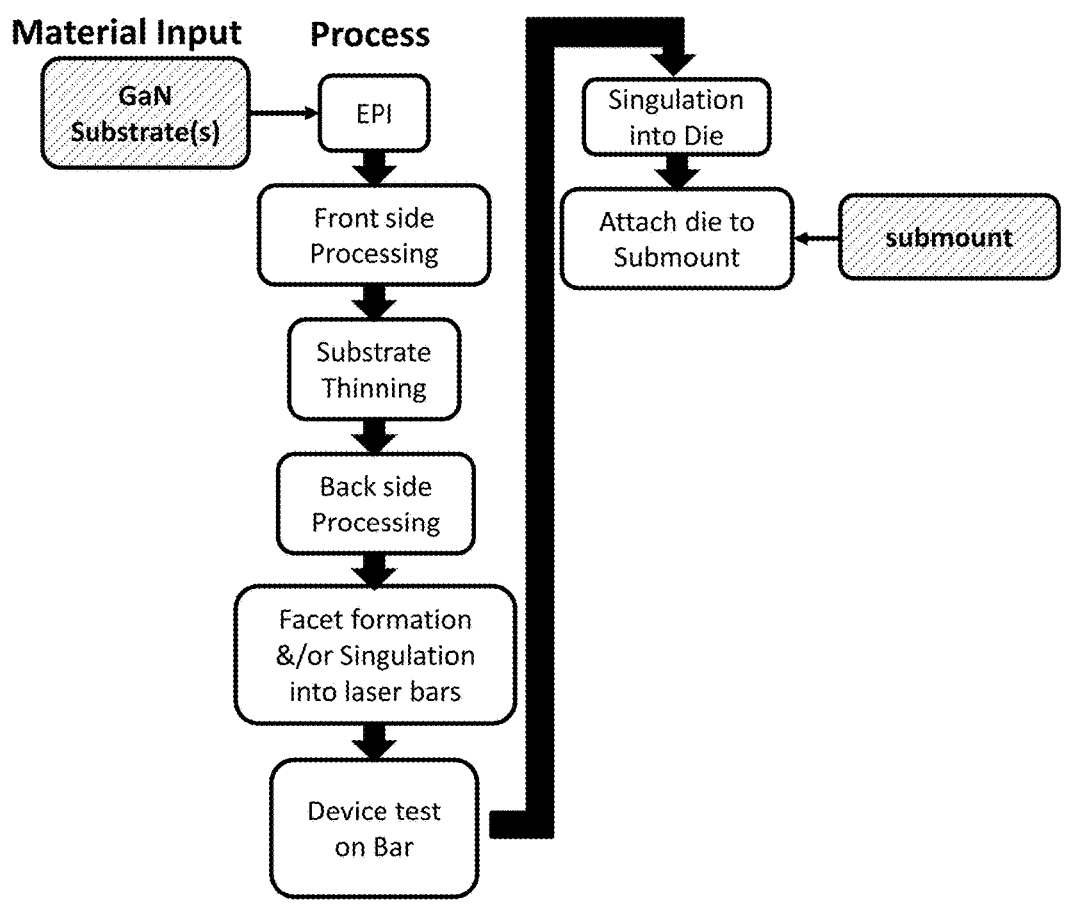
FIG. 14 is a flow diagram for processing steps and material inputs for a typical laser diode device in and example.

FIG. 14 is a flow diagram for processing steps and material inputs for a typical laser diode device in and example. Here GaN substrates are deposited on to form a LD device wafer. Laser ridges, along with passivation and electrical contact layers are fabricated on the wafer front side. The wafer is then thinned, which consumes most of the thickness of the wafer. The backside electrical contacts are processed. The wafer is then scribed and cleaved to form facets, facet coatings are added and the laser devices are tested for quality assurance. The laser bars are then singulated into individual die and attached to a submount. The process flow for a GaAsP based laser would be substantively similar.

Figure 15:
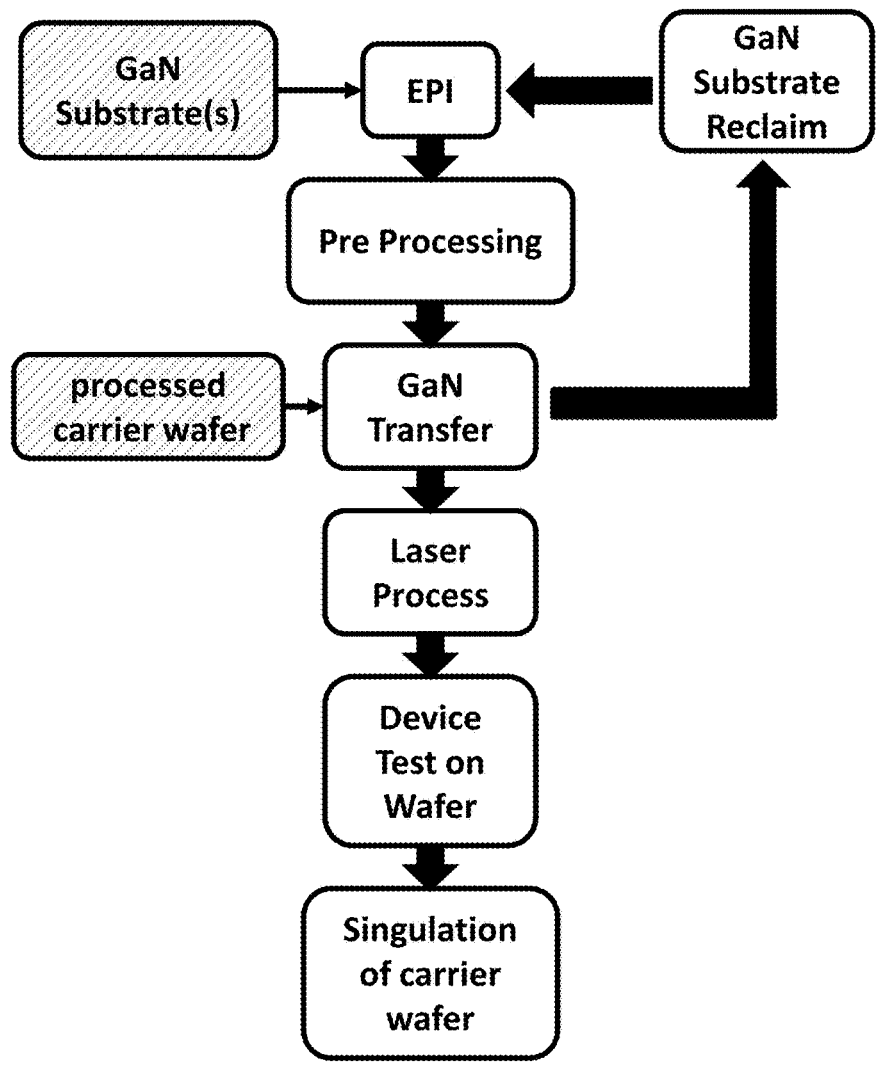
FIG. 15 is a flow diagram for processing steps and material inputs for a low cost laser device fabricated with epitaxial transfer to a carrier wafer in an example.

FIG. 15 is a flow diagram for processing steps and material inputs for a low cost GaN laser device fabricated with epitaxial transfer to a carrier wafer in and example. Here GaN substrates are deposited on to form a LD device wafer. Laser die are processed in preparation for transfer. The laser die are then transferred to a carrier wafer. Laser ridges, passivation layers and contacts are then fabricated on the die on the carrier. In the case where etched facets are used the devices are tested on wafer. The carrier is then singulated into individual die. The process flow for a GaAsP based laser would be substantively similar.

FIG. 16 is a table showing number of laser devices that can be processed on a substrate at a given die pitch. The table shows values for substrates of three geometries 25.4 mm, 32 mm diameter round wafers and 2×2 cm$^2$ square wafers. As the die pitch is decreased the density of devices that can be processed on a substrate increases dramatically.

Figure 17:
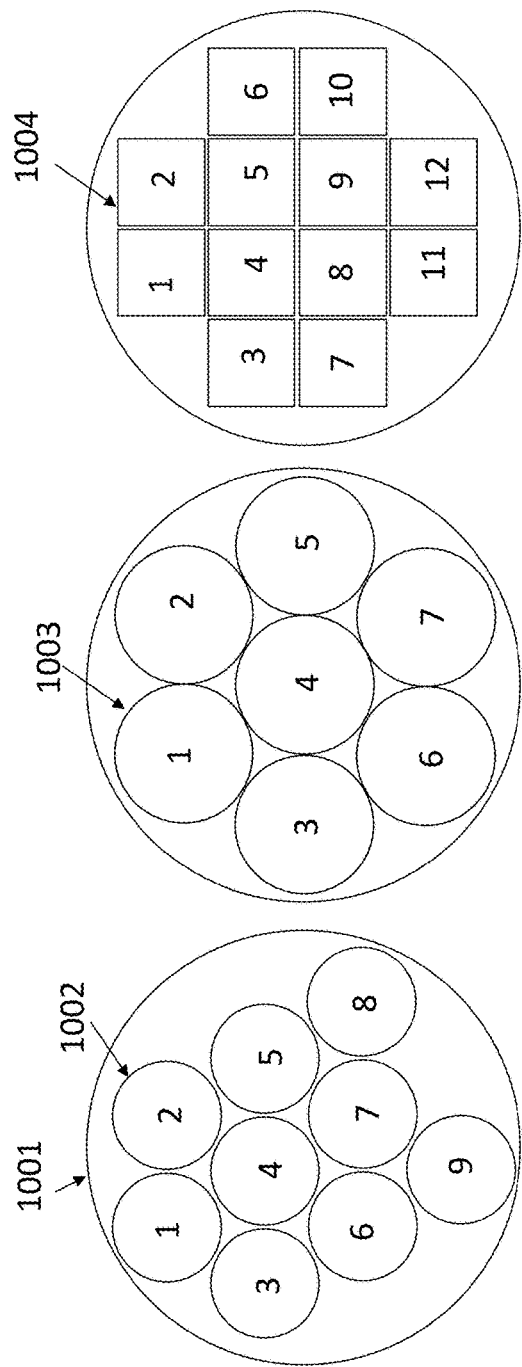
FIG. 17 is an illustration of bondable area for various substrate dimensions on a 100 mm diameter carrier wafer in accordance with an embodiment of this invention.

FIG. 17 is an illustration of bondable area for various substrate dimensions on a 100 mm diameter carrier wafer 1001. In this configuration die expansion is happening in one dimension only. The number of transfers possible is fixed by the size and shape of the substrate relative to the carrier. Several examples are shown, including 25.4 mm diameter wafers 1002, 32 mm diameter wafers 1003 and 2×2 cm$^2$ substrates 1004.

FIG. 18 is a table showing number of laser devices that can be processed on about 50 micron wide die after epi transfer to a carrier at various second pitches. The second pitch, e.g. the die pitch on the carrier, relative to the pitch on the substrate determines the fraction of die on the substrate that can be transferred in each transfer step. A carrier wafer may therefore contain die from multiple substrates, one substrate or only part of a single substrate depending on the sizes of the first and second pitches.

Figure 19:
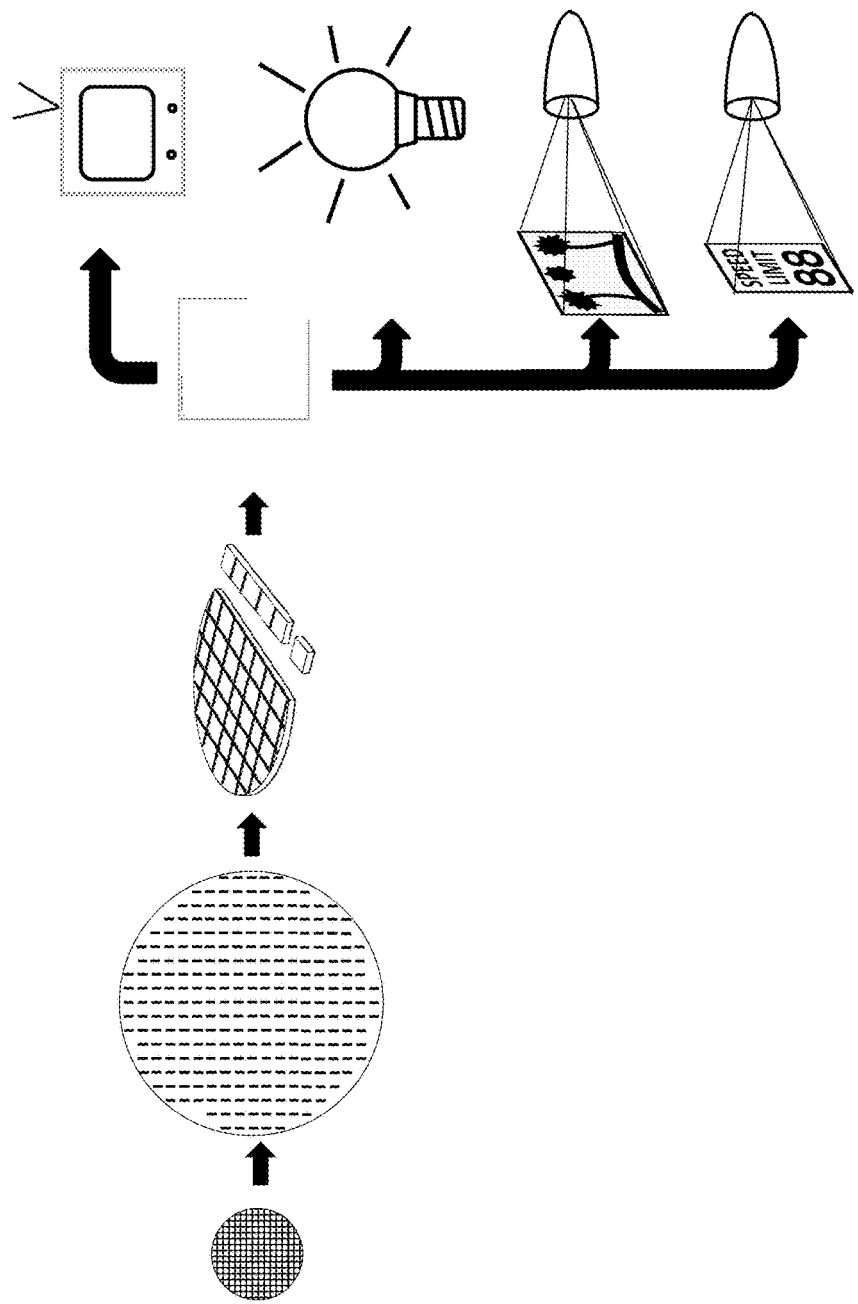
FIG. 19 is a diagram showing the process flow for fabrication of a small area GaN substrate into a chip scale package in accordance with an embodiment of this invention.

FIG. 19 shows a pictorial representation of the process flow for fabrication of GaN based laser diodes devices from epitaxial films on substrates to final applications. Die may be fabricated on 32 mm GaN wafers and then transferred to a 100 mm SiC substrate. After processing of the die into laser devices the SiC carrier is singulated into individual laser chips that are ready to be installed in various applications such as displays, light sources for general lighting, projectors and car headlamps among others. In this example, about 50 micron wide mesas with a first pitch of about 70 microns may be transferred to the carrier wafer at a second pitch of about 490 microns.

Figure 20:
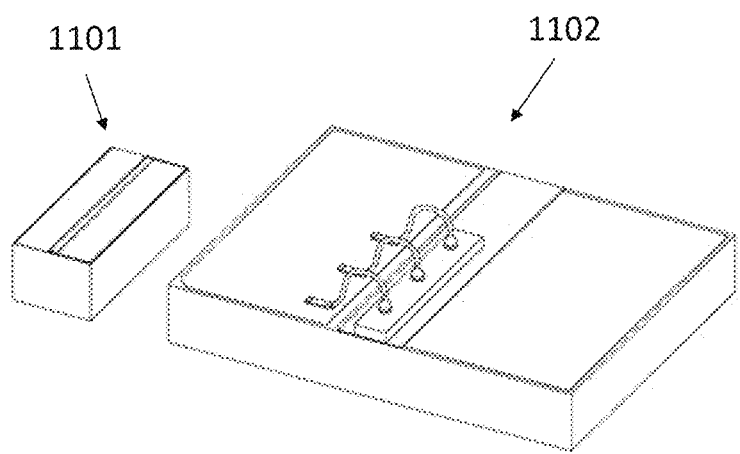
FIG. 20 is a schematic comparing a typical laser die fabricated from a GaN wafer to a laser device fabricated on a transferred laser die and singulated from a carrier wafer in accordance with an embodiment of this invention.

FIG. 20 shows a schematic representation of a typical laser die on submount 1102 and a device of this invention 1101. The die on submount may be about 1.2 mm long by about 30 micron wide laser ridge fabricated on a GaN substrate thinned to about 75 microns and cleaved into laser die about 1.2 mm long and about 150 microns wide. These die are then attached to a larger submount patterned with electrically isolated wire bond pads. The wire bond pads are connected electrically to the top and bottom of the laser die via wire bonds and a soldered connection respectively. In the chip-scale device, an array of about 50 micron wide by about 1.2 mm by about 2 micron thick laser die are transferred to a SiC carrier wafer, electrical connections and wire-bond pads are fabricated using wafer-scale lithographic processes. The resulting chip is about 1.2 mm by about 0.5 mm wide, however it should be noted that the size of the resulting chip can be scaled by adjusting the pitch of the laser die array on the carrier wafer. In both devices, electrical contact to the pads can be made either by wire bonds or via detachable connections such as pogo-pins, spring clips or the like.

Figure 21:
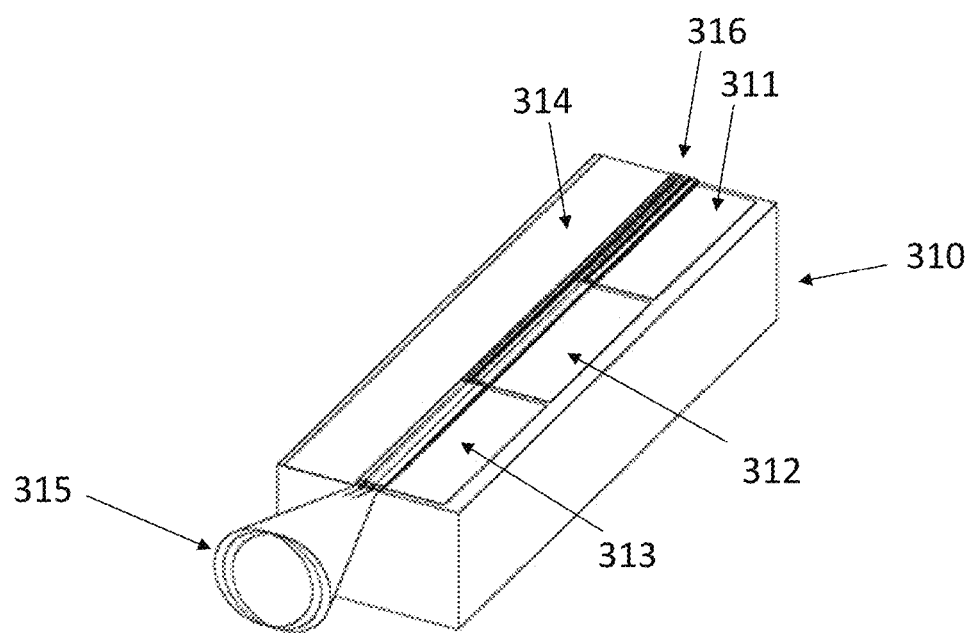
FIG. 21 is a drawing of a RGB laser or SLED chip according to an embodiment of this invention.

FIG. 21 is a drawing of a RGB laser chip fabricated using the selective area bonding process as according to an embodiment. Three laser dice 316 are bonded to a carrier wafer 310 and processed with laser features (ridges, passivation, electrical contacts, etc.) such that the laser ridges are parallel. The dice are electrically isolated from the carrier wafer material. A common bottom contact 314 is shared between the die while individual top-side electrical contacts 311 312 and 313 are provided such that the laser devices on each die can be operated individually. The emission cones 315 of the laser devices on each of the die overlap substantially, deviating only lateral by a distance less than or equal to the total width spanned by the laser dice. In this drawing the laser chip has been singulated from the original carrier wafer.

Figure 22:
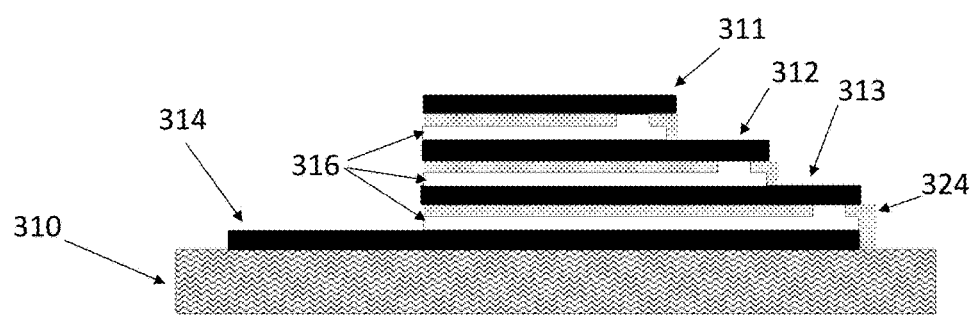
FIG. 22 is a drawing of a RGB laser or SLED chip according to an embodiment of this invention.

FIG. 22 is a drawing of a RGB laser chip fabricated using the selective area bonding according to an embodiment. Three laser dice 316 are bonded to a carrier wafer 310 and processed with laser features (ridges, passivation, electrical contacts, etc.) such that the laser ridges are parallel. The dice are electrically isolated from the carrier wafer material. The top-side electrical contacts 311 312 and 313 for each die are used as the bonding layer for the next die such that the die are overlaid. Passivating layers 324 are used to separate the bulk of the laser die from the top-side electrical contacts such that current can only pass through the etched laser ridge. In this configuration, there is no electrode common to all laser die, but rather the anode for one die acts as the cathode for the next. Due to overlaying the laser die, the ridges can be placed close together. As shown, the ridges do not overlap, but it should be recognized that other configurations are possible. For example, the ridges could be aligned laterally to within the tolerances of the lithographic process.

Figure 23:
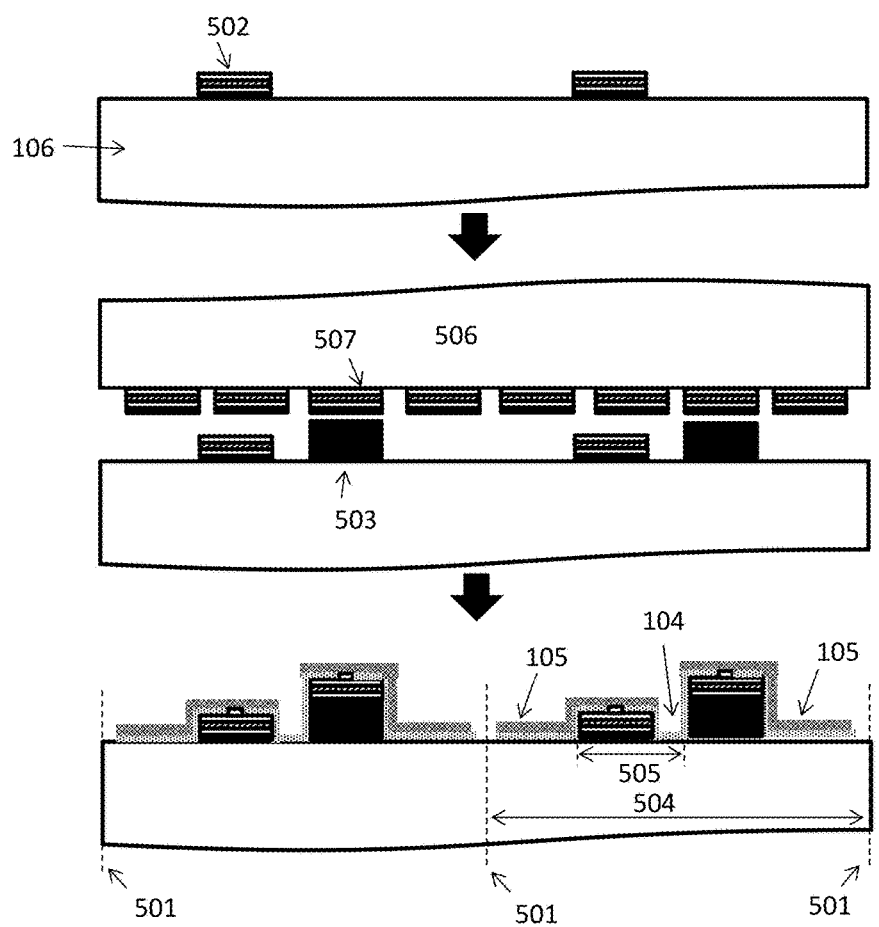
FIG. 23 is a schematic diagram of the process for bonding dice from multiple epitaxial wafers to the same carrier wafer according to an embodiment of this invention.

FIG. 23 shows a schematic of the cross section of a carrier wafer during various steps in a process that achieves this RGB laser chip. Die 502 from a first epitaxial wafer is transferred to a carrier wafer 106 using the methods described above. A second set of bond pads 503 are then deposited on the carrier wafer and are made with a thickness such that the bonding surface of the second pads is higher than the top surface of the first set of transferred die 502. This is done to provide adequate clearance for bonding of the die from the second epitaxial wafer. A second substrate 506 which might contain die of a different color, dimensions, materials, and other such differences is then used to transfer a second set of die 507 to the carrier. Finally, the laser ridges are fabricated and passivation layers 104 are deposited followed by electrical contact layers 105 that allow each dice to be individually driven. The die transferred from the first and second substrates are spaced at a pitch 505 which is smaller than the second pitch of the carrier wafer 504. This process can be extended to transfer of die from any number of substrates, and to the transfer of any number of laser devices per dice from each substrate.

Figure 24:
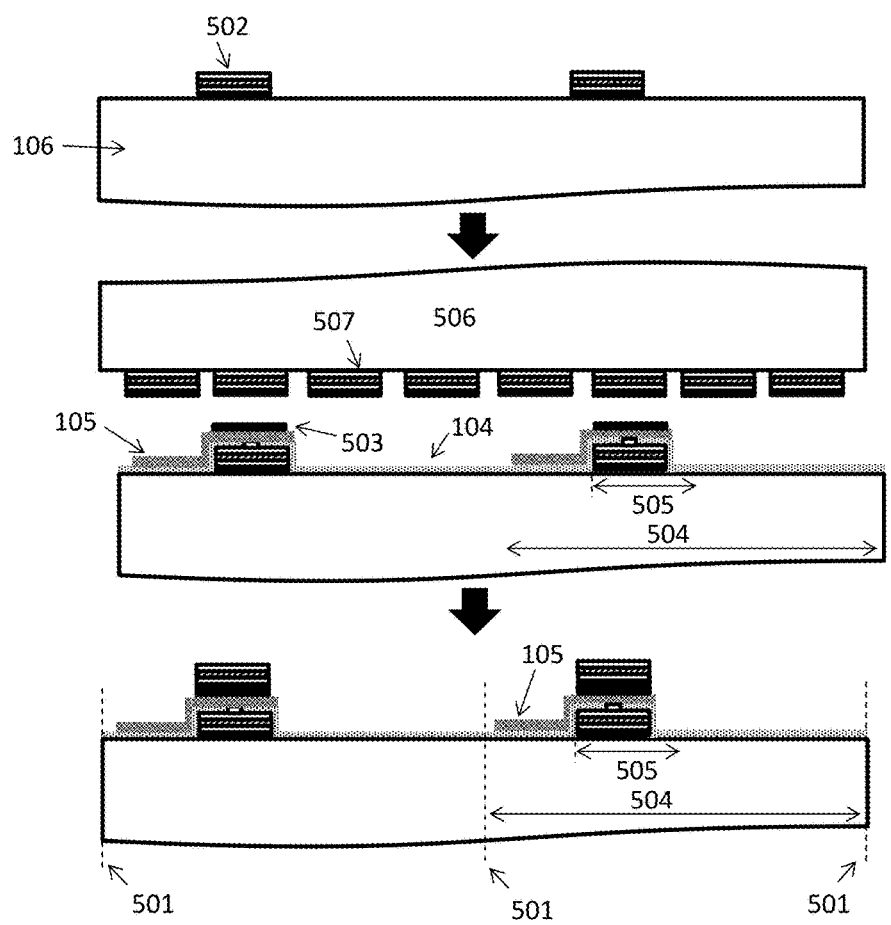
FIG. 24 is a schematic diagram of the process for bonding dice from multiple epitaxial wafers to the same carrier wafer according to an embodiment of this invention.

FIG. 24 shows a schematic of the cross section of a carrier wafer during various steps in a process that achieves RGB laser chip. Die 502 from a first epitaxial wafer is transferred to a carrier wafer 106 using the methods described above. Laser ridges, passivation layers 104 and ridge electrical contacts 105 are fabricated on the die. Subsequently bond pads 503 are deposited overlaying the ridge electrical contacts. A second substrate 506 which might contain die of a different color, dimensions, materials, and other such differences is then used to transfer a second set of die 507 to the carrier at the same pitch as the first set of die. Laser ridges, passivation layers and ridge electrical contacts can then be fabricated on the second set of die. Subsequent die bond and laser device fabrication cycles can be carried out to produce, in effect, a multiterminal device consisting of an arbitrary number of laser die and devices.

Figure 25:
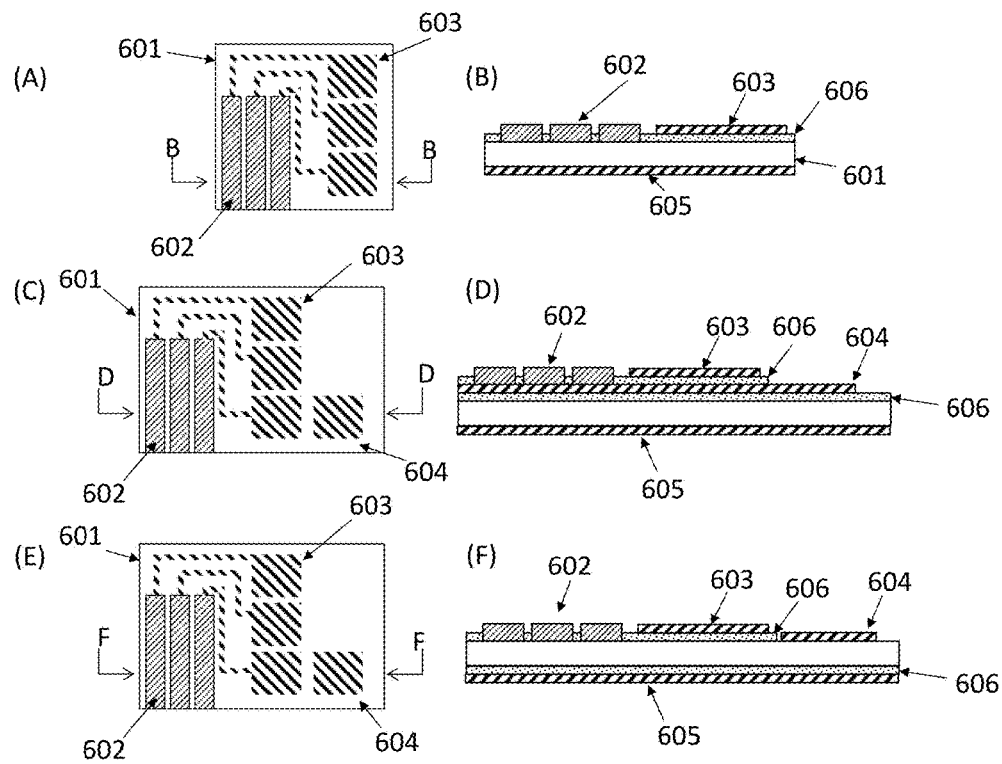
FIG. 25 shows schematic diagrams of layouts for laser or SLED chips containing multiple die which will be individually addressable according to some embodiments of this invention.

FIG. 25 shows schematics of the layout of three multi-die laser chips according to embodiments of this invention. Layout A and accompanying cross-section B show a laser chip comprised by a singulated piece of a carrier wafer 601, three laser die 602 transferred from epitaxial substrates, and metal traces and pads 603 for electrically connecting to the die. Layout A has the die bonded directly to the carrier wafer, which is both conductive and which forms a common electrode connected to a metal pad 605 on the backside of the carrier wafer. A passivating layer 606 is used to isolate the metal traces and pads 603 which contact the laser ridges and form the second electrode of the laser devices. The ridge side contacts are separate and electrically isolated such that the laser devices may be run independently. Layout C and accompanying cross-section D show a similar structure, however the laser die are bonded to a metal layer 604 which is electrically isolated from the carrier wafer by passivation layers 606. A bond pad 605 is overlaid on the backside of the carrier wafer, providing a means to attach the laser chip to a submount, heat sink, printed circuit board or any other package. In this structure, the carrier wafer need not be conductive. Layout E and accompanying cross section F show a similar structure as layout C, however the carrier wafer is conductive and serves as a common electrode for the laser mesas. A passivation layer is deposited between the carrier and the backside bond pad 605 to electrically isolate the chip from the submount, heatsink, circuit board or other package type it is installed into.

Figure 25A:
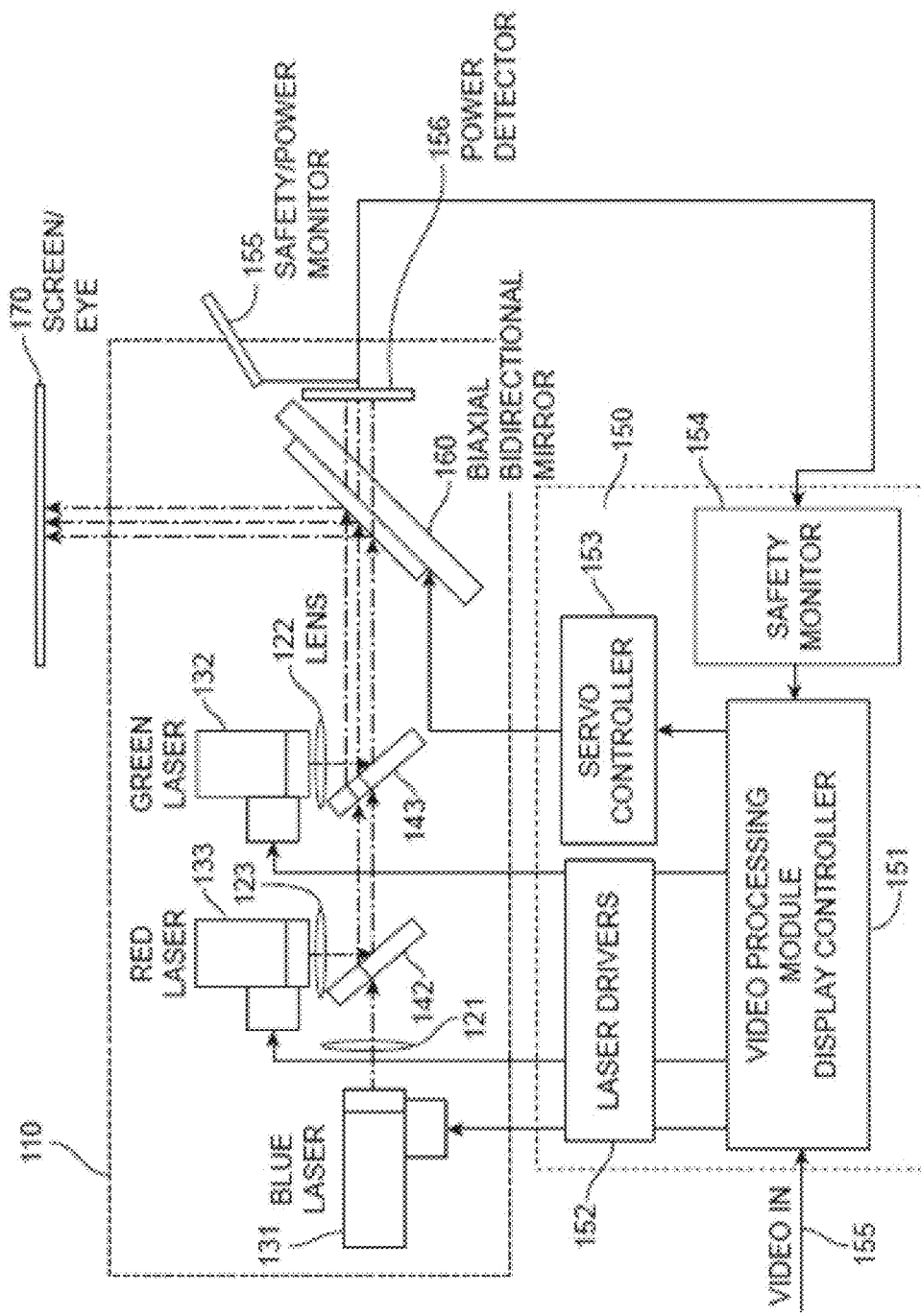
FIG. 25a is a schematic diagram of conventional scanning mirror projection engine according to an embodiment of this invention.

FIG. 25a is a schematic illustration demonstrating prior art configurations for projection displays based on RGB sources. The projection apparatus includes the optical projection engine 110 and the video electronics module 150. The optical engine 110 comprises of light sources, optical components and a Micro-Electro-Mechanical Systems (MEMS) or conventional scanning mirror 160. The optical engine 110 can be enclosed in the housing having an aperture that allows the light beam from the engine to generate projected image on the screen 170.

Figure 25B:
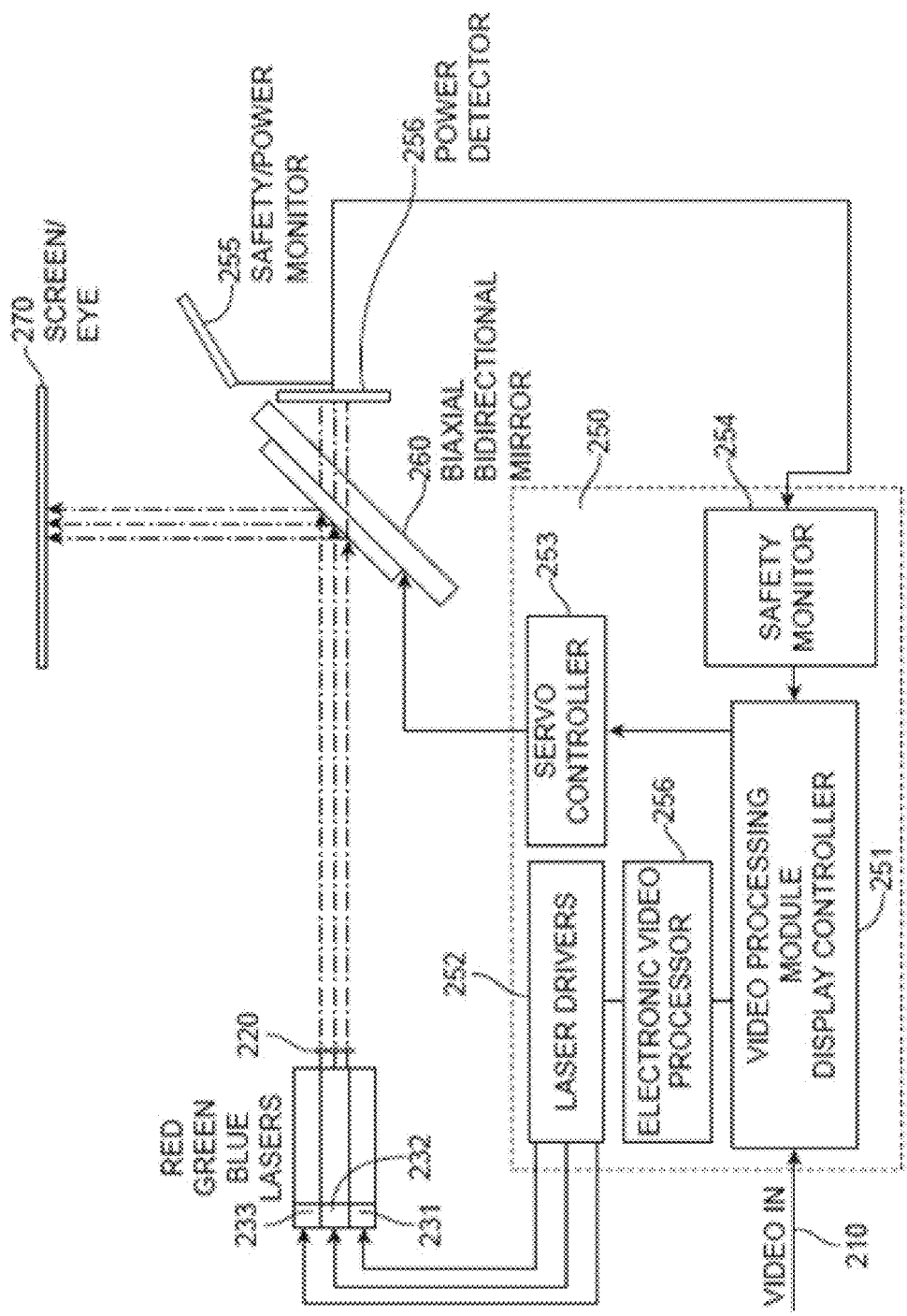
FIG. 25b is a schematic diagram of scanning mirror projection engine without optical combiner optics, using multiple monochromatic light source(s) and correcting electronic video processor according to an embodiment of this invention.

FIG. 25b is a schematic of a projection display system according to this invention is shown in. 2. Many components have the same or similar functionality as those outlined in FIG. 25a. The three lasers 231, 232 and 233 are closely spaced and integrated with the light beam collimating optics element 220. No light combining optics is required and no active alignment of collimating lenses and other optical elements is used, resulting with Red, Green and Blue (RGB) beams that are not fully superimposed and have differences in beam directions in two dimensions.

The electronics module 250 has the conventional display controller 251, servo controller 253, optional safety monitor 254, but additionally includes electronic video processor 256 that modifies the video streams to correct the modulation of the laser drivers 252 in order to account for the misalignment and differences between directionality of the RGB beams described below.

Figure 25C:
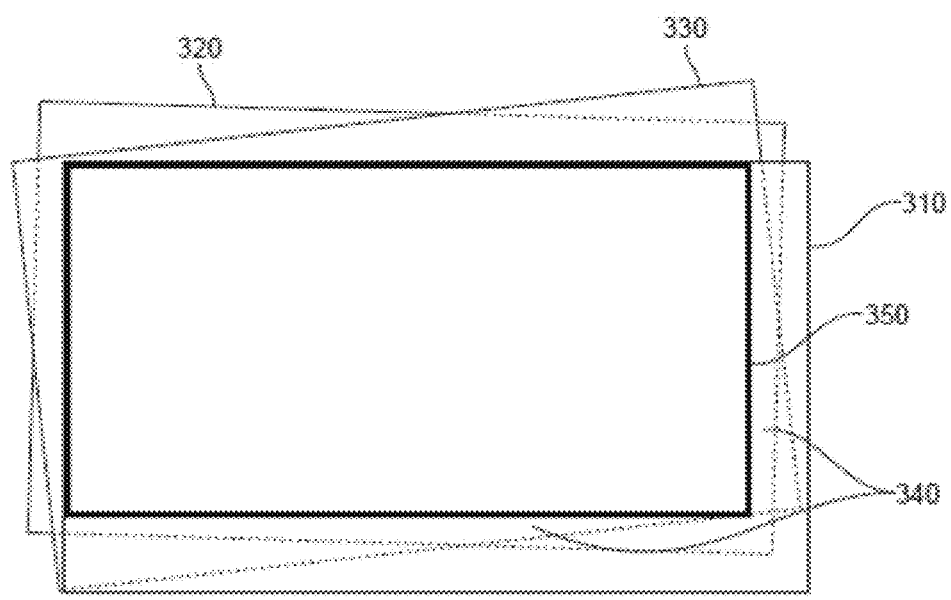
FIG. 25c is a schematic example of misalignment of color images from optical engine without optical alignment according to an embodiment of this invention.

FIG. 25c illustrates the position and orientation misalignment that results from the finite separation of the tightly spaced multi-color emitters (lasers or SLEDs). Taking the green image 310 as the reference, the red image 320 and blue image 330 are displaced and rotated with respect to the green image.

Figure 25D:
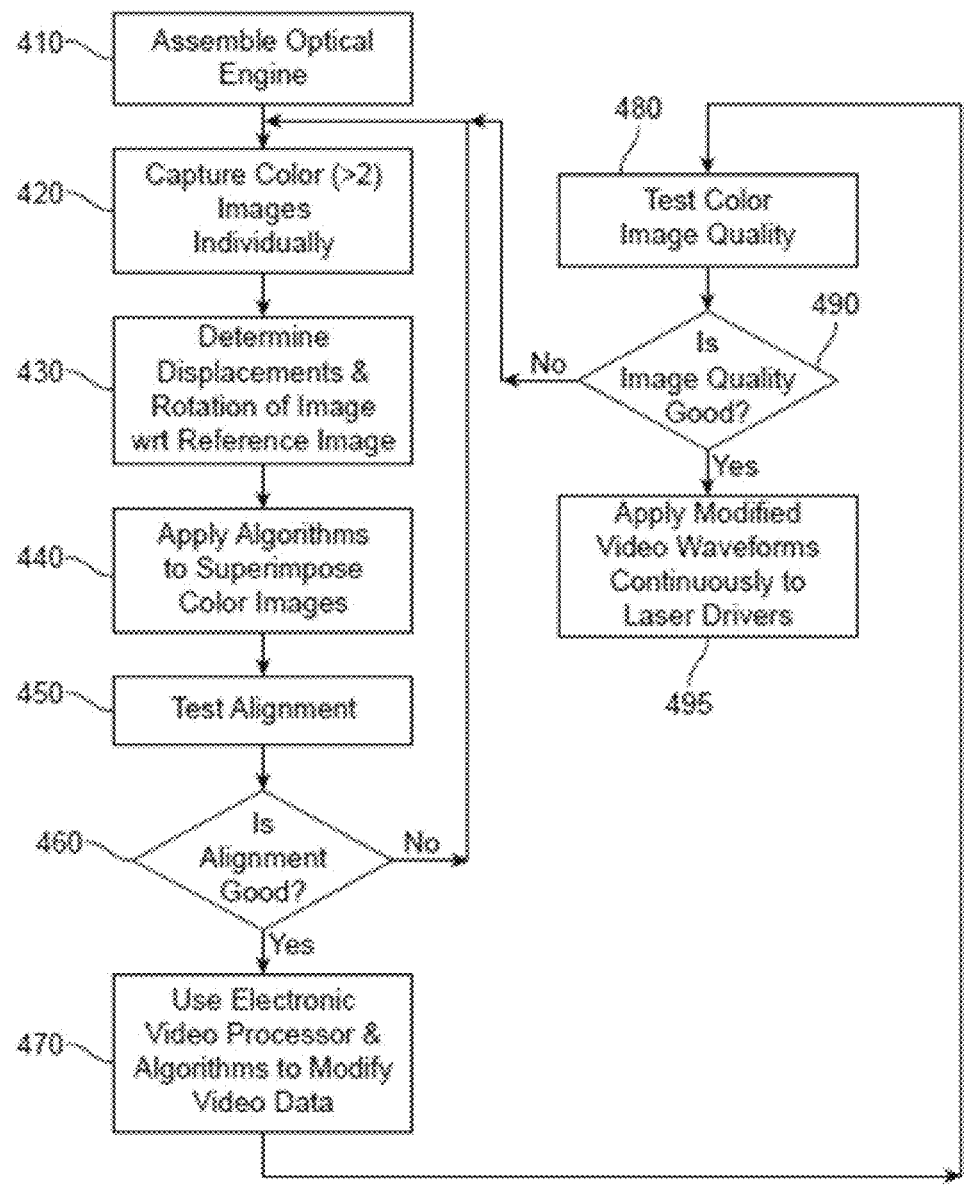
FIG. 25d is a flow flowchart description of the method for image correction to compensate spatially offset emitters according to an embodiment of this invention.
Figure 25E:
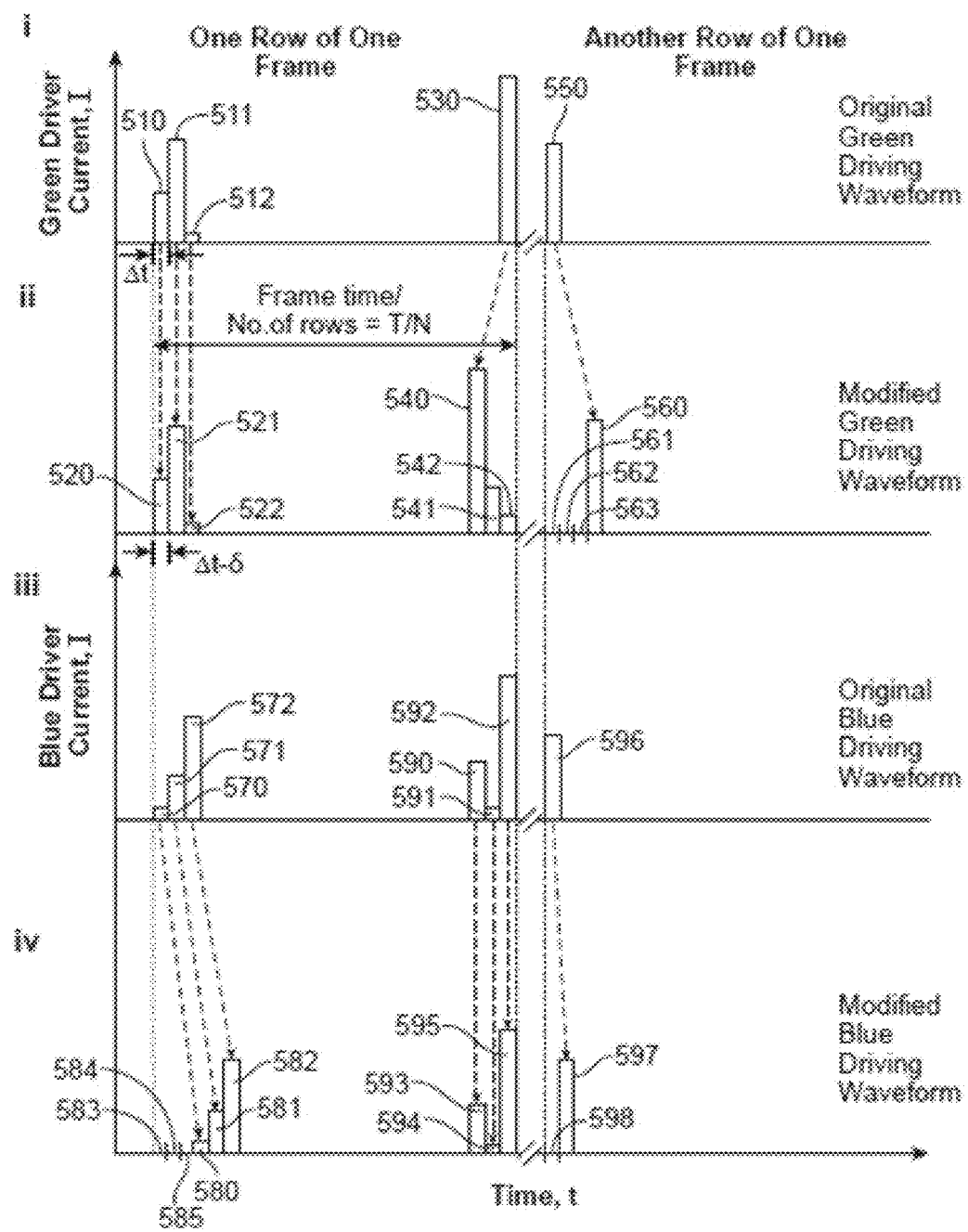
FIG. 25e is a schematic diagram addressing waveform corrections according to an embodiment of this invention.

FIG. 25d is a flow flowchart description of the method for image correction to compensate spatially offset emitters, and FIG. 25e is a schematic diagram addressing waveform corrections.

Figure 25F:
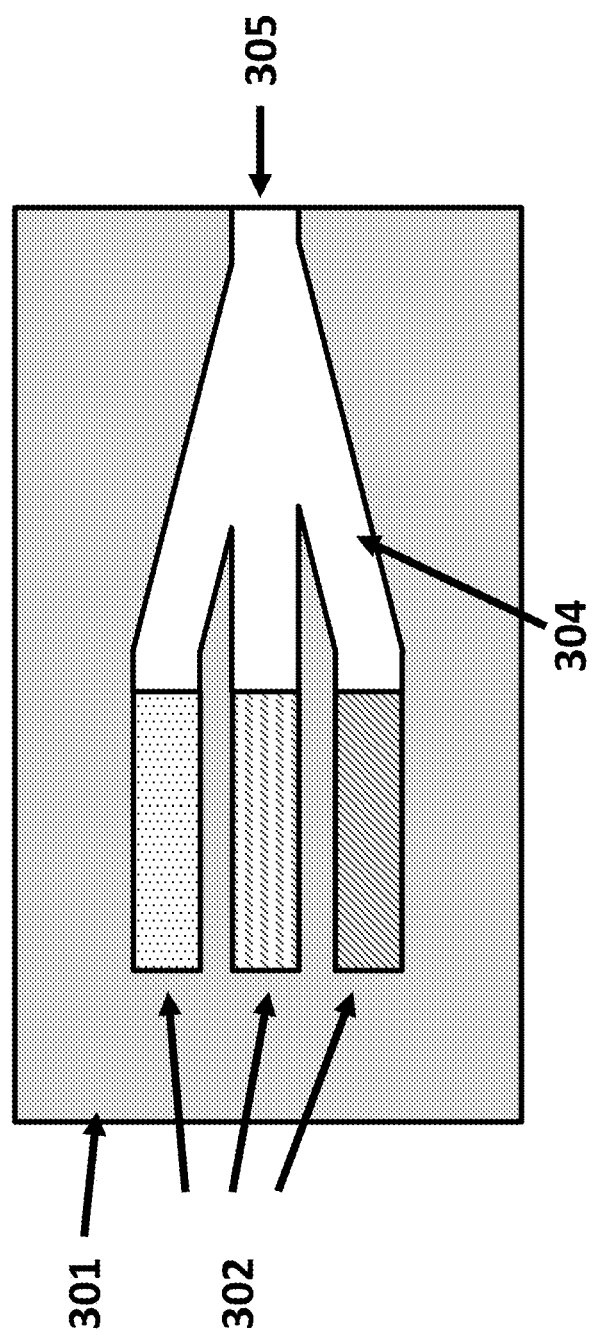
FIG. 25f presents a schematic representation of a RGB laser chip utilizing a dielectric waveguide patterned on the carrier wafer to combine individual laser beams according an embodiment of the present invention.

FIG. 25f presents a schematic representation of a RGB laser chip utilizing a dielectric waveguide patterned on the carrier wafer to combine individual laser beams. The laser carrier chip 301 is cut from the carrier wafer. Three laser or SLED devices 302 are transferred to the laser chip. A dielectric waveguide 304 is deposited and patterned on the carrier utilizing standard lithographic processes. In this case, the emitted laser light is combined from three separate waveguides, combined into one waveguide and emitted from the dielectric waveguide end 305.

Figure 25G:
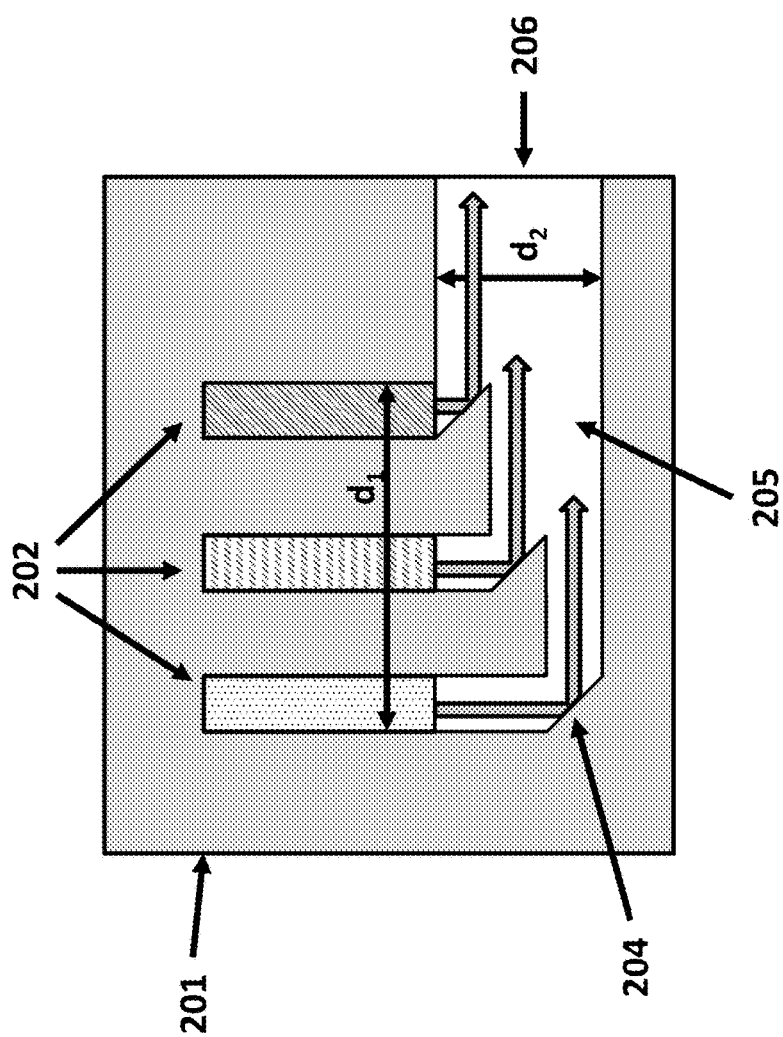
FIG. 25g presents a schematic representation of a RGB laser chip utilizing a dielectric waveguide patterned on the carrier wafer to combine individual laser beams according to an embodiment of present invention.

FIG. 25g presents a schematic representation of a RGB laser chip utilizing a dielectric waveguide patterned on the carrier wafer to combine individual laser beams. The laser carrier chip 201 is cut from the carrier wafer. Three laser or SLED devices 202 are transferred to the laser chip. A dielectric waveguide 205 is deposited and patterned on the carrier utilizing standard lithographic processes. Patterned features of the waveguide such as total-internal reflection based turning mirrors 204 can be included to turn the emitted laser light. In this case, the emitted laser light is turned at a 90 degree angle and emitted from the dielectric waveguide end 206.

Figure 26:
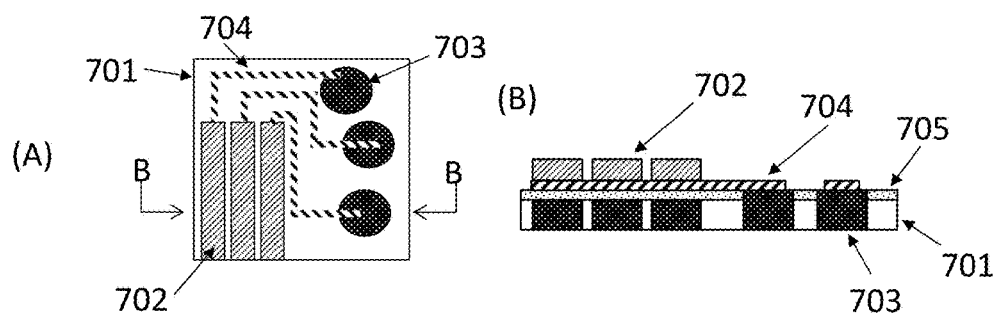
FIG. 26 shows schematic diagrams of the layout for laser or SLED chips including metallic through vias containing multiple die which will be individually addressable according to an embodiment of this invention.

FIG. 26 shows schematics of the layout of a multi-die laser chips according to an embodiment of this invention. Layout A and accompanying cross-section B show a laser chip comprised by a singulated piece of a carrier wafer 701, three laser die 702 transferred from epitaxial substrates, and metal traces and conductive through vias 703 for electrically connecting to the die. The through vias penetrate through the carrier wafer and may be covered by bond pads which are not shown. The laser die are bonded to the carrier via a common electrode 704, however the ridge side contacts to the laser devices are electrically isolated from the common electrode metal and are connected to through vias that are isolated from the common electrode. A passivation layer 705 isolates the laser die and common electrode from metal filled through vias located beneath the die which provide a region higher thermal conductivity beneath the dies to facilitate heat extraction, but which are electrically isolated from laser die. In this embodiment, the carrier wafer must be electrically insulating.

Figure 27:
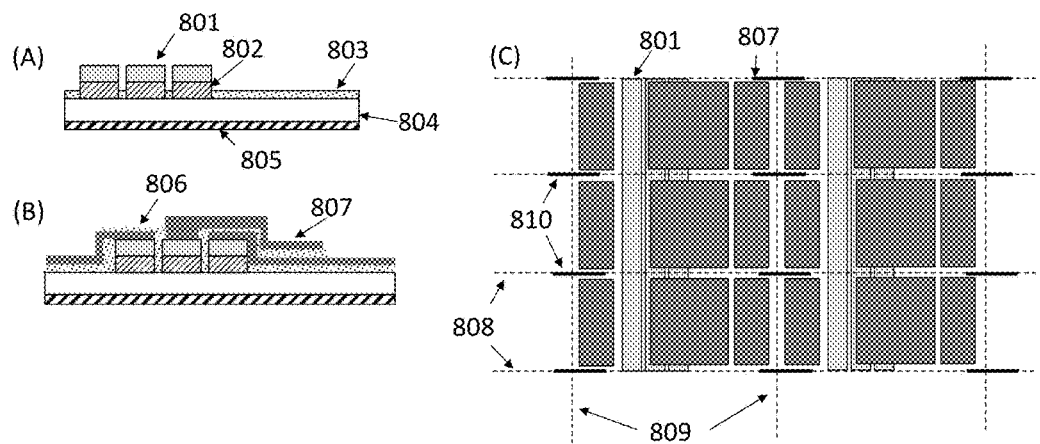
FIG. 27 shows schematic diagrams of the layout for laser or SLED chips containing multiple die which will be individually addressable according to some embodiments of this invention.

FIG. 27 shows schematics of the layout and fabrication of a multi-die laser chip according to an embodiment of this invention. Layout A shows the chip after bonding of the die, but before singulation and fabrication of the laser devices. Laser die 801 are bonded to the carrier wafer 804 via bond pads 802. The carrier wafer is electrically conductive and acts as a common electrode. A bond pad 805 is overlaid on the backside of the carrier wafer to provide a means of attaching the chip to a heat sink, submount or package, as well as to provide a means of electrically connecting to the device. A passivation layer 803 separates the carrier wafer from conductive layers 807 that make electrical contact to devices on individual laser die. A second passivation layer 806 is overlaid on the die and a conductive layer is overlaid on the second passivation layer to provide an electrically isolated electrical contact to the middle die. This arrangement allows bond pads to be formed which connect to the entire length of the laser ridge while being wide enough to be accessible with wire bonds. Plan view C shows part of the array of these devices fabricated on a carrier wafer. Lines 808 and 809 show the locations of cleaves used to singulate the carrier wafer into individual laser chips as well as form the front and back facets of the laser devices. Laser skip scribes 810 are used to provide guides for the cleaves. This configuration would require a single crystal carrier wafer in order to guide the cleave.

Figure 27A:
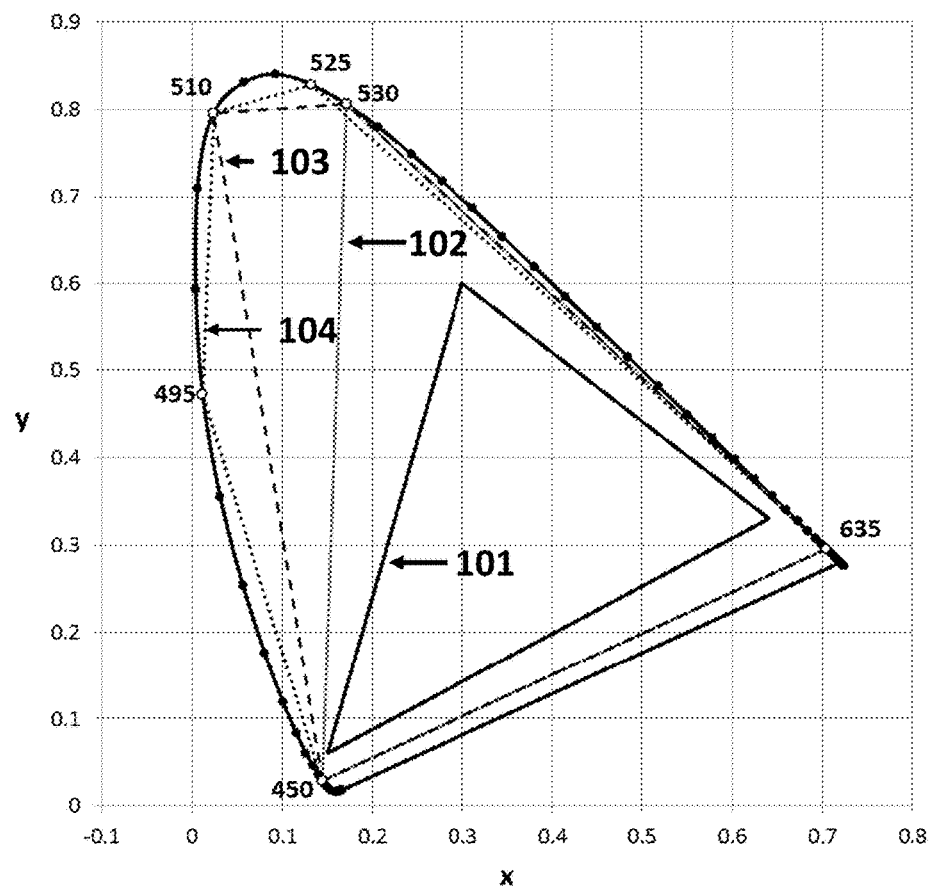
FIG. 27a shows a representation of the CIE color gamut in the x and y coordinates according to an embodiment of present invention.

FIG. 27a shows a representation of the CIE color gamut in the x and y coordinates. The commonly used RGB color space is indicated by the region 101. A three-emitter laser-based RGB device is shown by 102, with lasers emitting at 635, 530 and 450 nm. A four-emitter laser-based device is shown by 103, with lasers emitting at 635, 530, 510 and 450 nm. A five-emitter laser-based device is shown by 104, with lasers emitting at 635, 525, 510, 495 and 450 nm.

Figure 28:
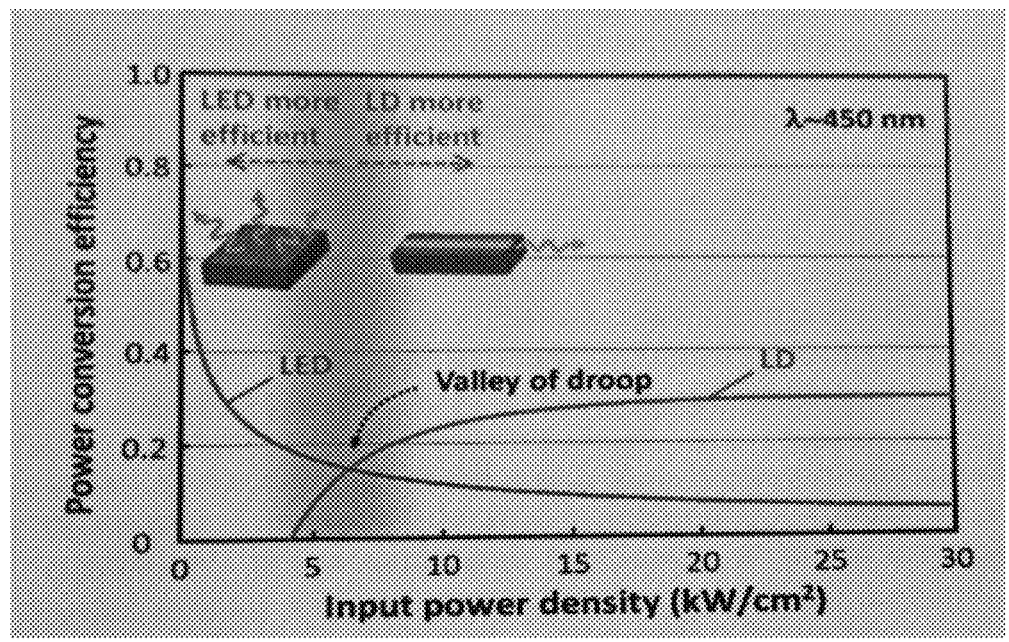
FIG. 28 schematically depicts the energy conversion efficiency vs input power density for GaN-based Light Emitting Diodes (LEDs) and Laser Diodes (LD) in an example.

FIG. 28 schematically depicts the energy conversion efficiency vs input power density for GaN-based Light Emitting Diodes (LEDs) and Laser Diodes (LD) in an example. The typical operation regime for laser diodes is much higher than for LEDs, indicating that the output power density for laser diodes can be much higher than for LEDs. Note that this figure was taken from reference 2.

Figure 29:
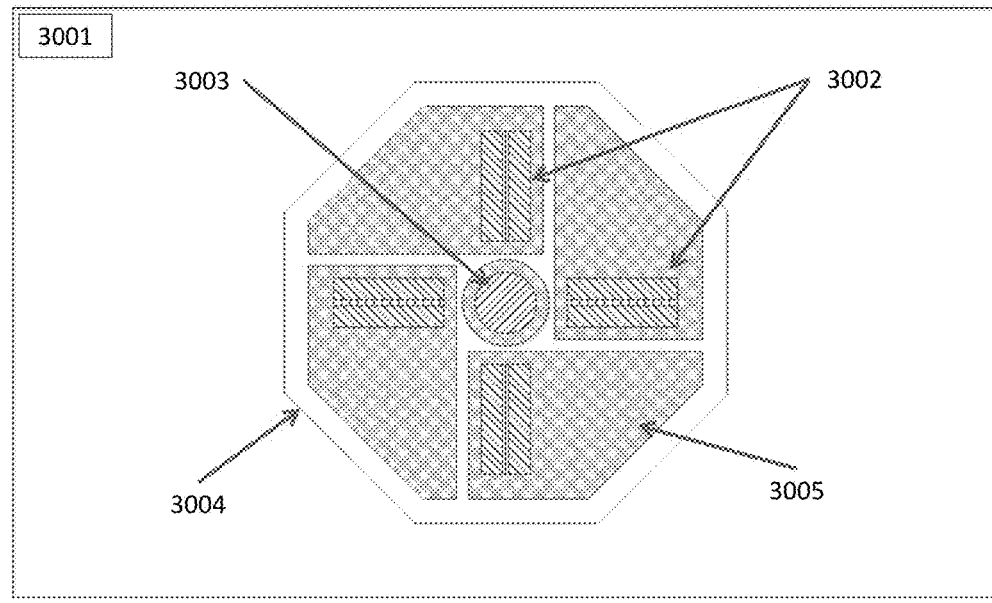
FIG. 29 schematically depicts an example of the present invention.

FIG. 29 schematically depicts an example of the present invention. An integrated, low-cost laser-based light module (3001) is composed of one or more blue laser diodes (3002) and a wavelength conversion element (3003), attached to a common substrate (3004). Metallic traces (3005) enable electrical interconnections and thermal connection to the common substrate.

Figure 30:
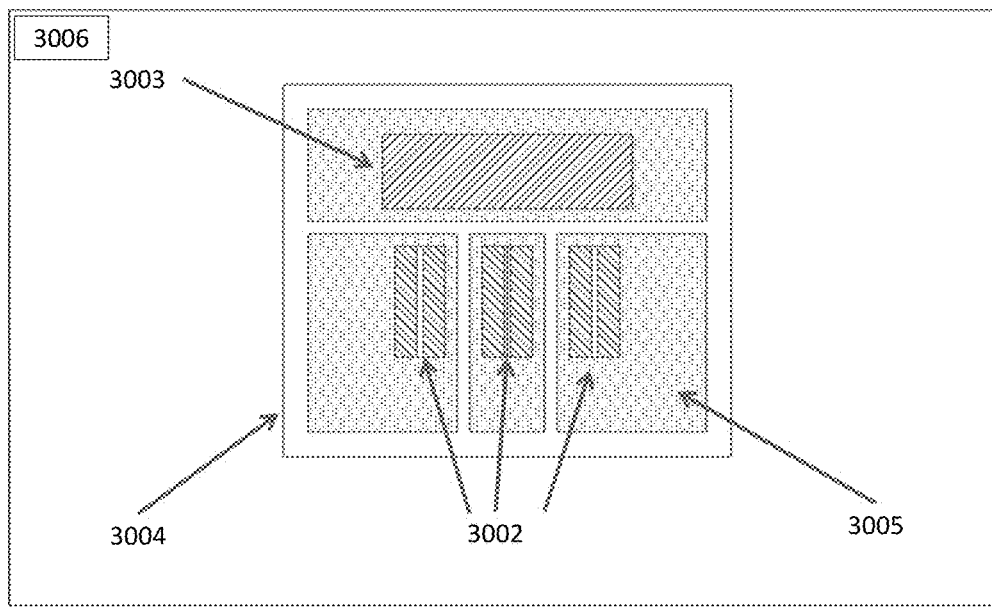
FIG. 30 schematically depicts an alternative example of the present invention.

FIG. 30 schematically depicts an alternative example of the present invention. An integrated, low-cost laser-based light module (3006) is composed of one or more blue laser diodes (3002) and a wavelength conversion element (3003), attached to a common substrate (3004). Metallic traces (3005) enable electrical interconnections and thermal connection to the common substrate.

Figure 31:
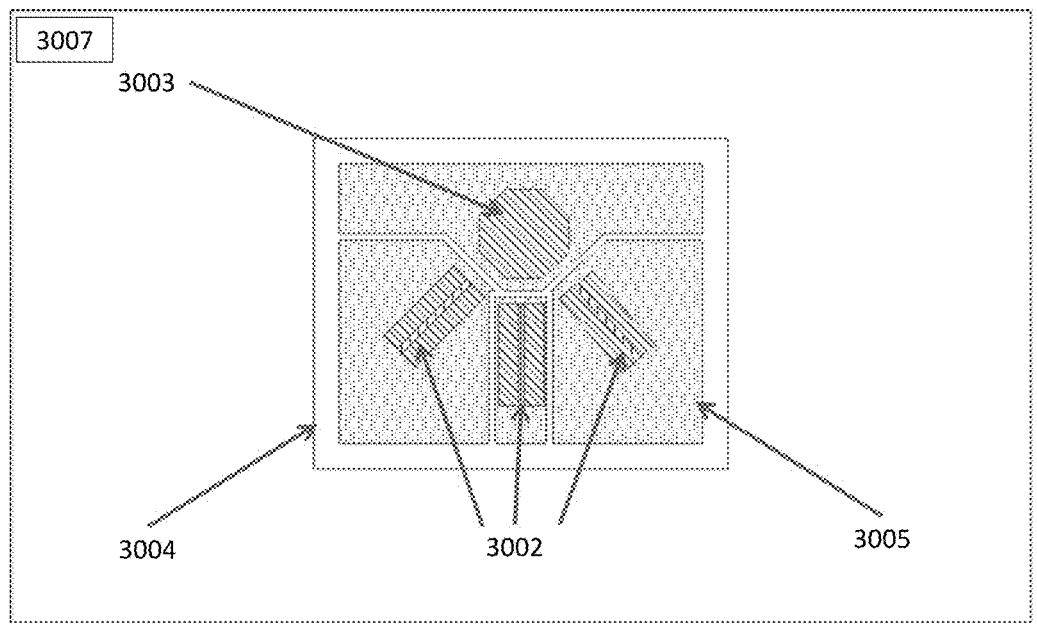
FIG. 31 schematically depicts an alternative example of the present invention.

FIG. 31 schematically depicts an alternative example of the present invention. An integrated, low-cost laser-based light module (3007) is composed of one or more blue laser diodes (3002) and a wavelength conversion element (3003), attached to a common substrate (3004). Metallic traces (3005) enable electrical interconnections and thermal connection to the common substrate.

Figure 32:
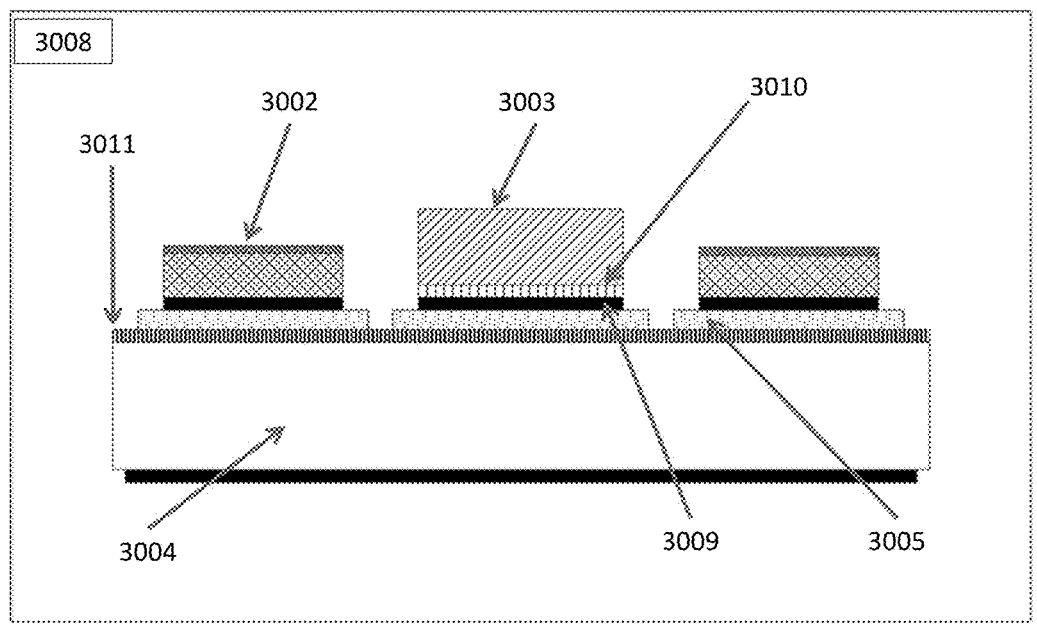
FIG. 32 is a schematic cross-sectional view of the integrated, low-cost laser-based or SLED-based light module in an example.

FIG. 32 is a schematic cross-sectional view of the integrated, low-cost laser-based light module (3001) in an example. One or more blue laser diodes (3002) and a wavelength conversion element (3003), attached to a common substrate (3004). Metallic traces (3005) enable electrical interconnections. Thermally and electrically conducting attach materials (3009) are used to attach both the laser diodes and the wavelength conversion element to the common substrate (3004). An optional reflective element (3010) may be inserted between the wavelength conversion element and the attach material. An optional electrically insulating layer (3011) may be applied to the common substrate if the common substrate is electrically conductive.

Figure 33:
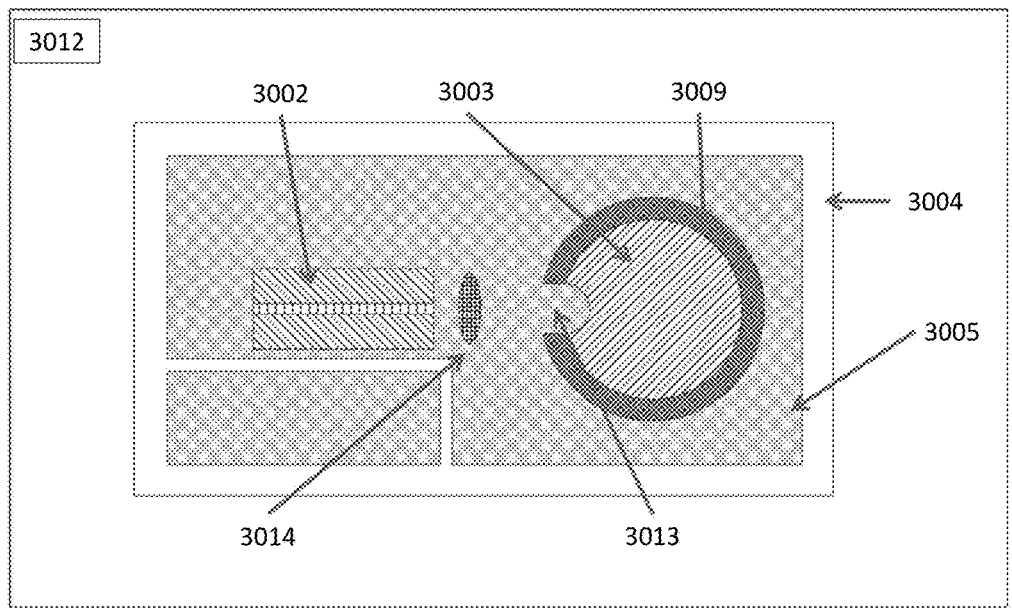
FIG. 33 schematically depicts an example where the light from the one or more blue laser.

FIG. 33 schematically depicts an example where the light from the one or more blue laser diodes (3002) are coupled into the wavelength conversion element (3003) through an geometric feature (3013). An optional optical element (3014) may be utilized to improve the coupling efficiency. An optional optically reflecting element (3009) may be attached to the sides of the wavelength conversion element, with a concomitant geometric feature aligned to the feature (3013).

Figure 34:
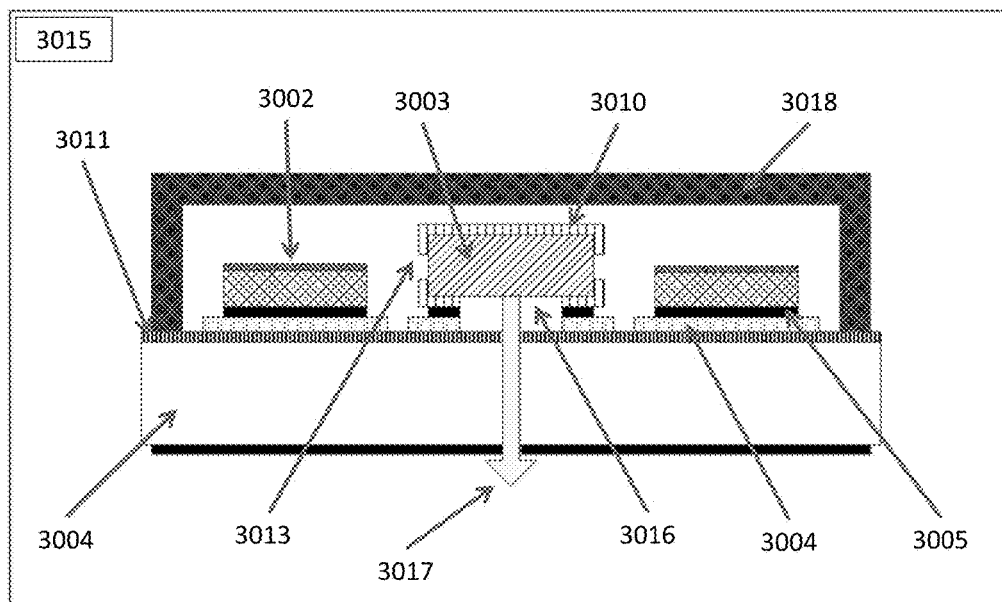
FIG. 34 schematically depicts an alternative of the integrated, low-cost laser-based or SLED-based light module in an alternative example of the present invention.

FIG. 34 schematically depicts an alternative example of the integrated, low-cost laser-based light module (3015), where the common substrate (3004) is optically transparent. The light from the one or more blue laser diodes (3002) are coupled into the wavelength conversion element (3003) through apertures (3013) in an optional reflective element (3010) which covers the majority of the exposed surfaces of the wavelength conversion element. An optical exit aperture (3016) allows light to be emitted downward through the transparent common substrate, as depicted by the arrow (3017).

Figure 35:
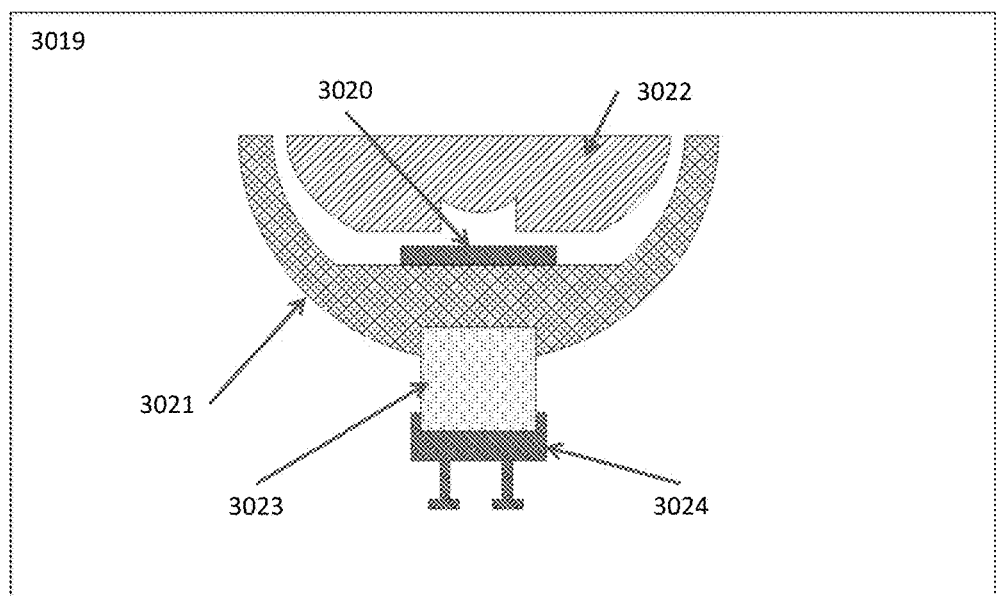
FIG. 35 schematically depicts an integrated lighting apparatus in an example of the present invention.

FIG. 35 schematically depicts an integrated lighting apparatus (3019) which includes one or more integrated low-cost, laser-based light sources (3020), a heat sink (3021), and an optional optical element for shaping or modifying the spectral content of the exiting beam (3022), and an optional integrated electronic power supply (3023) and an optional electronic connection element (3024) in an example.

As further background for the reader, gallium nitride and related crystals are difficult to produce in bulk form. Growth technologies capable of producing large area boules of GaN are still in their infancy, and costs for all orientations are significantly more expensive than similar wafer sizes of other semiconductor substrates such as Si, GaAs, and InP. While large area, free-standing GaN substrates (e.g. with diameters of two inches or greater) are available commercially, the availability of large area non-polar and semi-polar GaN substrates is quite restricted. Typically, these orientations are produced by the growth of a c-plane oriented bool, which is then sliced into rectangular wafers at some steep angle relative to the c-plane. The width of these wafers is limited by the thickness of the c-plane oriented boule, which in turn is restricted by the method of boule production (e.g. typically hydride vapor phase epitaxy (HVPE) on a foreign substrate). Such small wafer sizes are limiting in several respects. The first is that epitaxial growth must be carried out on such a small wafer, which increases the area fraction of the wafer that is unusable due to non-uniformity in growth near the wafer edge. The second is that after epitaxial growth of optoelectronic device layers on a substrate, the same number of processing steps are required on the small wafers to fabricate the final device as one would use on a large area wafer. Both of these effects drive up the cost of manufacturing devices on such small wafers, as both the cost per device fabricated and the fraction of wafer area that is unusable increases with decreasing wafer size. The relative immaturity of bulk GaN growth techniques additionally limits the total number of substrates which can be produced, potentially limiting the feasibility scaling up a non-polar or semi-polar GaN substrate based device.

Given the high cost of all orientations of GaN substrates, the difficulty in scaling up wafer size, the inefficiencies inherent in the processing of small wafers, and potential supply limitations on semi-polar and nonpolar wafers, it becomes extremely desirable to maximize utilization of substrates and epitaxial material. In the fabrication of lateral cavity laser diodes, it is typically the case that minimum die length is determined by the laser cavity length, but the minimum die width is determined by other device components such as wire bonding pads or considerations such as mechanical area for die handling in die attach processes. That is, while the laser cavity length limits the laser die length, the laser die width is typically much larger than the laser cavity width. Since the GaN substrate and epitaxial material are only critical in and near the laser cavity region this presents a great opportunity to invent novel methods to form only the laser cavity region out of these relatively expensive materials and form the bond pad and mechanical structure of the chip from a lower cost material. Typical dimensions for laser cavity widths are about 1-30 µm, while wire bonding pads are ~100 µm wide. This means that if the wire bonding pad width restriction and mechanical handling considerations were eliminated from the GaN chip dimension between >3 and 100 times more laser diode die could be fabricated from a single epitaxial wafer. This translates to a >3 to 100 times reduction in epitaxy and substrate costs. In conventional device designs, the relatively large bonding pads are mechanically supported by the epitaxy wafer, although they make no use of the material properties of the semiconductor beyond structural support.

In an example, the present invention is a method of transferring the semiconductor material comprising a laser diode from the substrate on which it was epitaxially grown to a second substrate, i.e. a carrier wafer. This method allows for one or more AlInGaN or AlInGaP laser devices to be transferred to a carrier wafer. The transfer of the laser devices from their original substrates to a carrier wafer offers several advantages. The first is maximizing the number of GaN laser devices which can be fabricated from a given epitaxial area on a gallium and nitrogen containing substrate by spreading out the epitaxial material on a carrier wafer such that the wire bonding pads or other structural elements are mechanically supported by relatively inexpensive carrier wafer, while the light emitting regions remain fabricated from the necessary epitaxial material. This will drastically reduce the chip cost in all gallium and nitrogen based laser diodes, and in particular could enable cost efficient nonpolar and semipolar laser diode technology.

Another advantage is integration of multiple aspects of the optoelectronic device normally provided by components other than the laser diodes into the carrier wafer. For example, the carrier wafer material could be chosen such that it could serve as both a mechanical carrier for laser device material as well as a submount providing a thermally conductive but electrically isolating connection to the laser device package and heat sink. This is a key advantage, in that the resulting part, after singulation of individual chips from the carrier wafer, is a fully functional laser light emitting device. Typically submounts are patterned with a solder pad that connects to a wire bond pad. In this sense, the laser die on submount is a simple laser package that provides mechanical support and electrical access to the laser device and can be considered the fundamental building block of any laser based light source. By combining the functions of the carrier wafer and the submount this invention avoids relatively expensive pick-and-place and assembly steps as well as the cost of a separate submount.

Another advantage is in enabling most of the device fabrication steps to be carried out on die transferred to a carrier wafer. Because the carrier wafer size is arbitrary it is possible to choose carrier sizes large enough to allow bonding die from multiple substrates to the same carrier wafer such that the cost of each processing step during fabrication of the laser devices is shared among vastly more devices, thereby reducing fabrication costs considerably. Moreover, encapsulation steps can be carried out directly on the carrier wafer, allowing for the fabrication of environmentally sealed laser chips using parallel processing methods. The resulting device, either encapsulated or not, would be a laser device in a true chip-scale package.

Another advantage is that this invention transfers the epitaxial material comprising the laser device from the substrate without destroying the substrate, thereby allowing the substrate to be reclaimed and reused for the growth of more devices. In the case when the substrate can be reclaimed many times, the effective substrate cost quickly approaches the cost of reclaim rather than the cost of the original substrate. For devices such as GaN laser diodes, where substrates are both small and expensive relative to more mature compound semiconductor materials, these advantages can lead to dramatic reductions in the cost of fabricating a laser device.

In brief, embodiments of the invention involve an optoelectronic device wafer composed of device layers overlying the surface region of a substrate wafer. The substrate material can be GaN, sapphire, SiC, Si, and GaAs, but can be others. The optoelectronic device layers are separated from the substrate by one or more layers designed to be selectively removable either by dry etching, wet etching or decomposition due to laser irradiation. A bonding material is deposited on the surface of the optoelectronic device layers. A bonding material is also deposited either as a blanket coating or patterned on a carrier wafer. Standard lithographic processes are used to mask the device wafer which is then etched with either dry or wet etch processes to open vias that expose the sacrificial layer. A selective etch process is used to remove the sacrificial layer while leaving the optoelectronic device layers intact. In the case where the selective removal process is a wet etch, a protective passivation layer can be employed to prevent the device layers from being exposed to the etch when the etch selectivity is not perfect. The selective removal undercuts the device layers.

In an embodiment, the device layers comprise a superluminescent light emitting diode or SLED. A SLED is in many ways similar to an edge emitting laser diode; however the emitting facet of the device is designed so as to have a very low reflectivity. A SLED is similar to a laser diode as it is based on an electrically driven junction that when injected with current becomes optically active and generates amplified spontaneous emission (ASE) and gain over a wide range of wavelengths. When the optical output becomes dominated by ASE there is a knee in the light output versus current (LI) characteristic wherein the unit of light output becomes drastically larger per unit of injected current. This knee in the LI curve resembles the threshold of a laser diode, but is much softer. A SLED would have a layer structure engineered to have a light emitting layer or layers clad above and below with material of lower optical index such that a laterally guided optical mode can be formed. The SLED would also be fabricated with features providing lateral optical confinement. These lateral confinement features may consist of an etched ridge, with air, vacuum, metal or dielectric material surrounding the ridge and providing a low optical-index cladding. The lateral confinement feature may also be provided by shaping one or more of the electrical contacts such that injected current is confined to a finite region in the device. In such a "gain guided" structure, dispersion in the optical index of the light emitting layer with injected carrier density provides the optical-index contrast needed to provide lateral confinement of the optical mode. The emission spectral width is typically substantially wider (>5 nm) than that of a laser diode and offer advantages with respect to reduced image distortion in displays, increased eye safety, and enhanced capability in measurement and spectroscopy applications.

SLEDs are designed to have high single pass gain or amplification for the spontaneous emission generated along the waveguide. The SLED device would also be engineered to have a low internal loss, preferably below 1 cm-1, however SLEDs can operate with internal losses higher than this. In the ideal case, the emitting facet reflectivity would be zero, however in practical applications a reflectivity of zero is difficult to achieve and the emitting facet reflectivity is designs to be less than 1%, less than 0.1%, less than 0.001%, or less than 0.0001% reflectivity. Reducing the emitting facet reflectivity reduces feedback into the device cavity, thereby increasing the injected current density at which the device will begin to lase. Very low reflectivity emitting facets can be achieved by a combination of addition of anti-reflection coatings and by angling the emitting facet relative to the SLED cavity such that the surface normal of the facet and the propagation direction of the guided modes are substantially non-parallel. In general, this would mean a deviation of more than 1-2 degrees. In practice, the ideal angle depends in part on the anti-reflection coating used and the tilt angle must be carefully designed around a null in the reflectivity versus angle relationship for optimum performance. Tilting of the facet with respect to the propagation direction of the guided modes can be done in any direction relative to the direction of propagation of the guided modes, though some directions may be easier to fabricate depending on the method of facet formation. Etched facets provide high flexibility for facet angle determination. Alternatively, a very common method to achieve an angled output for reduced constructive interference in the cavity would to curve and/or angle the waveguide with respect to a cleaved facet that forms on a pre-determined crystallographic plane in the semiconductor chip. In this configuration the angle of light propagation is off-normal at a specified angle designed for low reflectivity to the cleaved facet. A low reflectivity facet may also be formed by roughening the emitting facet in such a way that light extraction is enhanced and coupling of reflected light back into the guided modes is limited. SLEDs are applicable to all embodiments according to the present invention and the device can be used interchangeably with laser diode device when applicable.

Special features of the mask may be used which attach to the undercut device layers, but which are too large to themselves be undercut, or which due to the design of the mask contain regions where the sacrificial layers are not removed or these features may be composed of metals or dielectrics that are resistant to the etch. These features act as anchors, preventing the undercut device layers from detaching from the substrate. This partial attachment to the substrate can also be achieved by incompletely removing the sacrificial layer, such that there is a tenuous connection between the undercut device layers and the substrate which can be broken during bonding. The surfaces of the bonding material on the carrier wafer and the device wafer are then brought into contact and a bond is formed which is stronger than the attachment of the undercut device layers to the anchors or remaining material of the sacrificial layers. After bonding, the separation of the carrier and device wafers transfers the device layers to the carrier wafer.

This invention enables fabrication of laser or SLED die at very high density on a substrate. This high density being greater than what is practical for a laser device built using current fabrication processes. Laser die are transferred to a carrier wafer at a larger pitch (e.g. lower density) than they are found on the substrate. The carrier wafer can be made from a less expensive material, or one with material properties that enable using the carrier as a submount or the carrier wafer can be an engineered wafer including passivation layers and electrical elements fabricated with standard lithographic processes. Once transferred, the die can be processed into laser devices using standard lithographic processes. The carrier wafer diameter can be chosen such that laser die from multiple gallium and nitrogen containing substrates can be transferred to a single carrier and processed into laser devices in parallel using standard lithographic processes.

With respect to AlInGaN laser devices, these devices include a gallium and nitrogen containing substrate (e.g., GaN) comprising a surface region oriented in either a semipolar [(11-21), (20-21), (20-2-1), among others] or non-polar [(10-10) or (11-20)] configuration, but can be others. The device also has a gallium and nitrogen containing material comprising InGaN overlying the surface region. In a specific embodiment, the present laser device can be employed in either a semipolar or non-polar gallium containing substrate, as described below. As used herein, the term "substrate" can mean the bulk substrate or can include overlying growth structures such as a gallium and nitrogen containing epitaxial region, or functional regions such as n-type GaN, combinations, and the like. We have also explored epitaxial growth and cleave properties on semipolar crystal planes oriented between the nonpolar m-plane and the polar c-plane. In particular, we have grown on the {30-31} and {20-21} families of crystal planes. We have achieved promising epitaxy structures and cleaves that will create a path to efficient laser diodes operating at wavelengths from about 400 nm in the violet wavelength range of 400 nm to 425 nm, to blue, e.g., 425 nm to 465 nm, to cyan, e.g., 465 nm to 500 nm, to green, e.g., 500 nm to 540 nm. These results include bright blue epitaxy in the 450 nm range, bright green epitaxy in the 520 nm range, and smooth cleave planes orthogonal to the projection of the c-direction.

In a specific embodiment, the gallium nitride substrate member is a bulk GaN substrate characterized by having a semipolar or non-polar crystalline surface region, but can be others. In a specific embodiment, the bulk nitride GaN substrate comprises nitrogen and has a surface dislocation density between about $10E5$ $cm^{-2}$ and about $10E7$ $cm^{-2}$ or below $10E5$ $cm^{-2}$. The nitride crystal or wafer may comprise $Al_xIn_yGa_{1-x-y}N$, where $0 \leq x$, y, $x+y \leq 1$. In one specific embodiment, the nitride crystal comprises GaN. In one or more embodiments, the GaN substrate has threading dislocations, at a concentration between about $10E5$ $cm^{-2}$ and about $10E8$ $cm^{-2}$, in a direction that is substantially orthogonal or oblique with respect to the surface. As a consequence of the orthogonal or oblique orientation of the dislocations, the surface dislocation density is between about $10E5$ $cm^{-2}$ and about $10E7$ $cm^{-2}$ or below about $10E5$ $cm^{-2}$. In a specific embodiment, the device can be fabricated on a slightly off-cut semipolar substrate as described in U.S. Ser. No. 12/749,466 filed Mar. 29, 2010, which claims priority to U.S. Provisional No. 61/164,409 filed Mar. 28, 2009, which are commonly assigned and hereby incorporated by reference herein.

The substrate typically is provided with one or more of the following epitaxially grown elements, but is not limiting:
an n-GaN cladding region with a thickness of about 50 nm to about 6000 nm with a Si or oxygen doping level of about $5E16$ $cm^{-3}$ to about $1E19$ $cm^{-3}$
an InGaN region of a high indium content and/or thick InGaN layer(s) or Super SCH region;
a higher bandgap strain control region overlying the InGaN region;
optionally, an SCH region overlying the InGaN region;
multiple quantum well active region layers comprised of three to five or four to six about 3.0-5.5.0 nm InGaN quantum wells separated by about 1.5-10.0 nm GaN barriers
optionally, a p-side SCH layer comprised of InGaN with molar a fraction of indium of between about 1% and about 10% and a thickness from about 15 nm to about 100 nm
an electron blocking layer comprised of AlGaN with molar fraction of aluminum of between about 5% and about 20% and thickness from about 10 nm to about 15 nm and doped with Mg.
a p-GaN cladding layer with a thickness from about 400 nm to about 1000 nm with Mg doping level of about $5E17$ $cm^{-3}$ to about $1E19$ $cm^{-3}$
a p++-GaN contact layer with a thickness from about 20 nm to about 40 nm with Mg doping level of about $1E20$ $cm^{-3}$ to about $1E21$ $cm^{-3}$ Typically each of these regions is formed using at least an epitaxial deposition technique of metal organic chemical vapor deposition (MOCVD), molecular beam epitaxy (MBE), or other epitaxial growth techniques suitable for GaN growth. The active region can include one to about twenty quantum well regions according to one or more embodiments. As an example following deposition of the n-type $Al_uIn_vGa_{1-u-v}N$ layer for a predetermined period of time, so as to achieve a predetermined thickness, an active layer is deposited. The active layer may comprise a single quantum well or a multiple quantum well, with about 2-10 quantum wells. The quantum wells may comprise InGaN wells and GaN barrier layers. In other embodiments, the well layers and barrier layers comprise $Al_wIn_xGa_{1-w-x}N$ and $Al_yIn_zGa_{1-y-z}N$, respectively, where $0 \leq w$, x, y, z, $w+x$, $y+z \leq 1$, where $w<u$, y and/or $x>v$, z so that the bandgap of the well layer(s) is less than that of the barrier layer(s) and the n-type layer. The well layers and barrier layers may each have a thickness between about 1 nm and about 15 nm. In another embodiment, the active layer comprises a double heterostructure, with an InGaN or AlwInxGa1-w-xN layer about 10 nm to about 100 nm thick surrounded by GaN or $Al_yIn_zGa_{1-y-z}N$ layers, where $w<u$, y and/or $x>v$, z. The composition and structure of the active layer are chosen to provide light emission at a preselected wavelength. The active layer may be left undoped (or unintentionally doped) or may be doped n-type or p-type.

The active region can also include an electron blocking region, and a separate confinement heterostructure. In some embodiments, an electron blocking layer is preferably deposited. The electron-blocking layer may comprise $Al_sIn_tGa_{1-s-t}N$, where $0 \leq s$, t, $s+t \leq 1$, with a higher bandgap than the active layer, and may be doped p-type or the electron blocking layer comprises an AlGaN/GaN superlattice structure, comprising alternating layers of AlGaN and GaN. Alternatively, there may be no electron blocking layer. As noted, the p-type gallium nitride structure, is deposited above the electron blocking layer and active layer(s). The p-type layer may be doped with Mg, to a level between about 10E16 cm-3 and about 10E22 cm-3, and may have a thickness between about 5 nm and about 1000 nm. The outermost 1-50 nm of the p-type layer may be doped more heavily than the rest of the layer, so as to enable an improved electrical contact.

FIG. 4 is a simplified schematic cross-sectional diagram illustrating a state of the art GaN laser diode structure. This diagram is merely an example, which should not unduly limit the scope of the claims herein. One of ordinary skill in the art would recognize other variations, modifications, and alternatives in light of the present disclosure. As shown, the laser device includes gallium nitride substrate 203, which has an underlying n-type metal back contact region 201. In an embodiment, the metal back contact region is made of a suitable material such as those noted below and others. Further details of the contact region can be found throughout the present specification and more particularly below.

In an embodiment, the device also has an overlying n-type gallium nitride layer 205, an active region 207, and an overlying p-type gallium nitride layer structured as a laser stripe region 211. Additionally, the device also includes an n-side separate confinement heterostructure (SCH) 206, p-side guiding layer or SCH 208, p-AlGaN EBL 209, among other features. In an embodiment, the device also has a p++ type gallium nitride material 213 to form a contact region. In an embodiment, the p++ type contact region has a suitable thickness and may range from about 10 nm to about 50 nm, or other thicknesses. In an embodiment, the doping level can be higher than the p-type cladding region and/or bulk region. In an embodiment, the p++ type region has doping concentration ranging from about $10^{19}$ to $10^{21}$ Mg/cm$^3$, and others. The p++ type region preferably causes tunneling between the semiconductor region and overlying metal contact region. In an embodiment, each of these regions is formed using at least an epitaxial deposition technique of metal organic chemical vapor deposition (MOCVD), molecular beam epitaxy (MBE), or other epitaxial growth techniques suitable for GaN growth. In an embodiment, the epitaxial layer is a high quality epitaxial layer overlying the n-type gallium nitride layer. In some embodiments the high quality layer is doped, for example, with Si or O to form n-type material, with a dopant concentration between about $10^{16}$ cm$^{-3}$ and about $10^{20}$ cm$^{-3}$.

The device has a laser stripe region formed overlying a portion of the off-cut crystalline orientation surface region. As example, FIG. 3 is a is a simplified schematic diagram of semipolar laser diode with the cavity aligned in the projection of c-direction with cleaved or etched mirrors. The laser stripe region is characterized by a cavity orientation substantially in a projection of a c-direction, which is substantially normal to an a-direction. The laser strip region has a first end 107 and a second end 109 and is formed on a projection of a c-direction on a {20-21} gallium and nitrogen containing substrate having a pair of cleaved mirror structures, which face each other. The first cleaved facet comprises a reflective coating and the second cleaved facet comprises no coating, an antireflective coating, or exposes gallium and nitrogen containing material. The first cleaved facet is substantially parallel with the second cleaved facet. The first and second cleaved facets are provided by a scribing and breaking process according to an embodiment or alternatively by etching techniques using etching technologies such as reactive ion etching (ME), inductively coupled plasma etching (ICP), or chemical assisted ion beam etching (CAIBE), or other method. The first and second mirror surfaces each comprise a reflective coating. The coating is selected from silicon dioxide, hafnia, and titania, tantalum pentoxide, zirconia, including combinations, and the like. Depending upon the design, the mirror surfaces can also comprise an anti-reflective coating.

In a specific embodiment, the method of facet formation includes subjecting the substrates to a laser for pattern formation. In a preferred embodiment, the pattern is configured for the formation of a pair of facets for one or more ridge lasers. In a preferred embodiment, the pair of facets face each other and are in parallel alignment with each other. In a preferred embodiment, the method uses a UV (355 nm) laser to scribe the laser bars. In a specific embodiment, the laser is configured on a system, which allows for accurate scribe lines configured in one or more different patterns and profiles. In one or more embodiments, the laser scribing can be performed on the back-side, front-side, or both depending upon the application. Of course, there can be other variations, modifications, and alternatives.

In a specific embodiment, the method uses backside laser scribing or the like. With backside laser scribing, the method preferably forms a continuous line laser scribe that is perpendicular to the laser bars on the backside of the GaN substrate. In a specific embodiment, the laser scribe is generally about 15-20 um deep or other suitable depth. Preferably, backside scribing can be advantageous. That is, the laser scribe process does not depend on the pitch of the laser bars or other like pattern. Accordingly, backside laser scribing can lead to a higher density of laser bars on each substrate according to a preferred embodiment. In a specific embodiment, backside laser scribing, however, may lead to residue from the tape on one or more of the facets. In a specific embodiment, backside laser scribe often requires that the substrates face down on the tape. With front-side laser scribing, the backside of the substrate is in contact with the tape. Of course, there can be other variations, modifications, and alternatives.

Laser scribe Pattern: The pitch of the laser mask is about 200 um, but can be others. In an embodiment the method uses a 170 um scribe with a 30 um dash for the 200 um pitch. In a preferred embodiment, the scribe length is maximized or increased while maintaining the heat affected zone of the laser away from the laser ridge, which is sensitive to heat.

Laser scribe Profile: A saw tooth profile generally produces minimal facet roughness. It is believed that the saw tooth profile shape creates a very high stress concentration in the material, which causes the cleave to propagate much easier and/or more efficiently.

In a specific embodiment, the method of facet formation includes subjecting the substrates to mechanical scribing for pattern formation. In a preferred embodiment, the pattern is configured for the formation of a pair of facets for one or more ridge lasers. In a preferred embodiment, the pair of facets face each other and are in parallel alignment with each other. In a preferred embodiment, the method uses a diamond tipped scribe to physically scribe the laser bars, though as would be obvious to anyone learned in the art a scribe tipped with any material harder than GaN would be adequate. In a specific embodiment, the laser is configured on a system, which allows for accurate scribe lines configured in one or more different patterns and profiles. In one or more embodiments, the mechanical scribing can be performed on the back-side, front-side, or both depending upon the application. Of course, there can be other variations, modifications, and alternatives.

In a specific embodiment, the method uses backside scribing or the like. With backside mechanical scribing, the method preferably forms a continuous line scribe that is perpendicular to the laser bars on the backside of the GaN substrate. In a specific embodiment, the laser scribe is generally about 15-20 um deep or other suitable depth. Preferably, backside scribing can be advantageous. That is, the mechanical scribe process does not depend on the pitch of the laser bars or other like pattern. Accordingly, backside scribing can lead to a higher density of laser bars on each substrate according to a preferred embodiment. In a specific embodiment, backside mechanical scribing, however, may lead to residue from the tape on one or more of the facets. In a specific embodiment, backside mechanical scribe often requires that the substrates face down on the tape. With front-side mechanical scribing, the backside of the substrate is in contact with the tape. Of course, there can be other variations, modifications, and alternatives.

It is well known that etch techniques such as chemical assisted ion beam etching (CAIBE), inductively coupled plasma (ICP) etching, or reactive ion etching (RIE) can result in smooth and vertical etched sidewall regions, which could serve as facets in etched facet laser diodes. In the etched facet process a masking layer is deposited and patterned on the surface of the wafer. The etch mask layer could be comprised of dielectrics such as silicon dioxide (SiO2), silicon nitride (SixNy), a combination thereof or other dielectric materials. Further, the mask layer could be comprised of metal layers such as Ni or Cr, but could be comprised of metal combination stacks or stacks comprising metal and dielectrics. In another approach, photoresist masks can be used either alone or in combination with dielectrics and/or metals. The etch mask layer is patterned using conventional photolithography and etch steps. The alignment lithography could be performed with a contact aligner or stepper aligner. Such lithographically defined mirrors provide a high level of control to the design engineer. After patterning of the photoresist mask on top of the etch mask is complete, the patterns in then transferred to the etch mask using a wet etch or dry etch technique. Finally, the facet pattern is then etched into the wafer using a dry etching technique selected from CAIBE, ICP, RIE and/or other techniques. The etched facet surfaces must be highly vertical of between about 87 and about 93 degrees or between about 89 and about 91 degrees from the surface plane of the wafer. The etched facet surface region must be very smooth with root mean square roughness values of less than about 50 nm, 20 nm, 5 nm, or 1 nm. Lastly, the etched must be substantially free from damage, which could act as nonradiative recombination centers and hence reduce the COMD threshold. CAIBE is known to provide very smooth and low damage sidewalls due to the chemical nature of the etch, while it can provide highly vertical etches due to the ability to tilt the wafer stage to compensate for any inherent angle in etch.

The laser stripe is characterized by a length and width. The length ranges from about 50 microns to about 3000 microns, but is preferably between about 10 microns and about 400 microns, between about 400 microns and about 800 microns, or about 800 microns and about 1600 microns, but could be others. The stripe also has a width ranging from about 0.5 microns to about 50 microns, but is preferably between about 0.8 microns and about 2.5 microns for single lateral mode operation or between about 2.5 um and about 35 um for multi-lateral mode operation, but can be other dimensions. In a specific embodiment, the present device has a width ranging from about 0.5 microns to about 1.5 microns, a width ranging from about 1.5 microns to about 3.0 microns, a width ranging from about 3.0 microns to about 35 microns, and others. In a specific embodiment, the width is substantially constant in dimension, although there may be slight variations. The width and length are often formed using a masking and etching process, which are commonly used in the art.

The laser stripe is provided by an etching process selected from dry etching or wet etching. The device also has an overlying dielectric region, which exposes a p-type or n-type contact region. Overlying the contact region is a contact material, which may be metal or a conductive oxide or a combination thereof. The p-type or n-type electrical contact may be deposited by thermal evaporation, electron beam evaporation, electroplating, sputtering, or another suitable technique. Overlying the polished region of the substrate is a second contact material, which may be metal or a conductive oxide or a combination thereof and which comprises the n-type electrical contact. The n-type electrical contact may be deposited by thermal evaporation, electron beam evaporation, electroplating, sputtering, or another suitable technique.

Given the high gallium and nitrogen containing substrate costs, difficulty in scaling up gallium and nitrogen containing substrate size, the inefficiencies inherent in the processing of small wafers, and potential supply limitations on polar, semi-polar, and nonpolar gallium and nitrogen containing wafers, it becomes extremely desirable to maximize utilization of available gallium and nitrogen containing substrate and overlying epitaxial material. In the fabrication of lateral cavity laser diodes, it is typically the case that minimum die size is determined by device components such as the wire bonding pads or mechanical handling considerations, rather than by laser cavity widths. Minimizing die size is critical to reducing manufacturing costs as smaller die sizes allow a greater number of devices to be fabricated on a single wafer in a single processing run. The current invention is a method of maximizing the number of devices which can be fabricated from a given gallium and nitrogen containing substrate and overlying epitaxial material by spreading out the epitaxial material onto a carrier wafer via a die expansion process.

With respect to AlInGaAsP laser devices, these devices include a substrate made of GaAs or Ge, but can be others. As used herein, the term "substrate" can mean the bulk substrate or can include overlying growth structures such as arsenic or phosphorus containing epitaxial region, or functional regions such as n-type AlGaAs, combinations, and the like. The devices have material overlying the substrate composed of GaAs, AlAs, AlGaAs, InGaAS, InGaP, AlInGaP, AlInGaAs or AlInGaAsP. Typically each of these regions is formed using at least an epitaxial deposition technique of metal organic chemical vapor deposition (MOCVD), molecular beam epitaxy (MBE), or other epitaxial growth techniques suitable for AlInGaAsP growth. In general these devices have an n-type and p-type conducting layer which may form part of a n-type cladding layer or p-type cladding layer, respectively, with lower refractive index than the light emitting active region. The n-cladding layers can be composed of an alloy of AlInGaAsP containing aluminum. The devices contain an active region which emits light during operation of the device. The active region may have one or more quantum wells of lower bandgap than surrounding quantum barriers. Separate confinement heterostructures (SCHs) may be included with refractive index higher than the cladding layers to improve confinement of the optical modes. SCHs and quantum wells are typically composed of InGaP, AlInGaP or InGaAsP, but may be other materials.

The device has a laser stripe region formed overlying a portion of surface region. The laser strip region has a first end and a second end, having a pair of cleaved mirror structures, which face each other. The first cleaved facet comprises a reflective coating and the second cleaved facet comprises no coating, an antireflective coating, or exposes As or P containing material. The first cleaved facet is substantially parallel with the second cleaved facet. The first and second cleaved facets are provided by a scribing and breaking process according to an embodiment or alternatively by etching techniques using etching technologies such as reactive ion etching (ME), inductively coupled plasma etching (ICP), or chemical assisted ion beam etching (CAIBE), or other method. The first and second mirror surfaces each comprise a reflective coating. The coating is selected from silicon dioxide, hafnia, and titania, tantalum pentoxide, zirconia, including combinations, and the like. Depending upon the design, the mirror surfaces can also comprise an anti-reflective coating.

In a specific embodiment, the method of facet formation includes subjecting the substrates to a laser for pattern formation. In a preferred embodiment, the pattern is configured for the formation of a pair of facets for one or more ridge lasers. In a preferred embodiment, the pair of facets face each other and are in parallel alignment with each other. In a preferred embodiment, the method uses a UV (355 nm) laser to scribe the laser bars. In a specific embodiment, the laser is configured on a system, which allows for accurate scribe lines configured in one or more different patterns and profiles. In one or more embodiments, the laser scribing can be performed on the back-side, front-side, or both depending upon the application. Of course, there can be other variations, modifications, and alternatives.

In a specific embodiment, the method uses backside laser scribing or the like. With backside laser scribing, the method preferably forms a continuous line laser scribe that is perpendicular to the laser bars on the backside of the substrate. In a specific embodiment, the laser scribe is generally about 15-20 um deep or other suitable depth. Preferably, backside scribing can be advantageous. That is, the laser scribe process does not depend on the pitch of the laser bars or other like pattern. Accordingly, backside laser scribing can lead to a higher density of laser bars on each substrate according to a preferred embodiment. In a specific embodiment, backside laser scribing, however, may lead to residue from the tape on one or more of the facets. In a specific embodiment, backside laser scribe often requires that the substrates face down on the tape. With front-side laser scribing, the backside of the substrate is in contact with the tape. Of course, there can be other variations, modifications, and alternatives.

In a specific embodiment, the method of facet formation includes subjecting the substrates to mechanical scribing for pattern formation. In a preferred embodiment, the pattern is configured for the formation of a pair of facets for one or more ridge lasers. In a preferred embodiment, the pair of facets face each other and are in parallel alignment with each other. In a preferred embodiment, the method uses a diamond tipped scribe to physically scribe the laser bars, though as would be obvious to anyone learned in the art a scribe tipped with any material harder than GaN would be adequate. In a specific embodiment, the laser is configured on a system, which allows for accurate scribe lines configured in one or more different patterns and profiles. In one or more embodiments, the mechanical scribing can be performed on the back-side, front-side, or both depending upon the application. Of course, there can be other variations, modifications, and alternatives.

In a specific embodiment, the method uses backside scribing or the like. With backside mechanical scribing, the method preferably forms a continuous line scribe that is perpendicular to the laser bars on the backside of the substrate. In a specific embodiment, the laser scribe is generally about 15-20 um deep or other suitable depth. Preferably, backside scribing can be advantageous. That is, the mechanical scribe process does not depend on the pitch of the laser bars or other like pattern. Accordingly, backside scribing can lead to a higher density of laser bars on each substrate according to a preferred embodiment. In a specific embodiment, backside mechanical scribing, however, may lead to residue from the tape on one or more of the facets. In a specific embodiment, backside mechanical scribe often requires that the substrates face down on the tape. With front-side mechanical scribing, the backside of the substrate is in contact with the tape. Of course, there can be other variations, modifications, and alternatives.

It is well known that etch techniques such as chemical assisted ion beam etching (CAIBE), inductively coupled plasma (ICP) etching, or reactive ion etching (RIE) can result in smooth and vertical etched sidewall regions, which could serve as facets in etched facet laser diodes. In the etched facet process a masking layer is deposited and patterned on the surface of the wafer. The etch mask layer could be comprised of dielectrics such as silicon dioxide ($SiO_2$), silicon nitride ($Si_xN_y$), a combination thereof or other dielectric materials. Further, the mask layer could be comprised of metal layers such as Ni or Cr, but could be comprised of metal combination stacks or stacks comprising metal and dielectrics. In another approach, photoresist masks can be used either alone or in combination with dielectrics and/or metals. The etch mask layer is patterned using conventional photolithography and etch steps. The alignment lithography could be performed with a contact aligner or stepper aligner. Such lithographically defined mirrors provide a high level of control to the design engineer. After patterning of the photoresist mask on top of the etch mask is complete, the patterns in then transferred to the etch mask using a wet etch or dry etch technique. Finally, the facet pattern is then etched into the wafer using a dry etching technique selected from CAIBE, ICP, RIE and/or other techniques. The etched facet surfaces must be highly vertical of between about 87 and about 93 degrees or between about 89 and about 91 degrees from the surface plane of the wafer. The etched facet surface region must be very smooth with root mean square roughness values of less than about 50 nm, 20 nm, 5 nm, or 1 nm. Lastly, the etched must be substantially free from damage, which could act as nonradiative recombination centers and hence reduce the COMD threshold. CAIBE is known to provide very smooth and low damage sidewalls due to the chemical nature of the etch, while it can provide highly vertical etches due to the ability to tilt the wafer stage to compensate for any inherent angle in etch.

The laser stripe is characterized by a length and width. The length ranges from about 50 microns to about 3000 microns, but is preferably between about 10 microns and about 400 microns, between about 400 microns and about 800 microns, or about 800 microns and about 1600 microns, but could be others. The stripe also has a width ranging from about 0.5 microns to about 50 microns, but is preferably between about 0.8 microns and about 2.5 microns for single lateral mode operation or between about 2.5 um and about 35 um for multi-lateral mode operation, but can be other dimensions. In a specific embodiment, the width is substantially constant in dimension, although there may be slight variations. The width and length are often formed using a masking and etching process, which are commonly used in the art.

The laser stripe is provided by an etching process selected from dry etching or wet etching. The device also has an overlying dielectric region, which exposes a p-type contact region. Overlying the contact region is a contact material, which may be metal or a conductive oxide or a combination thereof. The p-type electrical contact may be deposited by thermal evaporation, electron beam evaporation, electroplating, sputtering, or another suitable technique. Overlying the polished region of the substrate is a second contact material, which may be metal or a conductive oxide or a combination thereof and which comprises the n-type electrical contact. The n-type electrical contact may be deposited by thermal evaporation, electron beam evaporation, electroplating, sputtering, or another suitable technique.

This invention requires selective removal of one or more of the epitaxial layers to allow lift-off of the laser device layers. All of the epitaxial layers in the typical device structures described above are typically of use in the final device such that none may be removed from the structure. A sacrificial layer in most cases must be added to the epitaxial structure. This layer is one that has the properties of a) can be etched selectively relative to the adjacent layers in the epitaxial structure, b) can be grown in such a way that it does not induce defects in the device layers that negatively impact performance and c) can be grown between the functional device layers and the substrate such that selective removal of the sacrificial layer will result in undercutting of the device layers. In some embodiments the sacrificial layer will be a layer that would be normally found in the epitaxial structure. For example, when using laser lift-off to selectively remove material in an optoelectronic device grown on sapphire, the sacrificial layer might be the nitride material adjacent to the sapphire epitaxial surface. In some embodiments the sacrificial layer might be produced by selectively modifying a portion of a layer normally found in the device. For example, one might induce a n-type GaN layer to be selectively etchable at a specific depth via a well-controlled ion implantation process.

One embodiment for the fabrication of undercut GaN based laser diodes is depicted in FIG. 6. This embodiment uses a bandgap selective photo-electrical chemical (PEC) etch to undercut an array of mesas etched into the epitaxial layers. The preparation of the epitaxy wafer is shown in FIG. 6. This process requires the inclusion of a buried sacrificial region, which can be PEC etched selectively by bandgap. For GaN based optoelectronic devices, InGaN quantum wells have been shown to be an effective sacrificial region during PEC etching.[1,2] The first step depicted in FIG. 6 is a top down etch to expose the sacrificial layers, followed by a bonding metal deposition as shown in FIG. 6. With the sacrificial region exposed a bandgap selective PEC etch is used to undercut the mesas. In one embodiment, the bandgaps of the sacrificial region and all other layers are chosen such that only the sacrificial region will absorb light, and therefor etch, during the PEC etch. Another embodiment of the invention uses a sacrificial region with a higher bandgap than the active region such that both layers are absorbing during the bandgap PEC etching process. In this embodiment, the active region can be prevented from etching during the bandgap selective PEC etch using an insulating protective layer on the sidewall, as shown in FIG. 8. The first step depicted in FIG. 8 is an etch to expose the active region of the device. This step is followed by the deposition of a protective insulating layer on the mesa sidewalls, which serves to block PEC etching of the active region during the later sacrificial region undercut PEC etching step. A second top down etch is then performed to expose the sacrificial layers and bonding metal is deposited as shown in FIG. 8. With the sacrificial region exposed a bandgap selective PEC etch is used to undercut the mesas. At this point, the selective area bonding process shown in FIG. 7 is used to continue fabricating devices. In another embodiment the active region is exposed by the dry etch and the active region and sacrificial regions both absorb the pump light. A conductive path is fabricated between the p-type and n-type cladding surrounding the active region. As in a solar cell, carriers are swept from the active region due to the electric field in the depletion region. By electrically connecting the n-type and p-type layers together holes can be continually swept from the active region, slowing or preventing PEC etching.

Etching in the PEC process is achieved by the dissolution of AlInGaN materials at the wafer surface when holes are transferred to the etching solution. These holes are then recombined in the solution with electrons extracted at the cathode metal interface with the etching solution. Charge neutrality is therefore preserved. Sacrificial layers enabling the release of the epitaxial device layers via PEC etching would incorporate at a minimum a low-bandgap or doped layer that would absorb the pump light and have enhanced etch rate relative to the surrounding material. The sacrificial layer can be deposited epitaxially and the alloy composition and doping of these release layers can be selected such that hole carrier lifetime and diffusion lengths are high. Defects that reduce hole carrier lifetimes and diffusion length must can be avoided by growing the sacrificial layers under growth conditions that promote high material crystalline quality. An example of a sacrificial layer would be an InGaN layer that is absorbing at the wavelength of an external light source. Etch stop layers may clad the sacrificial release layer on one or both sides to limit the inadvertent etching of material surrounding the release layer. The etch properties of the etch stop layer can be controlled solely by or a combination of alloy composition and doping. A potential etch stop layer would an AlGaN or GaN layer with a bandgap higher than the external light source, such that carriers are not generated in this layer under illumination by the external light source. Wider bandgap materials may also prevent holes from escaping from the lower band-gap release layers leading to unintentional etching of the surrounding cladding material. Another potential etch stop layer is a highly doped n-type AlGaN or GaN layer with reduce minority carrier diffusion lengths and lifetime thereby dramatically reducing the etch rate of the etch stop material. In this invention, it is typical that the release layer and the light emitting layers are both exposed to the etch solution at the edges of the die. Selective etching of the release layer can be achieved by choosing the bandgap of the light emitting layers to be higher than both the release layer and the photon energy of the external light source, such that the etch-enhancing light is preferentially absorbed by the release layers and either not absorbed or absorbed with lower efficiency in the light emitting layers. Another way selective etching of the release layer is achieved is by electrically shorting the anode to the cathode. Electron hole pairs generated in the device light emitting layers are swept out of the light emitting layers by the electric field of the of the p-n junction. Since holes are swept out of the active region and the PEC etch process is moderated by holes, there is little or no etching of the light emitting layer. Just like a photodiode operated in a short-circuit mode, the buildup of carriers produces a potential difference that drives carriers through the metal interconnects that short the anode and cathode whereupon the carriers recombine. The flat band conditions in the n-type doped sacrificial region result in a buildup of holes that result in rapid etching of the sacrificial layers. In one embodiment, the metal interconnects to short the anode and cathode can be used as anchor regions to mechanically hold the gallium and nitrogen containing mesas in place prior to the bonding step.

The relative etch rates of the sacrificial and active regions are determined by a number of factors, but primarily it is determined by the density of holes found in the active region at steady state. If the metal interconnects or anchors are very resistive, or if either the cathode or anode electrical contacts to the p-type and n-type, respectively, cladding regions are too resistive or have large Schottky barriers then it is possible for carriers to accumulate on either side of the p-n junction. These carriers will produce an electric field that acts against the field in the depletion region and will reduce the magnitude of the field in the depletion region until the rate of photo-generated carrier drift out of the active region is balanced by the recombination rate of carriers via the metal layers shorting the cathode and anode. Some recombination will take place via photochemical etching, and since this scales with the density of holes in the active region it is preferable to prevent the buildup of a photo-induced bias across the active region.

Undercut AlInGaAsP based laser diodes can be produced in a manner similar to GaN based laser diodes. There are a number of wet etches that etch some AlInGaAsP alloys selectively.[7] In one embodiment, an AlGaAs or AlGaP sacrificial layer could be grown clad with GaAs etch stop layers. When the composition of $Al_xGa_{1-x}As$ and $Al_xGa_{1-x}P$ is high (x>0.5) AlGaAs can be etched with almost complete selectivity (i.e. etch rate of AlGaAs>1E6 times that of GaAs) when etched with HF. InGaP and AlInP with high InP and AlP compositions can be etched with HCl selectively relative to GaAs. GaAs can be etched selectively relative to AlGaAs using $C_6H_8O_7:H_2O_2:H_2O$. There are a number of other combinations of sacrificial layer, etch-stop layer and etch chemistry which are widely known to those knowledgeable in the art of micromachining AlInGaAsP alloys.

In one embodiment, the AlInGaAsP device layers are exposed to the etch solution which is chosen along with the sacrificial layer composition such that only the sacrificial layers experience significant etching. The active region can be prevented from etching during the compositionally selective etch using an etch resistant protective layer, such as like silicon dioxide, silicon nitride, metals or photoresist among others, on the sidewall, as shown in FIG. 8. The first step depicted in FIG. 8 is an etch to expose the active region of the device. This step is followed by the deposition of a protective insulating layer on the mesa sidewalls, which serves to block etching of the active region during the later sacrificial region undercut etching step. A second top down etch is then performed to expose the sacrificial layers and bonding metal is deposited as shown in FIG. 8. With the sacrificial region exposed a compositionally selective etch is used to undercut the mesas. At this point, the selective area bonding process shown in FIG. 7 is used to continue fabricating devices. The device layers should be separated from the sacrificial layers by a layer of material that is resistant to etching. This is to prevent etching into the device layers after partially removing the sacrificial layers.

A top down view of one preferred embodiment of the die expansion process is depicted in FIG. 5. The starting materials are patterned epitaxy and carrier wafers. Herein, the 'epitaxy wafer' or 'epitaxial wafer' or 'donor wafer' is defined as the original gallium and nitrogen containing wafer on which the epitaxial material making up the active region was grown, while the 'carrier wafer' is defined as a wafer to which epitaxial layers are transferred for convenience of processing. The carrier wafer can be chosen based on any number of criteria including but not limited to cost, thermal conductivity, thermal expansion coefficients, size, electrical conductivity, optical properties, and processing compatibility. The patterned epitaxy wafer is prepared in such a way as to allow subsequent selective release of bonded epitaxy regions. The patterned carrier wafer is prepared such that bond pads are arranged in order to enable the selective area bonding process. These wafers can be prepared by a variety of process flows, some embodiments of which are described below. In the first selective area bond step, the epitaxy wafer is aligned with the pre-patterned bonding pads on the carrier wafer and a combination of pressure, heat, and/or sonication is used to bond the mesas to the bonding pads. The bonding material can be a variety of media including but not limited to metals, polymers, waxes, and oxides. Only epitaxial die which are in contact with a bond bad on the carrier wafer will bond. Sub-micron alignment tolerances are possible on commercial die bonders. The epitaxy wafer is then pulled away, breaking the epitaxy material at a weakened epitaxial release layer such that the desired epitaxial layers remain on the carrier wafer. Herein, a 'selective area bonding step' is defined as a single iteration of this process. In the example depicted in FIG. 5, one quarter of the epitaxial die are transferred in this first selective bond step, leaving three quarters on the epitaxy wafer. The selective area bonding step is then repeated to transfer the second quarter, third quarter, and fourth quarter of the epitaxial die to the patterned carrier wafer. This selective area bond may be repeated any number of times and is not limited to the four steps depicted in FIG. 5. The result is an array of epitaxial die on the carrier wafer with a wider die pitch than the original die pitch on the epitaxy wafer. The die pitch on the epitaxial wafer will be referred to as pitch 1, and the die pitch on the carrier wafer will be referred to as pitch 2, where pitch 2 is greater than pitch 1. At this point standard laser diode processes can be carried out on the carrier wafer. Side profile views of devices fabricated with state of the art methods and the methods described in the current invention are depicted in FIG. 1 and FIGS. 2A-2B, respectively. The device structure enabled by the current invention only contains the relatively expensive epitaxy material where the optical cavity requires it, and has the relatively large bonding pads and/or other device components resting on a carrier wafer. Typical dimensions for laser ridge widths and bonding pads are <about 30 µm and >about 100 µm, respectively, allowing for three or more times improved epitaxy usage efficiency with the current invention.

In a preferred embodiment, the donor wafer or epitaxial wafer consists of a GaN substrate overlaid by a n-type buffer layer, overlaid by a InGaN based sacrificial layer, overlaid by a n-type conducting cladding layer overlaid by a light-emitting active region overlaid by a p-type conducting cladding layer. Mesas are formed by a dry etch process, with the bottoms of the mesas lying below the sacrificial layer. Metal layers are deposited on top of the mesas using standard lithographic techniques to form the p-contact. These p-contact metal layers form a good electrical contact to the p-type cladding layer. For example, the p-contact metal might be Pd overlaid by a Ni overlaid by Au. Here the Pd is a metal with a high work function which provides an ohmic and relatively low resistance electrical contact to the p-type GaN. The Ti promotes good adhesion as well as acts as a diffusion barrier preventing Pd and Au intermixing at elevated temperatures. The Au acts as a current spreading layer as well as a providing a non-reactive, oxidation-resistant metallic surface on which more metals may be deposited with good adhesion and electrical contact after subsequent processing. Other preferred p-contact metals include Ni, Ag and Pt, with thicknesses ranging from 0.5 nm to 100 nm, though thicker contact layers may be used. Other preferred adhesion or diffusion barrier layer would be Ti, Cr, W, Ir, Pt, Ti/W alloys and Mo, with the adhesion or diffusion barrier layer ranging in thickness from 20 to 500 nm, though thicker layers may be used and may be preferred if subsequent process temperatures are greater than 300° C. or otherwise high enough to promote significant intermixing of metal layers. In a preferred alternative embodiment the barrier metals may be comprised of a Ti/Pt layer stack wherein the Pt makes very effective barrier layer to the Au diffusion into contact metal and the Ti separates the Pt from the Pd. Preferred Au thickness is 20-200 nm, though thicker and thinner layers could be used. In some embodiments an indium tin oxide [ITO] is used as the p-contact material. A second metal stack comprised of, 50 nm of Ti overlaid by 1000 nm of Au, is deposited and patterned using standard lithographic techniques. The second metal stack overlays both the tops of the mesas and the bottom of the etched trenches while exposing the majority of the mesa side-walls. In one or more places on each mesa the regions of the second metal stack overlaying the tops of the mesas and bottoms of the trenches are connected by a region of the second metal stack overlaying the sidewall of the mesas. This second metal stack serves three purposes: firstly as the bond-media for the transfer of mesas, secondly as the cathode metal to enhance the PEC etch rate of the sacrificial layer and lastly as the PEC etch resistant anchors that prevent the undercut mesas from detaching from the substrate wafer and from shifting laterally. The Ti in the second metal stack serves as an adhesion promoting layer. The thick Au layer is the bond medium for the Au—Au thermocompressive bonding that transfers the mesas to the carrier wafer. The dry etch to define the shape of the device die as well as expose the sacrificial layer can be carried out either before the p-contact metal stack is deposited or after the p-contact metal stack is deposited but before the deposition of the second metal stack.

In a particular embodiment, the cathode metal stack also includes metal layers intended to increase the strength of the metal anchors. For example the cathode metal stack might consist of 100 nm of Ti to promote adhesion of the cathode metal stack and provide a good electrical contact to the n-type cladding. The cathode metal stack could then incorporate a layer of tungsten, which has an elastic modulus on the order of four times higher than gold. Incorporating the tungsten would reduce the thickness of gold required to provide enough mechanical support to retain the mesas after they are undercut by the selective etch.

In an embodiment, the p-contact metal is deposited as a stack of layers of differing composition and subsequently annealed at elevated temperature before the second metal stack is deposited. For example, the p-contact metal stack may be 5-20 nm of Ni capped with 5-200 nm of Au. Annealing the Ni/Au at temperatures above 450 C cause the layers to alloy, which has been found to form a lower resistance contact to p-type GaN than the as deposited Ni/Au contact. Another example is using a transparent conductive oxide (TCO) such as ITO as a p-contact since TCO deposition processes often incorporate a post-deposition anneal to improve transparency and contact properties.

Gold-gold metallic bonding is used as an example in this work, although a wide variety of oxide bonds, polymer bonds, wax bonds etc. are potentially suitable. Submicron alignment tolerances are possible using commercial available die bonding equipment. The carrier wafer is patterned in such a way that only selected mesas come in contact with the metallic bond pads on the carrier wafer. When the epitaxy substrate is pulled away the bonded mesas break off at the weakened sacrificial region, while the un-bonded mesas remain attached to the epitaxy substrate. This selective area bonding process can then be repeated to transfer the remaining mesas in the desired configuration. This process can be repeated through any number of iterations and is not limited to the two iterations depicted in FIG. 7. The carrier wafer can be of any size, including but not limited to about 2 inch, 3 inch, 4 inch, 6 inch, 8 inch, and 12 inch. After all desired mesas have been transferred, a second bandgap selective PEC etch can be optionally used to remove any remaining sacrificial region material to yield smooth surfaces. At this point standard laser diode processes can be carried out on the carrier wafer. Another embodiment of the invention incorporates the fabrication of device components on the dense epitaxy wafers before the selective area bonding steps. In the embodiment depicted in FIG. 9 the laser ridge, sidewall passivation, and contact metal are fabricated on the original epitaxial wafer before the die expansion process. This process flow is given for example purposes only and is not meant to limit which device components can be processed before the die expansion process. This work flow has potential cost advantages since additional steps are performed on the higher density epitaxial wafer before the die expansion process. A detailed schematic of this process flow is depicted in FIG. 9.

In one embodiment thermocompression bonding is used to transfer the gallium and nitrogen epitaxial semiconductor layers to the carrier wafer. In this embodiment thermocompression bonding involves bonding of the epitaxial semiconductor layers to the carrier wafer at elevated temperatures and pressures using a bonding media disposed between the epitaxial layers and handle wafer. The bonding media may be comprised of a number of different layers, but typically contain at least one layer (the bonding layer) that is composed of a relatively ductile material with a high surface diffusion rate. In many cases this material is comprised of Au, Al or Cu. The bonding stack may also include layers disposed between the bonding layer and the epitaxial materials or handle wafer that promote adhesion. For example an Au bonding layer on a Si wafer may result in diffusion of Si to the bonding interface, which would reduce the bonding strength. Inclusion of a diffusion barrier such as silicon oxide or nitride would limit this effect. Relatively thin layers of a second material may be applied on the top surface of the bonding layer in order to promote adhesion between the bonding layers disposed on the epitaxial material and handle. Some bonding layer materials of lower ductility than gold (e.g. Al, Cu etc.) or which are deposited in a way that results in a rough film (for example electrolytic deposition) may require planarization or reduction in roughness via chemical or mechanical polishing before bonding, and reactive metals may require special cleaning steps to remove oxides or organic materials that may interfere with bonding.

Thermocompressive bonding can be achieved at relatively low temperatures, typically below 500 degrees Celsius and above 200. Temperatures should be high enough to promote diffusion of atoms across the bonding interface, but not so high as to promote unintentional alloying of individual layers in each metal stack. Application of pressure enhances the bond rate, and leads to some elastic and plastic deformation of the metal stacks that brings them into better and more uniform contact. Optimal bond temperature, time and pressure will depend on the particular bond material, the roughness of the surfaces forming the bonding interface and the susceptibility to fracture of the handle wafer or damage to the device layers under load. In general, bonding temperatures above 200 C are preferred for enabling good bonding while temperatures below 400 C are preferred for limiting intermixing of layers of differing composition in the metal stacks.

The bonding media can also be an amorphous or glassy material bonded either in a reflow process or anodically. In anodic bonding the media is a glass with high ion content where mass transport of material is facilitated by the application of a large electric field. In reflow bonding the glass has a low melting point, and will form contact and a good bond under moderate pressures and temperatures. All glass bonds are relatively brittle, and require the coefficient of thermal expansion of the glass to be sufficiently close to the bonding partner wafers (i.e. the GaN wafer and the handle).

Glasses in both cases could be deposited via vapor deposition or with a process involving spin on glass. In both cases the bonding areas could be limited in extent and with geometry defined by lithography or silk-screening process.

In a preferred embodiment of this invention, the bonding process is performed after the selective etching of the sacrificial region. A critical challenge of the "etch then bond" embodiment is mechanically supporting the undercut epitaxial device layer mesa region from spatially shifting prior to the bonding step. If the mesas shift laterally, then the ability to accurately align and arrange them to the carrier wafer will be compromised, and hence the ability to manufacture with acceptable yields. Mechanically fixing the mesa regions in place prior to bonding can be achieved in several ways. In a preferred embodiment anchor regions are used to mechanically attach the mesas to the gallium and nitrogen containing substrate prior to the bonding step wherein the anchors are broken and the bonded mesas are released from the gallium and nitrogen containing substrate and transferred to the carrier wafer.

In another preferred embodiment of the invention the gallium and nitrogen epitaxial material will be grown on a gallium and nitrogen containing substrate material of one of the following orientations: m-plane, {50-51}, {30-31}, {20-21}, {30-32}, {50-5-1}, {30-3-1}, {20-2-1}, {30-3-2}, or offcuts of these planes within about +/−5 degrees towards a-plane and/or c-plane In another embodiment of the invention individual PEC undercut etches are used after each selective bonding step for etching away the sacrificial release layer of only bonded mesas. Which epitaxial die get undercut is controlled by only etching down to expose the sacrificial layer of mesas which are to be removed on the current selective bonding step. The advantage of this embodiment is that only a very coarse control of PEC etch rates is required. This comes at the cost of additional processing steps and geometry constrains.

In another embodiment of the invention the bonding layers can be a variety of bonding pairs including metal-metal, oxide-oxide, soldering alloys, photoresists, polymers, wax, etc.

In another embodiment of the invention the sacrificial region is completely removed by PEC etching and the mesa remains anchored in place by any remaining defect pillars. PEC etching is known to leave intact material around defects which act as recombination centers.[2,3] Additional mechanisms by which a mesa could remain in place after a complete sacrificial etch include static forces or Van der Waals forces. In one embodiment the undercutting process is controlled such that the sacrificial layer is not fully removed. The remaining thin strip of material anchors the device layers to the substrate as shown in FIG. 7.

In another embodiment of the invention a shaped sacrificial region expose mesa is etched to leave larger regions (anchors) near the ends of each epitaxy die. Bonding metal is placed only on the regions of epitaxy that are to be transferred. A selective etch is then performed such that the epitaxy die to be transferred is completely undercut while the larger regions near the end are only partially undercut. The intact sacrificial regions at the ends of the die provide mechanical stability through the selective area bonding step. As only a few nanometers of thickness will be undercut, this geometry should be compatible with standard bonding processes. After the selective area bonding step, the epitaxy and carrier wafers are mechanically separated, cleaving at the weak points between the bond metal and intact sacrificial regions. Example schematics of this process are depicted in FIGS. 10 and 11. After the desired number of repetitions is completed, state of the art laser diode fabrication procedures can be applied to the die expanded carrier wafer.

In another embodiment the anchors are positioned either at the ends or sides of the undercut die such that they are connected by a narrow undercut region of material. FIG. 10 shows this configuration as the "peninsular" anchor. The narrow connecting material 304 is far from the bond metal and is design such that the undercut material cleaves at the connecting material rather than across the die. This has the advantage of keeping the entire width of the die undamaged, which would be advantageous. In another embodiment, geometric features are added to the connecting material to act as stress concentrators 305 and the bond metal is extended onto the narrow connecting material. The bond metal reinforces the bulk of the connecting material. Adding these features increases the control over where the connection will cleave. These features can be triangles, circles, rectangles or any deviation that provides a narrowing of the connecting material or a concave profile to the edge of the connecting material.

In another embodiment the anchors are of small enough lateral extent that they may be undercut, however a protective coating is used to prevent etch solution from accessing the sacrificial layers in the anchors. This embodiment is advantageous in cases when the width of the die to be transferred is large. Unprotected anchors would need to be larger to prevent complete undercutting, which would reduce the density of die and reduce the utilization efficiency of epitaxial material.

In another embodiment, the anchors are located at the ends of the die and the anchors form a continuous strip of material that connects to all or a plurality of die. This configuration is advantageous since the anchors can be patterned into the material near the edge of wafers or lithographic masks where material utilization is otherwise poor. This allows for utilization of device material at the center of the pattern to remain high even when die sizes become large.

In another embodiment the anchors are formed by depositing regions of an etch-resistant material that adheres well to the epitaxial and substrate material. These regions overlay a portion of the laser die and some portion of the structure that will not be undercut during the etch. These regions form a continuous connection, such that after the laser die is completely undercut they provide a mechanical support preventing the laser die from detaching from the substrate. For example, a laser die with a length of about 1.2 mm and a width of about 40 micrometers is etched such that the sacrificial region is exposed. Metal layers are then deposited on the top of the laser die, the sidewall of the laser die and the bottom of the etched region surrounding the die such that a continuous connection is formed. The metal layers comprise of about 20 nm of titanium to provide good adhesion and capped with about 500 nm of gold. The length of laser die sidewall coated in metal is about 1 nm to about 40 nm, with the upper thickness being less than the width of the laser die such that the sacrificial layer is etched completely in the region near the metal anchor where access to the sacrificial layer by etchant will be limited.

The use of metal anchors as shown have several advantages over the use of anchors made from the epitaxial device material. The first is density of the transferable mesas on the donor wafer containing the epitaxial semiconductor device layers and the gallium and nitrogen containing bulk substrate. Anchors made from the epitaxial material must be large enough to not be fully undercut by the selective etch, or they must be protected somehow with a passivating layer. The inclusion of a large feature that is not transferred will reduce the density of mesas in one or more dimensions on the epitaxial device wafer. The use of metal anchors is preferable because the anchors are made from a material that is resistant to etch and therefore can be made with small dimensions that do not impact mesa density. The second advantage is that it simplifies the processing of the mesas because a separate passivating layer is no longer needed to isolate the active region from the etch solution. This is possible because the metal anchors can act as electrical connections that electrically short the active region and inhibit PEC etching. Removing the active region protecting layer reduces the number of fabrication steps while also reducing the size of the mesa required.

FIG. 11a is a schematic representation of electrically-conductive, non-epitaxial anchor layouts. Device layer mesas 201 are etched into the donor wafer. The mesas are then overlaid with bond media 203. The bond media is comprised of a plurality of regions, with one region isolated to the top of the device layer mesa, a second region overlays the ends of the mesa and comprises the anchor region of the mesas. Bond media extends over the edge of the mesa in the anchor regions. Schematic representations of the cross sections A and B are shown. Cross-section A shows a region of the mesa far from the anchors. Bond media 205 is isolated to the top of the mesas and the etched trenches. On the tops of the mesas, the bond media overlays the p-contact metal layers 208. Both the active region 206 and the sacrificial layers 207 are exposed to the side of the mesa. Cross-section B shows the anchor region of the mesa. Here the bond media overlays the mesa tops as well as the trenches. Regions of bond media 209 connect the bond media on the mesa tops to that in the trenches; acting as both anchors as well as conducting paths for shorting the active region.

In another embodiment of the invention, the release of the epitaxial layers is accomplished by means other than PEC etching, such as laser lift off.

In another embodiment the anchors are fabricated from metal, silicon nitride or some other material resistant to the selective etch. This embodiment has the advantage over the partially undercut anchors in that the anchor is not undercut and therefore can be much smaller than the extent of lateral etching. This enables much denser patterning of dice on the substrate.

In an embodiment, laser device epitaxy material is fabricated into a dense array of undercut mesas on a substrate containing device layers. This pattern pitch will be referred to as the 'first pitch'. The first pitch is often a design width that is suitable for fabricating each of the epitaxial regions on the substrate, while not large enough for completed laser devices, which often desire larger non-active regions or regions for contacts and the like. For example, these mesas would have a first pitch ranging from about 5 microns to about 30 microns or to about 50 or to about 100 or 200 microns. Each of these mesas is a 'die'.

In an example, these die are then transferred to a carrier wafer at a second pitch such that the second pitch on the carrier wafer is greater than the first pitch on the substrate. In an example, the second pitch is configured with the die to allow each die with a portion of the carrier wafer to be a laser device, including contacts and other components. For example, the second pitch would be about 100 microns to about 200 microns or to about 300 microns but could be as large at about 1-2 mm or greater in the case where a large chip is desired for ease of handling. For example, in the case where the carrier is used as a submount, the second pitch should be greater than about 1 mm to facilitate the pick and place and die-attach processes. The second die pitch allows for easy mechanical handling and room for wire bonding pads positioned in the regions of carrier wafer in-between epitaxy mesas, enabling a greater number of laser diodes to be fabricated from a given gallium and nitrogen containing substrate and overlying epitaxy material. Side view schematics of state of the art and die expanded laser diodes are shown in FIG. 1 and FIGS. 2A-2B. Typical dimensions for laser ridge widths and the widths necessary for mechanical and wire bonding considerations are from about 1 µm to about 30 µm and from about 100 µm to about 300 µm, respectively, allowing for large potential improvements in gallium and nitrogen containing substrate and overlying epitaxy material usage efficiency with the current invention. In particular, the present invention increases utilization of substrate wafers and epitaxy material through a selective area bonding process to transfer individual die of epitaxy material to a carrier wafer in such a way that the die pitch is increased on the carrier wafer relative to the original epitaxy wafer. The arrangement of epitaxy material allows device components which do not require the presence of the expensive gallium and nitrogen containing substrate and overlying epitaxy material often fabricated on a gallium and nitrogen containing substrate to be fabricated on the lower cost carrier wafer, allowing for more efficient utilization of the gallium and nitrogen containing substrate and overlying epitaxy material.

In another embodiment of the invention the laser facets are produced by cleaving processes. If a suitable carrier wafer is selected it is possible to use the carrier wafer to define cleaving planes in the epitaxy material. This could improve the yield, quality, ease, and/or accuracy of the cleaves.

In another embodiment of the invention the laser facets are produced by etched facet processes. In the etched facet embodiment a lithographically defined mirror pattern is etched into the gallium and nitrogen to form facets. The etch process could be a dry etch process selected from inductively coupled plasma etching (ICP), chemically assisted ion beam etching (CAIBE), or reactive ion etching (ME) Etched facet process can be used in combination with the die expansion process to avoid facet formation by cleaving, potentially improved yield and facet quality. In a preferred embodiment the etched facets would be formed after the transfer of the epitaxial device layers to the carrier wafer. In an alternative embodiment the etched facets could be formed on the epitaxial wafer or donor wafer and be transferred to the carrier wafer.

In one embodiment, etched facets are formed by use of photo-resist to act as an etch mask for the ICP, RIE or CAIBE etch processes. This is a less preferred method as the photoresist can deform during the etch process; causing both the shape of the photo-resist sidewall profile as well as the shape of the mirror pattern to change during the etch process. Such changes in etch-mask shape and sidewall profile can lead to rounding, roughening and unintentional inclination of the etched facet, thereby reducing the reflectivity of and potentially increasing scattering from the etched facet. Photo-resists are also known to induce a phenomenon sometimes called micro-masking. Etching of the photo-resist by the dry-etch process results in organic materials in the vapor phase which can be redeposited on the sample surface as residue. Once redeposited this residue locally inhibits etching of the semiconductor leading to a lateral variation in etch rate and roughening of both the etched facet and the etched field in front of the facet. It is more preferred, then, to use a hard mask to etch the facets.

In a more preferred embodiment, a layer of silicon nitride of silicon oxide is used as a hard mask for the facet etch-process. Etch selectivity between silicon oxide and GaN in chlorine-based dry etch chemistries is typically between 1 and 10 depending on the etch process and chemistry; i.e. the etch rate for oxide can vary between 100% and 10%, respectively, of that of the GaN. In general, it is preferred for the selectivity to be high, i.e. for the oxide etch rate to be low compared to the GaN, such that the thickness of the oxide hard mask and shape of the hard mask sidewall does not change greatly during etches. High selectivity also enables the use of thinner hard-masks, thereby saving time in the hard-mask deposition and patterning processes. The hard mask material is first deposited onto the wafer. Photoresist is then spun onto the wafer and patterned with the mirror pattern using standard lithographic techniques. An oxide dry etch is then used to transfer the mirror pattern to the oxide hard mask. The oxide dry etch process could be a dry etch process selected from ICP, CAIBE, or ME. Typical chemistries for etching oxide include fluorine based molecules such as CF4, CHF3, SF6, and the like. The oxide is fully removed from regions of the device wafer intended to be etched. This can be accomplished either by over-etching the oxide such that all oxide residue is removed from the bottom of the facet etch region or by combining a dry etch of the oxide that targets the full oxide thickness with minimal over etch and a HF vapor or wet etch to clear out any remaining oxide residue. The dry over-etch is the preferred method, though it may result into some unintentional etching into the device layers, because the HF based etches are significantly less anisotropic than the dry etch and may result in rounding or roughening of the hard mask sidewalls. The photo-resist is then removed in preparation for the dry etching of the device layers. The device layers are then etched using a dry etch process selected from ICP, CAIBE, Ion Mill, Reactive Ion Beam Etching (RIBE), or RIE. In other embodiments, similar processes may be used with different hard masks, for example silicon nitride could be used for a hard mask, or the hard mask might be a metal resistant to the device layer dry etch process such as nickel.

In general it is preferred for the oxide hard mask to be deposited in a blanket deposition process and subsequently patterned with an etch process. This is because standard lithographic patterning requires the use of organic polymers as photo-sensitive resist layers (i.e. photo-resist) to produce positive and negative reproductions of device patterns by masking off regions of the device wafer for lift-off or etch-back processes. Photo-resists typically have a limited range of process temperatures, with temperature exceeding 200 degrees Celsius being problematic due to outgassing of photo-resists as well as softening and reflow of resists near or above their glass-transition temperatures, which can have negative impacts on the quality of pattern reproduction in the photo-resist. In general, the densest and most etch-resistant oxide layers are deposited using processes carried out at temperatures above 200 degrees Celsius, therefore it is difficult to deposit oxide hard masks with high quality using a lift-off process. Moreover, many oxide deposition techniques are conformal, i.e. oxide is deposited on all exposed surfaces, which makes lift-off based patterning difficult with thick oxide masks that are on the same order of thickness as the photo-resist, which tends to become fully encapsulated with oxide. Because of this, in general it is preferred to deposit an oxide hard mask using a blanket deposition and either provide a mechanism by which the hard mask may be removed without damaging other components of the device wafer or to incorporate the hard mask into the devices such that the hard mask need not be removed after etching of the facets.

FIG. 11b schematically shows an embodiment including an etched facet where the bonding media is comprised of a plurality of regions with no bonding media underlying the region of the device layers where the facet is etched. A carrier wafer 106 is provided and overlaid by a plurality of regions comprised of bond media 105. A device layer mesa is provided, also overlaid by a plurality of regions of bond material 104. The mesa is comprised by two regions: a cavity region 101 and an anchor region 102. Only one end of the cavity region is shown. The opposite end would also have an anchor region. The cavity and anchor regions are separated by a region that is not over laid by bond media. A silicon oxide hard mask 107 is overlaid on the device layer mesa and patterned with a window that will define the facet etch region. A dry etch process is used to etch the device layers to form a first facet 108. The carrier wafer is then separated along a separation-line 109 to form a laser bar.

In some embodiments, the hard-mask is comprised of two or more layers with the upper most layer being resistant to the device layer dry etch process and chemistry and one or more of the lower layers being selectively removable using a chemistry or process that does not significantly damage the structures of the device wafer. Such a configuration allows for the hard mask to be easily removed from the device wafer after etching of the facet.

In an embodiment, the hard-mask is a bi-layer, consisting of two layers, the first layer being germanium and the second being silicon oxide. The Ge under-layer is capable of being removed selectively by etching with a wet chemistry including hydrogen peroxide, to which GaN based semiconductors and many metals and dielectrics can be safely exposed without damage. The silicon oxide thickness should be of an appropriate thickness for the required facet etch-depth and selectivity of the etch process. For typical device thicknesses and etch processes, the oxide should be between 1 and 5 microns thick. The Ge under-layer should be thick enough that it can be efficiently undercut from beneath the oxide hard mask using the hydrogen-peroxide-based selective etch. The Ge should also be thick enough to conformally coat the features of the device wafer protected by the hard mask. In regions where the Ge is not conformal the oxide over-layer may contact the device wafer and be resistant to removal during the undercut process. In general it is preferred for the Ge layer to be between 100 nm and 1 micron, though thicker and thinner Ge layers are possible for certain device dimensions. In some embodiments, after dry etching of the oxide hard mask to transfer the mirror pattern, the Ge layer is removed to expose the device layer for etching using a hydrogen-peroxide containing wet etch. Removal of the Ge with a wet etch may result in the hard mask being undercut, i.e. the Ge is partially removed from the edge of the hard mask resulting in a gap between the edge of the oxide layer and the device layers. In other embodiments, the Ge under-layer has poor selectivity relative to the device layers and both the Ge under-layer and the device layers may be etched in the same etch process using the oxide hard mask as a pattern for both. This is a preferred, removable, bi-layer hard-mask process when the oxide deposition or facet etch temperatures are too high to use a soft under-layer such as photo-resist. In general process temperatures above 200 C risk causing photoresist to release gasses or reflow; processes which may result in bubble formation or deformation of the hard mask during deposition.

In an embodiment, the hard mask is a bi-layer. The under-layer is photo-resist. As with the Ge/oxide bi-layer hard-mask, the resist/oxide bilayer can be selectively removed after facet etching by stripping of the resist under-layer. This is a preferred embodiment when it is not possible to conformally deposit Ge on the device wafer. An equivalent patterning process is used as with the Ge/oxide bi-layer, however the photo-resist is removed from the etch region by use of either photo-resist developer or in a preferred embodiment use of a dry etch process. Use of a dry-etch process to remove the photo-resist is preferred because it gives better control of the undercut of the oxide over-layer. The amount of undercut, i.e. removal of under-layer from beneath the etched edge of the oxide hard-mask, is important because too large an undercut may allow the edge of the oxide mask to bend, leading to a non-ideal facet etch. At the same time, the undercut provides room for the photo-resist to reflow during high-temperature facet etch processes without affecting the definition of the hard-mask edge. In general, undercuts of 100 nm to 3 microns are preferred.

In some embodiments, the hard-mask is not removed from the device wafer after etching of the facets. This is a preferred embodiment because it minimizes the number of processing steps required to fabricate a device. In such an embodiment, the hard mask may be incorporated into the device and serve a secondary function. For example, in a laser device, the hard mask may serve a secondary purpose as electrical passivation for the ridge waveguide.

In an embodiment, a laser ridge is etched using a dry etch process using photo-resist and standard lithographic techniques to pattern the ridge. A blanket (i.e. without resist or mask) deposition of silicon oxide is them performed, with the oxide thickness being greater than 500 nm and less than 6 microns, such that the ridge region, facet regions and exposed carrier wafer regions are covered with oxide. The wafer is then patterned with a first facet region using photo-resist and standard lithographic techniques and a lithographically defined mirror pattern is etched into the oxide hard mask using a dry-etch technique such as ICP, RIE, RIBE, ion mill or CAIBE. Chemistries for these dry etches would preferably contain fluorine, but may also contain one or more of methane, chlorine, argon and hydrogen. The first facet region of the device layers is then etched using a dry-etch technique such as ICP, ME, RIBE, ion mill or CAIBE. In the case of group-III nitride device layers a chlorine-based etch chemistry may be used. The wafer is then then patterned with a second facet region using photo-resist and standard lithographic techniques as done with the first facet region. A protective mask of photoresist is applied to cover the first etched facet region, with the photo-resist region preferably extending at least 10 microns beyond the edge of the first etched facet region. A second lithographically defined mirror pattern is etched into the oxide hard mask using a dry-etch technique such as ICP, ME, RIBE, ion mill or CAIBE using etch chemistries similar to those used in the first facet etch. The second facet etch may be carried out at elevated temperature because since the protective patch of photo-resist is present only to cover the first etched facet and prevent damage from the second facet etch, reflow of the protective photo-resist will not affect the roughness or angle of the second etched facet. The protective photo-resist is then removed using either photo-resist stripper, photo-resist developer, a dry-etch or ashing process or some other process for removing organic materials. In order to make electrical contact to the top of the laser ridge, a window or n-contact via in the oxide hard-mask above the top of the laser ridge is defined using standard lithographic techniques.

The via is then produced by wet or dry etching of the remaining oxide hard mask. When the device layer comprising the top of the laser ridge is exposed by the n-contact via dry-etch, a metal contact can be made using a standard lithographic lift-off technique.

In some embodiments a dry etch is preferred because the isotropic nature of a wet etch may result in poor control over the width of the n-contact via. Should the via extend, due to unintentional lateral etching, over the sides of the laser ridge it may be possible to make electrical contact off of the edge of the ridge and thereby inject current into portions of the device that do not overlap certain dry-etch chemistries and conditions can be shown to have negative effects on the lifetime of devices. In embodiments of this invention the ridge etch is often on the n-type conducting side of the device layer stack.

In one specific embodiment, the n-contact via is produced using a two-step process. First, the blanket-deposited oxide hard mask is patterned using photo-resist and standard lithographic techniques. The n-contact via is then etched using a dry etch process such as ICP, ME, RIBE, ion mill or CAIBE using a chemistry which preferably contains fluorine and no hydrogen, but may also contain one or more of methane, chlorine, oxygen, argon and hydrogen. The dry etch process is carried out such that the majority of the oxide in the n-contact via is removed. The remaining oxide thickness should be minimized so as to limit the amount of wet etching required to fully open the n-contact via while being thick enough to protect the nitride device layers from direct exposure to the dry etch process. In general this thickness will vary between dry etch chemistries and conditions, though typically a thickness of 25 to 500 nm is preferred with a thickness below 100 nm being more preferred.

In another embodiment, a single mode laser ridge is etched using a dry etch process using photo-resist and standard lithographic techniques to pattern the ridge. Ridges of lasers with only a single transverse mode are typically quite narrow, less than 3 microns in width and frequently close to one micron in width. In this case, it would be difficult using standard lithographic techniques to pattern and etch a via that only overlaps with the top of the laser ridge. In this embodiment, a thin film of passivating oxide is deposited after the ridge etch. An undercut or bi-layer photo-resist is used such that oxide is deposited on the ridge sidewalls and may overlap 50 to 200 nm of the top of the ridge at the ridge edges. The photoresist is then removed to reveal the top of the laser ridge, which can then be contacted with a metal pad with a shape defined by standard lithography techniques. It is preferred that the metal contact pad not extend beyond the edges of the transferred die. A blanket (i.e. without resist or mask) deposition of silicon oxide is them performed, with the oxide thickness being greater than 500 nm and less than 6 microns, such that the ridge region, facet regions and exposed carrier wafer regions are covered with oxide. The wafer is then patterned with a first facet region using photo-resist and standard lithographic techniques and a lithographically defined mirror pattern is etched into the oxide hard mask using a dry-etch technique such as ICP, ME, RIBE, ion mill or CAIBE. Chemistries for these dry etches would preferably contain fluorine, but may also contain one or more of methane, chlorine, oxygen, argon and hydrogen. The first facet region of the device layers is then etched using a dry-etch technique such as ICP, RIE, RIBE, ion mill or CAIBE. In the case of group-III nitride device layers a chlorine-based etch chemistry may be used. The wafer is then patterned with a second facet region using photo-resist and standard lithographic techniques as done with the first facet region. A protective mask of photoresist is applied to cover the first etched facet region, with the photo-resist region preferably extending at least 10 microns beyond the edge of the first etched facet region. A second lithographically defined mirror pattern is etched into the oxide hard mask using a dry-etch technique such as ICP, ME, RIBE, ion mill or CAME using etch chemistries similar to those used in the first facet etch. The second facet etch may be carried out at elevated temperature because since the protective patch of photo-resist is present only to cover the first etched facet and prevent damage from the second facet etch, reflow of the protective photo-resist will not affect the roughness or angle of the second etched facet. The protective photo-resist is then removed using either photo-resist stripper, photo-resist developer, a dry-etch or ashing process or some other process for removing organic materials. In order to make electrical contact to the top of the metallic contact pad, a window or via in the oxide hard-mask above the top of the laser ridge is defined using standard lithographic techniques. The via is then produced by wet or dry etching of the remaining oxide hard mask. Because the metallic contact pad is wider than the laser ridge and is electrically isolated from the ridge and mesa by the thin oxide layer deposited after ridge etch, the via in the hard mask may be formed with much looser tolerances for size and position without risking electrical contact to the mesa off of the ridge. The metal contact pad also protects the nitride device layers from direct exposure to the dry etch process.

High-power, multi-mode devices operating with optical outputs of one or more watts may have ridges with widths in the range of 15-50 microns or larger. In these devices it is possible to place an n-contact pad, narrower than the ridge width, directly on top of the laser ridge without the need for a passivating oxide layer to accommodate errors in lithography. In an embodiment, a multimode laser device is fabricated with a ridge width greater than 6 microns. Photoresist and standard lithographic techniques are used to pattern an n-contact with a width of 4 microns on top of the laser ridge using a lift-off process such that the metallic n-contact is nominally inset from the ridge edges by 1 micron on either side. A 2 micron thick blanket oxide is then deposited to act as both a hard mask for facet formation and a passivation layer to electrically isolate the device layer mesa from subsequently deposited metal bond pads. In order to electrically connect to the n-contact, a via is etched through the passivating oxide layer using standard lithographic techniques and a dry etch process. In one example the via width is chosen such that it is nominally inset from the n-contact pad by 1 micron on either side such that the portion of ridge top not covered by contact metal is not exposed to the dry etch process during the via etch.

In an alternative embodiment, a laser ridge is etched using a dry etch process using photo-resist and standard lithographic techniques to pattern the ridge. A blanket (i.e. without resist or mask) deposition of silicon oxide is them performed, with the oxide thickness being greater than 500 nm and less than 6 microns, such that the ridge region, facet regions and exposed carrier wafer regions are covered with oxide. The wafer is then patterned with both the first facet region such as the front facet and the second facet region such as the back facet using photo-resist and standard lithographic techniques and a lithographically defined mirror pattern is etched into the oxide hard mask using a dry-etch technique such as ICP, ME, RIBE, ion mill or CAIBE. Chemistries for these dry etches would preferably contain fluorine, but may also contain one or more of methane, chlorine, argon and hydrogen. The first and second facet regions of the device layers are then etched using a dry-etch technique such as ICP, RIE, RIBE, ion mill or CAIBE. In the case of group-III nitride device layers a chlorine-based etch chemistry may be used. In this preferred "single-mask" process the etch is performed on the first and second facets at the same time using a technique such as a tilted and rotated using a CAIBE or RIBE process, a static or rotating surface normal etch using an ICP, ME, CAIBE, or RIBE process with a very vertical etch profile, or using a tilted etch for each facet using a CAIBE or RIBE process wherein a first facet region is etched at a first tilt angle, the tilt angle is then changed and the second facet regions are etched. In order to make electrical contact to the top of the laser ridge, a window or n-contact via in the oxide hard-mask above the top of the laser ridge is defined using standard lithographic techniques. The via is then produced by wet or dry etching of the remaining oxide hard mask. When the device layer comprising the top of the laser ridge is exposed by the n-contact via dry-etch, a metal contact can be made using a standard lithographic lift-off technique.

Due to the hybrid or composite nature of this invention wherein GaN device layers are transferred to a carrier wafer, the etched facet process was determined to be substantially more challenging than etching facets in device layers still overlaying the bulk substrate. This required substantial development and consideration. For example, when the facet etch process is carried out at a point in the process after the transfer of semiconductor device mesas to the carrier wafer it is important for the etch process to be carried out in a way that accounts for the bond media used in transferring the mesa. For example, in some embodiments the facet etch-process etches through the complete thickness of the semiconductor device mesa. At the point when the etch penetrates through the device mesa the bond media is exposed and can be etched by the facet etch process. This can have several negative consequences derived from the risk that the bond media material may be physically or chemically etched and subsequently redeposited on the etched facet. Firstly, if the redeposited material is not easily removed with subsequent cleaning then it may act as a source of scattering or absorption of light from the guided mode. The second potential negative outcome is that the bond media reposition on the facet may lead to a micromasking process, i.e. local masking of the facet by redeposited bond-media that leads to roughening of the etched facet.

In some embodiments, a gap is provided in the bond media in the region of the die where the facet will be etched or an alternative material such as an oxide is included in this region to fill what would be a gap region. In these embodiments, there is still substantial consideration that must be taken to the redeposition of the carrier material or the gap filler material once the etch penetrates the device layers. This redeposition can degrade the facet morphology through a masking effect or other effect and lead to degraded device performance. Moreover, the redeposition can lead to reliability issues. There is also a gap in the bond media on the carrier wafer corresponding to the region on the transferred wafer where the facet will be etched. A schematic representation of the transferred die in cross-section is shown in FIG. 11b. After transfer of the device die to the carrier wafer a region of the die corresponding to the region of the facet etch is left suspended in a so-called "air-bridge" configuration that leaves it unsupported.

In several embodiments according to this invention vertical and smooth facets are desired for optimum reflectivity and normal edge emission. In other embodiments the facets may be intentionally angled to direct the light output at some desired light output direction. For example, the facets could be etched at about a 45 degree angle to direct light emission in more of a vertical direction upward or downward from the chip surface. This would create a surface emission device ideal for coupling in fibers or optical systems, or arraying the laser output to combine the outputs. In alternative embodiments the facets are angled to reduce the reflectivity and create a SLED device. In some embodiments the facets may be made intentionally rough to reduce the reflectivity.

In a preferred embodiment, a GaN based laser diode device dice are transferred to a SiC carrier wafer. A schematic representation of the bonding and facet formation are shown in FIG. 11b. The GaN-based laser diode device dice 103 are overlaid by a gold bonding layer 104. The SiC carrier wafer 106 is overlaid with patterned Au bonding layers 105. The Au bonding layers are separated into two regions comprising, respectively the active portion of the laser device 101 and an "anchor region" 102 where the bond media overlays the sidewalls of the device die and connects with the cathode metal to form metallic anchors as described previously. Between the active and bonding regions of the die there is a region with no bond media. Once transferred to the carrier wafer, the region on the die with no bond media overlays a region on the carrier wafer with no bond media, thereby providing an "air bridge" region of the device die that is not supported from beneath by bond media. After transfer of die to the carrier, a hard-mask layer 107 comprised of silicon oxide is deposited and patterned using standard lithographic techniques as described previously. The oxide hard-mask is removed in a "facet formation region" that overlays the region of the device die between the regions 101 and 102. A dry etch process selected from RIE, ICP or CAIBE is used to etch the device die in the facet formation region, resulting in the formation of a vertical and smooth facet 108. Because the facet dry etch process is carried out in a region with no Au bond media, there is no risk that Au will be sputtered and subsequently redeposited on the etched facets or other structures of the device die. A singulation process, such as laser scribing followed by breaking, mechanical scribing with diamond scribes followed by breaking and sawing, among others, can be used to separate or singulate the device die from the carrier wafer. The parting line 109 is the position where the edge of the resulting device chip is located. In the example of singulation by laser scribing the position 109 would correspond to the location of laser scribing. In the example of singulation using a sawing process, where the saw blade kerf, or width of material removed, is relatively large, i.e. greater than 10 microns, the parting line 109 corresponds to the edge of the blade cut-region defining the edge of the device chip.

In the previous embodiment, the facet region is a point of concern. The facet etch region of the die is only supported from either end, such that for very wide facet etch regions, greater than 20 microns, or for very thin device die, thinner than 2 microns, the facet region may bend under its own mass or be likely to break during processing. In another embodiment, also referencing FIG. 11b, the bond media is also gold, however the region between the active portion of the laser device 101 and an anchor region 102 is overlaid with a silicon oxide layer of the same thickness as the Au bond layer 104. The corresponding regions on the carrier wafer a configured similarly, with a gold bond layer 105 and the region between area between the laser device 101 and an anchor region 102 overlaid with a silicon oxide layer of the same thickness as the gold bond layer 105. In this embodiment, the facet formation region is fully supported by the oxide layers, while the oxide layers provide a layer beneath the facet etch region that has a similar chemical composition as the facet etch hard-mask. This is advantageous in that by supporting the facet etch region from beneath, the facet etch region can be made arbitrarily wide without the risk of bending or breaking of the die during processing. Moreover, because the material supporting the facet etch region has a similar chemical composition as the facet etch hard-mask material it is possible to over-etch the facet region without etching a material that is incompatible with the facet etch process.

In alternative embodiments the facets are formed in the epitaxial device layers of the transferred gallium and nitrogen containing layers using a cleaving process. The cleaving process can be carried out using the methods previously described in this invention such as using a scribing and breaking process. The scribing can be achieved with a laser scribe process, a saw scribing process, a diamond scribe process or other. The scribe could be formed in the carrier wafer, in the transferred epitaxial layer region, or in a combinations of both regions. The scribe would form an initiation point or stress riser for the breaking process and would induce a nice cleavage surface in the epitaxial device layers and in some cases in the carrier wafer.

In yet an alternative embodiment, the facets are formed with a sawing process. In a sawing process a rapidly rotating blade with hard cutting surfaces like diamond are used, typically in conjunction with spraying water to cool and lubricate the blade. Example saw tools used to commonly dice wafers include Disco saws and Accretech saws. In one example a diamond blade rotary saw is used to cut through both the carrier wafer and the transferred epitaxial layers to result in a relatively smooth and vertical facet surface in the epitaxial layers. In fact, it was discovered that by using the proper blades and sawing conditions that pristine facets can be achieved in the gallium and nitrogen containing device layers. This embodiment is attractive because it is possible to combine the bar dicing process with the facet formation process to simplify the process. In alternative examples, a combination of multiple sawing steps such as making multiple cuts to achieve a good facet region and bar singulation. In yet alternative examples, sawing steps and cleaving steps, sawing, cleaving, and/or etching steps are combined. Many combinations can be included according the present invention.

As described previously, the facet region of the device is preferably fabricated using a dry-etch technique such as ICP, RIE, RIBE, ion mill or CAIBE, but could be others such as cleaving or sawing. The facet is preferably vertical and highly smooth such as to act optimally as a mirror for reflecting light back into the laser cavity with minimal loss from scattering. Optical coatings are disposed on the facet regions to control the reflectivity of the facets. For example, the highly reflective back facet may be coated with alternating layers of dielectrics with differing refractive indices such that a distributed bragg reflector (DBR) with high reflectivity (>99.5% at the lasing wavelength) is formed. Suitable dielectrics include: AlN, Al2O3, SiO2, SiN, Ta2O5, among others. Typically the front, or light emitting, facet of a laser cavity is coated with a dielectric film designed to fix the reflectivity at some target value. In some embodiments, the front facet coating is an anti-reflective coating intended to lower the reflectivity of the front facet. In other embodiments, the front facet coating is a DBR intended to increase the reflectivity above that of the bare facet. In many embodiments, the facets are etched midway through the fabrication process and are exposed to chemicals and surface treatments that while necessary for the completion of subsequent processing steps, may result in damage to the facet. Even minor roughening of the facet may lead to significant changes in reflectivity. In conventional laser fabrication, the facets are formed by cleaving the laser device wafers into bars at the end of the fabrication process. The front and back facet coatings are then deposited on the laser bars using one or more of electron beam (e-beam) evaporation, sputtering, chemical vapor deposition (CVD), plasma enhanced chemical vapor deposition (PECVD), electron cyclotron resonance (ECR) based deposition, among others such as atomic layer deposition (ALD). In some preferred embodiments a low damage high quality passivation layer such as AlN, SiN, $Al_2O_3$, or AlON of between 1 nm and 50 nm is deposited as a first layer on the facet. This passivation layer is typically crystalline such as polycrystalline or single crystalline and can preferably be formed using technique such as ECR or ALD. In some embodiments the passivation layer is applied to the facets directly after facet etch and in some cases without breaking vacuum such as in an ALD process. In other cases facet protect layers can be used as facet coating layers. The facets are in effect passivated by the coatings and protected from degradation due to chemical or environmental exposure.

In this invention, the facets are preferably formed using an etch process. In many embodiments, the facet etch occurs midway through the processing of the GaN mesas after they have been transferred to the carrier wafer. In other embodiments, the facets are etched on the GaN mesas prior to the selective removal of the sacrificial layers. In either case, the facets are then exposed to all subsequent processing steps during the fabrication of the laser devices. In order to protect the facet from chemical or mechanical damage during processing a facet protect layer may be overlaid on the etched facet to form a protective barrier. The protect layer may be left of the facet for one or more processing steps and is, in general, removable with a process that is benign to the facet. For example one could use silicon oxide as a protect layer and remove it with a solution of HF acid. Another example would be to use Ge as a protect layer and remove it with a dilute H2O2 solution. Other materials that may be used for facet protect layers include: silicon nitride, Ta2O5, SiN, AlN and Al2O3, among others. It is preferable for the protect layer thickness to be optimized such that it is thick enough to prevent chemical or mechanical damage to the facets while also thin enough to be easily removed using processes that are benign to the rest of the laser device structures. For example, the facet protect layer could be comprised of silicon oxide with a thickness greater than 10 nm and less than 500 nm. In this example, the facet protect layer is removable with a dilute solution of HF acid where the oxide etch rate is on the order of several hundred nm per minute. Removal in weak solutions of HF for periods less than 5 minutes is ideal as regions of the device far from the facets can be protected with photoresist. Short etch times limit the ability of the dilute HF solution to permeate the photoresist mask nor intrude under the edge of the photoresist mask.

In an embodiment, GaN device layers are transferred to a carrier wafer. Laser ridges are then etched into the mesas followed by the deposition of an oxide hard mask. The facet etch regions are then patterned in the oxide hard mask and a dry etch process is used to etch the facets on the device layers. A silicon oxide facet protect layer with a thickness of 200 nm is then overlaid on the facets using a blanket deposition process such as PECVD, e-beam evaporation, sputtering, or the like. Immediately prior to singulation of the carrier wafer into bars of laser devices the facet protect layer is removed using a wet etch in a dilute solution of HF acid. In some embodiments, the carrier wafer is patterned with photo-resist such that only the facet regions are exposed to the dilute HF, thereby allowing for removal of the facet protect layer while protecting other portions of the devices which may be damaged by HF acid.

In some embodiments, the protect layer is designed to be left on facet such that it is incorporated into the coatings on the facet. For example, the silicon oxide coating thickness may be adjusted such that it forms the first layer in the DBR coatings of the front and back facets. In another example, the oxide protect layer is chosen to have a thickness of roughly one-quarter of the lasing wavelength such that it acts as an anti-reflective coating and has minimal effect on the performance of highly-reflective and anti-reflective coatings overlaid on it.

In some embodiments, the facet may be protected using photoresist during processing steps that may otherwise not require patterning. For example, during singulation of devices from the carrier wafer it is possible for the facets to be damaged. Singulation may be carried out by a number of methods such as laser scribing and breaking of the carrier and sawing of the carrier. In both processes, particles of carrier wafer material are released from the carrier and may either adhere to the facet surface or contact it in a way that results in roughening. This can be avoided by coating the carrier wafer in a substance such as photoresist which is easily removed using solvents and which prevents contact between the facets and the material liberated from the carrier wafer during the singulation process. The photoresist is then removed from individual bars using solvents or dedicated photoresist strippers.

In another embodiment of the invention the laser die are also characterized by a third pitch characterizing their spacing on the substrate parallel to the laser ridge. The third pitch is often a design width that is suitable for fabricating each of the laser die into laser devices. For example, a substrate containing lasers with laser cavities about 1 mm in length may have laser die fabricated at a third pitch of about 1.05 mm to about 2 mm, but preferably the third pitch is less than about 10% longer than the laser cavities fabricated on the laser die.

In an example, these die are then transferred to a carrier wafer at a second and fourth pitch where the second pitch is greater than the first pitch and the fourth pitch is greater than the third pitch. Laser facets are produced by an etched facet process as described above. The increase in distance between the laser die due to the fourth pitch allows for easy integration of elements in front of the laser facets while the second die pitch allows for easy mechanical handling and room for wire bonding pads positioned in the regions of carrier wafer in-between epitaxy mesas, enabling a greater number of laser diodes to be fabricated from substrate and overlying epitaxy material. FIG. 18 shows a schematic of the transfer process including both a second and fourth pitch on the carrier wafer.

In another embodiment of the invention die singulation is achieved by cleaving processes which are assisted by the choice of carrier wafer. For example, if a silicon or GaAs carrier wafer is selected there will be a system of convenient cubic cleave planes available for die singulation by cleaving. In this embodiment there is no need for the cleaves to transfer to the epitaxy material since the die singulation will occur in the carrier wafer material regions only.

In another embodiment of the invention any of the above process flows can be used in combination with the wafer tiling. As an example, about 7.5 mm by about 18 mm substrates can be tiled onto about a 2 inch carrier wafer, allowing topside processing and selective area bonding to be carried out on multiple epitaxy substrates in parallel for further cost savings.

In another embodiment of the invention the substrate wafer is reclaimed after the selective area bond steps through a re-planarization and surface preparation procedure. The epitaxy wafer can be reused any practical number of times.[6]

In an example, the present invention provides a method for increasing the number of gallium and nitrogen containing laser diode devices which can be fabricated from a given epitaxial surface area; where the gallium and nitrogen containing epitaxial layers overlay gallium and nitrogen containing substrates. The epitaxial material comprises of at least the following layers: a sacrificial region which can be selectively etched using a bandgap selective PEC etch, an n-type cladding region, an active region comprising of at least one active layer overlying the n-type cladding region, and a p-type cladding region overlying the active layer region. The gallium and nitrogen containing epitaxial material is patterned into die with a first die pitch; the die from the gallium and nitrogen containing epitaxial material with a first pitch is transferred to a carrier wafer to form a second die pitch on the carrier wafer; the second die pitch is larger than the first die pitch.

In an example, each epitaxial die is an etched mesa with a pitch of between about 1 µm and about 10 µm wide or between about 10 micron and about 50 microns wide and between about 50 and about 3000 µm long. In an example, the second die pitch on the carrier wafer is between about 100 microns and about 200 microns or between about 200 microns and about 300 microns. In an example, the second die pitch on the carrier wafer is between about 2 times and about 50 times larger than the die pitch on the epitaxy wafer. In an example, semiconductor laser devices are fabricated on the carrier wafer after epitaxial transfer. In an example, the semiconductor devices contain GaN, AlN, InN, InGaN, AlGaN, InAlN, and/or InAlGaN. In an example, the gallium and nitrogen containing material are grown on a polar, non-polar, or semi-polar plane. In an example, one or multiple laser diode cavities are fabricated on each die of epitaxial material. In an example, device components, which do not require epitaxy material are placed in the space between epitaxy die.

In another embodiment of the invention the carrier wafer is another semiconductor material, a metallic material, or a ceramic material. Some potential candidates include silicon, gallium arsenide, sapphire, silicon carbide, diamond, gallium nitride, AlN, polycrystalline AlN, indium phosphide, germanium, quartz, copper, gold, silver, aluminum, stainless steel, or steel.

In common laser packages like the TO canister, the laser device is indirectly attached to the body of the package which is itself soldered or otherwise attached to a heat sink with a method providing high thermal conductivity. To prevent shorting of the laser diode to the package a submount is provided between the laser diode material and the package. The submount is a thin layer of material that is both a good thermal conductor and electrically insulating. Submount materials include aluminum nitride, sapphire (Al2O3), beryllium oxide and chemical vapor deposited diamond which offer good thermal conductivity but low electrical conductivity.

In another embodiment of the invention the carrier wafer material is chosen such that it has similar thermal expansion properties to group-III nitrides, high thermal conductivity and is available as large area wafers compatible with standard semiconductor device fabrication processes. The carrier wafer is then processed with structures enabling it to also act as the submount for the laser device. In some embodiments the facets of laser devices may be formed by bonding the laser dice to a carrier wafer that cleaves easily. By aligning the laser dice such that the intended plane of the facet is coplanar with an easily cleaved plane of the single-crystal carrier wafer. Mechanical or laser scribes can then be used, as described above, to guide and initiate the cleave in the carrier wafer such that it is located properly with respect to the laser die and carrier wafer patterns. Zincblende, cubic and diamond-lattice crystals work well for cleaved carriers with several sets of orthogonal cleavage planes (e.g. [110], [001], etc.). Singulation of the carrier wafers into individual die can be accomplished either by sawing or cleaving. In the case of singulation using cleaving the same cleavage planes and techniques can be used as described for facet formation. This embodiment offers a number of advantages. By combining the functions of the carrier wafer and submount the number of components and operations needed to build a packaged device is reduced, thereby lowering the cost of the final laser device significantly. Selection of the carrier wafer with high thermal conductivity (e.g. greater than about 150 K/mW) allows for the use of full thickness carrier wafers (e.g. >about 300 microns) with low thermal resistance, therefore no thinning of the carrier wafer is required.

In an example, SiC is used as both a carrier and a submount. SiC is available in wafer diameters up to about 150 mm from multiple vendors with high thermal conductivities ranging from about 360-490 W/mK depending on the crystal polytype and impurities. FIG. 12 shows a schematic of the cross section of a SiC wafer 402 used as both a carrier wafer and a submount. Before transfer of the laser device material the SiC wafer is fabricated with a bonding layer 401 for attachment to the laser device package. The opposing face of the SiC wafer is fabricated with a thin, electrically insulating layer 403, electrically conductive traces and wire-bond pads 405 and an electrically conductive bonding media 108. The laser device material is then transferred to the carrier via previously described processes. Electrical isolation layers 408 are fabricated on the wafer using standard lithographic processes and electrical contacts and wire bond pads 407 are made to the top-side of the laser device. The electrical isolation layers are important to insure that the laser devices are electrically isolated from the laser package or heat sink, which is typically grounded to the rest of the laser system. The passivation layers can be located either between the carrier and the epitaxial die or on the side of the carrier wafer that is bonded to the package or heat sink. The individual dice can be singulated from the SiC wafer and packaged. SiC wafers are available in many polytypes including the hexagonal 4H and 6H as well as the cubic 3C. The high thermal conductivity of SiC allows for using commercially available SiC wafers as submounts without thinning. In some embodiments the insulating layer 403 is placed between the SiC substrate 402 and the bonding layer 401. This allows for the SiC wafer to be used to electrically access the die or to act as a common electrode for many die as shown in FIGS. 15 and 17.

In one embodiment, laser dice are transferred to a carrier wafer such that the distance between die is expanded in both the transverse (i.e. normal to the laser ridge direction) as well as parallel to the laser cavities. This can be achieved, as shown in FIG. 13, by spacing bond pads on the carrier wafer with larger pitches than the spacing of laser die on the substrate. It should be noted that while technically feasible to use cleaved facets in such a configuration, etched facets would be a simpler process to implement. This is due to the need for the transferred die to be of finite length in all directions, such that cleaved facets would result in the expanded area in front of the die being removed during the cleaving process.

In another embodiment of the invention laser dice from a plurality of epitaxial wafers are transferred to the carrier wafer such that each design width on the carrier wafer contains dice from a plurality of epitaxial wafers. When transferring die at close spacings from multiple epitaxial wafers, it is important for the untransferred die on the epitaxial wafer to not inadvertently contact and bond to die already transferred to the carrier wafer. To achieve this, die from a first epitaxial wafer are transferred to a carrier wafer using the methods described above. A second set of bond pads are then deposited on the carrier wafer and are made with a thickness such that the bonding surface of the second pads is higher than the top surface of the first set of transferred die. This is done to provide adequate clearance for bonding of the die from the second epitaxial wafer. A second substrate which might contain die of a different color, dimensions, materials, and other such differences is then used to transfer a second set of die to the carrier. Finally, the laser ridges are fabricated and passivation layers are deposited followed by electrical contact layers that allow each dice to be individually driven. The die transferred from the first and second substrates are spaced at a pitch which is smaller than the second pitch of the carrier wafer. This process can be extended to transfer of die from any number of substrates, and to the transfer of any number of laser devices per dice from each substrate.

In some embodiments, multiple laser die are transferred to a single carrier wafer and placed within close proximity to each other. Dice in close proximity are preferably within one millimeter of each other, more preferably within about 200 micrometers of each other and most preferably within about 50 microns of each other. The die are also bonded such that when laser cavities and facets are fabricated the optical axes of the emitted laser beams are aligned to each other to less than about 5 degrees and more preferably less than about 1 degree and most preferably less than about 0.5 degrees. This has the advantage of simplifying the optical elements needed to couple laser light from laser devices fabricated on the several laser dice into the same system elements, e.g. lenses, fiber optic cables, other waveguide elements, etc.

In some embodiments, semi-insulating SiC may be used, such that the SiC wafer is itself electrically isolating and electrical isolation layers need not be used.

FIG. 13a is a schematic representation of a laser device in accordance with an embodiment of this invention. The carrier wafer contains multiple, conductive through-vias 309 per die, with each through-via being overlaid on both sides of the carrier wafer with a metallic pad 310. The device mesa is transferred to the carrier wafer and patterned with a ridge. The bond pad on the carrier wafer is electrically connected to one of the through vias. A metal electrode is deposited on top of the ridge and is connected to the metal pad of one of the through-vias. A dielectric material is overlaid on the carrier such that the device mesa and electrical interconnects are fully encapsulated by the dielectric. A planarization process such as lapping is used to planarized the dielectric and leave a thin (less than 10 micron thick and preferably less than 1 micron thick) layer of dielectric above the metal electrode on top of the laser ridge. The planarized dielectric is then overlaid with a bond pad 308 which is used to solder the device to a heat sink such that the backside metal contacts are accessible for electrically contacting the laser device.

In some embodiments, it is desirable to extract heat away from the laser device layers in a direction that is not primarily through the carrier wafer material. This can be achieved by processing the transferred mesas such that resulting laser device can be soldered or bonded to a heatsink such that the laser device layers are positioned between the carrier wafer material and the heat sink. In an embodiment, one or more laser dice are bonded to a carrier wafer consisting of an electrically insulating material and containing metal-filled through vias. The carrier wafer may consist of single or poly-crystalline AlN, single or poly-crystalline semi-insulating SiC, BN, semi-insulating silicon and quartz among others. The through vias provide an electrical path for contacting the laser devices from the backside of the carrier wafer, and can either be filled with a conductive compound such as a metal-containing epoxy or paste, or they may be plated with metal or plated with metal in conjunction with a non-conductive material to fill the hole. It is preferred for the vias to be filled to reduce the likely hood of bubbling of photo-resist or disruption of photo-resist planarity during processing of the devices.

After the laser ridge is fabricated, electrical contacts are deposited on the ridge top and electrical connections are made to both the first and second through vias the device side of the carrier wafer is planarized. This is accomplished by first passivating the surface with a thick, electrically insulating material either using a spin-on dielectric such as BCB or a physical or vapor based deposition process. A planarization process is then used to produce a flat surface suitable for soldering either with a dry-etching or lapping process. For a spin-on dielectric this can be achieved by spinning on a layer of dielectric precursor thick enough such that when the spin on dielectric is cured all features of the laser device are fully encapsulated by the dielectric layer. Spin on dielectrics tend to be self-planarizing in the sense that surface tension tends to flatten the free surface of the film before curing, however further planarization can be achieved by use of the an isotropic dry etch or a lapping process. Typically the spin on dielectric film thickness would need to be two to four times thicker than the highest feature of the laser device in order to insure adequate coverage for planarization. A similar planarization can be achieved by depositing dielectrics using a chemical vapor deposition or e-beam based process. In this case, the deposition must be conformal enough to fully passivate the laser device while also being thick enough that a lapping or anisotropic dry etch can be used to remove high and low spots. After planarization, only a very thin layer of dielectric remains above the laser device layers. This layer is preferably fully dense, without pinholes that would lead to electrical shorting, while at the same time being thin enough that the thermal impedance of the layer is minimal. In general this layer should be less than one micron thick above the laser device layers. More preferably the dielectric layer above the laser device layers would be less than 250 nm thick.

One or more metal bond pads are then deposited on the planarized surface such that the device can be soldered to a heat-sink with the laser device between the heat sink and the carrier wafer. The metal through-vias then provide a means of electrically accessing the laser device with probes, clips or wire bonds. This embodiment has two advantages. The first is that the laser device is soldered directly to the heat sink, rather than via the carrier wafer, which may reduce thermal impedance in the path directly between the light emitting region of the device and the heat sink. The second is that a high thermal-conductivity carrier wafer can be used as a secondary heat spreader to extract heat from the laser device in the direction away from the heat sink and conduct it laterally through the carrier wafer and thereby lowering the total thermal resistance of the device. A schematic representation of this embodiment is shown in FIG. 13a.

In another embodiment, the heat sink acts as an electrode for the device and only one through via is needed to give electrical access to the other electrode of the laser device. A schematic representation of this embodiment is shown in FIG. 13b.

FIG. 13b schematic representation of a laser device in accordance with an embodiment of this invention. The carrier wafer 303 is an insulating material containing through vias 307 that are either filled with a conductive material, have inner surfaces coated in a conductive material, or have inner surfaces coated in a conductive material as well as a filler material. Conductive bond media 306 is overlaid on the carrier such that it is electrically connected to the through via which is connected to a conductive electrode 304 overlaid on the back of the carrier wafer. A device mesa is transferred to the carrier and overlays the bond media. A laser ridge is patterned into the mesa 305. A dielectric material 302 is overlaid on the carrier wafer, with the top of the laser ridge exposed. A metal contact layer 301 is deposited, overlaying both the top of the laser ridge and the top of the dielectric material. A polishing or dry etch based planarization process is used to planarized the dielectric material and the contact layer such that the contact layer can be used as a solder pad for bonding the device to a heat sink.

In another related embodiment, the heat sink is patterned with electrically isolated bond pads such that both the laser cathode and anode connections can be made via the heat sink. In this embodiment, through-vias in the carrier wafer are not needed.

As an example, laser die from a red emitting AlInGaAsP laser device wafer (emitting at a wavelength between 600 and 700 nm, but preferably between 620 and 670 nm), a green emitting GaN laser device wafer (emitting at a wavelength between 500 and 600 nm, but preferably between 510 and 550 nm) and a blue emitting GaN laser device wafer (emitting at a wavelength between 400 and 500 nm, but preferably between 430 and 470 nm) could be transferred to a single carrier wafer. Laser cavities, mirrors and electrical contacts could be processed on the die and carrier wafer using standard lithographic processes with structures similar to those described above such that laser devices on each dice are individually addressable and can be driven separately. Facets would be fabricated either with a dry etch process (e.g. RIE, ICP or CAIBE) or by cleaving the carrier wafer. After singulation, the resulting laser chip would have an effective emitter size similar to a standard laser diode device (i.e. less than about 200 microns) and would allow for red-green-blue color mixing. Such an RGB laser chip would greatly simplify the design and fabrication of a laser light source for projection and display applications. The laser devices would all be aligned to each other and closely spaced (i.e. within about 10-100 microns), thereby reducing fabrication cost by removing both the need to provide separate optical elements such as lenses and to separately align all emitters with the system optics.

In another embodiment, multiple die from multiple epitaxial wafers are transferred to the same carrier wafer with the laser die overlaid. FIG. 25 shows a schematic of the cross section of a carrier wafer during various steps in a process that achieves this. Die 502 from a first epitaxial wafer is transferred to a carrier wafer 106 using the methods described above. Laser ridges, passivation layers 104 and ridge electrical contacts 105 are fabricated on the die. Subsequently bond pads 503 are deposited overlaying the ridge electrical contacts. A second substrate 506 which might contain die of a different color, dimensions, materials, and other such differences is then used to transfer a second set of die 507 to the carrier at the same pitch as the first set of die. Laser ridges, passivation layers and ridge electrical contacts can then be fabricated on the second set of die. Subsequent die bond and laser device fabrication cycles can be carried out to produce, in effect, a multiterminal device consisting of an arbitrary number of laser die and devices as shown in cross section in FIG. 22.

In some embodiments of an RGB device fabricated according to this invention, the device will have individual laser or SLED devices spatially located much more closely than is practical with conventional technology. Even with this improvement, it is possible that there will be artifacts in a final imaged spot from the three wafers when they are collimated and focused through the same set of optics. For example, it is possible depending on the particular nature of the system that a 10-50 micron separation between emitters could result in a variation in projected location of the individual spots by a distance that is similar to some multiple of the pixel spacing in the final image. This would result in degraded image quality as the individual color channels would be noticeably separated in the final image or illuminated spot. One solution to this problem is to include a waveguide on the laser device chip that acts to combine the beams in a way that overlaps them or moves them closer together.

FIG. 25f shows a schematic representation of a RGB laser chip utilizing a dielectric waveguide patterned on the carrier wafer to combine individual laser beams. The laser carrier chip 301 is cut from the carrier wafer. Three laser or SLED devices 302 are transferred to the laser chip. A dielectric waveguide 304 is deposited and patterned on the carrier utilizing standard lithographic processes. In this case, the emitted laser light is combined from three separate waveguides, combined into one waveguide and emitted from the dielectric waveguide end 305. FIG. 25g shows a schematic representation of a RGB laser chip utilizing a dielectric waveguide patterned on the carrier wafer to combine individual laser beams. The laser carrier chip 201 is cut from the carrier wafer. Three laser or SLED devices 202 are transferred to the laser chip. A dielectric waveguide 205 is deposited and patterned on the carrier utilizing standard lithographic processes. Patterned features of the waveguide such as total-internal reflection based turning mirrors 204 can be included to turn the emitted laser light. In this case, the emitted laser light is turned at a 90 degree angle and emitted from the dielectric waveguide end 206.

In an embodiment, the patterned waveguide is formed from a dielectric. This dielectric can be one or more of spin-on glass such as BCB, PECVD or sputtered silicon oxide or silicon nitride, oxynitrides, polydimethylsiloxane, and silicones among others. The waveguide can be structured with a core or relatively high index material and cladding of low index, patterned material. The waveguide can consist of a core only, utilizing vacuum or atmosphere as a low-index cladding. The waveguide can be structured to utilize the carrier wafer material as part of the waveguide cladding. In all cases, the emitting end of the waveguide may be coated with an anti-reflective coating to limit back-reflections and coupling of the waveguide to the laser devices.

In a specific embodiment, the patterned waveguide utilizes turning mirrors patterned into the shape of the waveguide to change the direction of the laser light. As in FIG. 25g, these mirrors can be used to reduce the distance of separation between the beams. In FIG. 25g it can be seen than appropriate choice of the turning mirror dimensions and distance from the emitting facets of the laser or SLED devices allows the separation to be reduced from the spacing of the devices d1 to a smaller spacing d2. The turning mirrors can be flat, resulting in only a turning of the beam, or they can be curved to allow for a focusing of the laser light in one dimension. For example, a turning mirror with an appropriate parabolic shape could be used to turn as well as partially or fully collimate the laser light. Here the design restrictions are that the apparent focal point of the divergence of the laser light after being emitted from the emitting facet of the laser would need to be aligned spatially with the focal point of the parabolic mirror. Dielectric or metallic coatings could be used to increase the reflectivity of the turning mirrors. Because the dielectric waveguide is not being used to recycle light the reflectivity of the turning mirror only needs to be relatively high and not about 99.9%. Silver, for example, or aluminum may have sufficiently high reflectivity depending on the wavelength of the laser light. Multi-layer dielectric bragg reflectors could also be used, with layers fabricated from Si, Al and Ta containing oxides and nitrides among other dielectric materials.

In a specific embodiment, the patterned waveguide utilizes a forked waveguide 304 that combines the laser light into a single beam by joining the waveguides into a single branch. Careful design of the waveguide shape must be made to limit loss from scattering at regions where the waveguides a joined.

Of course there are other examples of waveguide and free-space beam combining technologies that could be included in the present invention.

As an example, FIG. 26 shows various ways that three dice from the same or different substrates can be individually addressed electrically such that laser devices fabricated on each dice can be operated independently. FIGS. 26 (A) and (B) show a plan view and cross section of a single repeat unit on the carrier wafer, here called a "chip". Three electrically conductive bond pads 602 are provided for bonding dice from one or more substrates. The bond pads are connected electrically via the conductive carrier wafer to a common electrode that also serves as a bond pad for soldering to a submount, heat sink or otherwise integrating into a system. Top side electrical contacts are deposited and are extended from the laser dice to wire-bond pads 603 located in an area of the chip not containing laser dice. The metal traces and pads are isolated from the carrier wafer by an insulating layer 606. FIGS. 26 (C) and (D) show a similar chip where the bottom-side electrical contact is made from a conductive layer 604 deposited on the front side of the chip. In this example the topside electrical connections and chips are isolated by insulating layers 606 from each other as well as the carrier wafer and the bond pad on the bottom of the chip is only used for mounting and providing good thermal conductivity. FIGS. 26 (E) and (F) show a similar chip where the laser dice are connected to a common electrode on their bottom sides via the carrier wafer. In this configuration electrical access to the carrier wafer is made through a top-side wire-bond pad 604 rather than through the bottom side of the carrier wafer.

As an example, FIG. 28 shows a similar configuration of multiple laser dice transferred to a carrier wafer. FIG. 28 (A) shows a cross section of one laser chip after transfer of the lase dice 801. In this example the laser dice are longer than the laser chips with boundaries 808 and 809. Electrical contact layers 807 (shown in FIG. 28 (B)) are deposited along with electrically insulating layers 806 intended to prevent shorting of the electrical contact layers using standard lithographic techniques. A laser scriber or mechanical scribe is used as described previously to produce scribe marks 810 that initiate and guide the cleave. In this figure the scribe marks are "skip scribe marks" formed with a laser scribing tool. In other embodiments the scribes can be formed mechanically and can be formed on the back of the carrier wafer using either skip or continuous scribing. The laser chips are then cleaved into bars along the direction 808 while simultaneously forming the front and back facets of the laser cavity. The laser chips are then singulated along the direction 809 using cleaving, sawing, through-wafer laser scribing or some other like method.

In one embodiment, the multiple laser dice are bonded to a carrier wafer consisting of an insulating material and containing metal-filled through vias. FIG. 27 shows a schematic of this configuration. The through vias under the laser dice are isolated electrically from the dice by a thin insulating layer 705. Electrical contact is made via a similar set of conductive and insulating layers deposited and patterned using standard lithographic techniques. This embodiment makes it possible to produce a chip that can be attached to a package via a surface mount process, which for low power parts, where thermal considerations are not as important, would allow for integration of laser chips directly onto printed circuit boards.

In some embodiments, multiple laser die are transferred to a single carrier wafer and placed within close proximity to each other. Dice in close proximity are preferably within one millimeter of each other, more preferably within 200 micrometers of each other and most preferably within 50 microns of each other. The implication of this close proximity of the laser or SLED dice are that the emitting apertures from each of the resulting laser diode or SLED devices are within 1 mm, 200 um, or 50 um of each other such that the output beams are closely spaced. Moreover, the die are also preferably bonded such that when laser cavities and facets are fabricated the optical axes of the emitted laser beams are aligned to each other to less than 5 degrees and more preferably less than 1 degree and most preferably less than 0.5 degrees. These characteristics of the integrated nature of the different emitters according to this invention has the advantage of simplifying the optical elements needed to couple laser light from lase devices fabricated on the several laser dice into the same system elements, e.g. MEMS mirror arrays, fiber optic cables, waveguide element, etc.

In conventional RGB displays where the output beams of separate laser devices or SLED devices are combined, the combining is generally done with dichroic mirrors, cubes, or other discrete optical elements. The use of multiple optical elements to achieve this beam combining can lead to excess loss and decreases the optical efficiency while adding cost and complexity to the manufacturing due to the increased number of components and alignment, respectively. According to the present invention the different color emitters are tightly spaced and can enable optical engines that do not require any combining components. In the conventional configuration wherein the optical beams are not closely spaced, the primary color images would be unacceptably displaced. When the physical shift and the beam directions between the light sources are taken into account with the signal modulation algorithms, the primary color images can be properly superimposed regardless of the separation between the light sources and differences between their beam directions.

In one example of three light sources shifted by 100 um, the scanned array might have 1940 pixels in one direction instead of 1920 pixels in that direction for the high definition display. In addition, the scanning mirror, which has typically 1 mm diameter, would have its size increased by 200 um.

As an example, laser speckle is a phenomenon that produces a spatial variation in the brightness of a laser spot projected on a surface. Laser light is coherent, and as such when it is reflected off of a rough surface such as a projection screen the height variation in the surface of the screen can lead to spatially varying constructive and destructive interference in the laser light. This property is not desirable in systems like laser based projectors, where images formed by direct projection of a laser light will have degraded image quality. Laser speckle can be reduced by combining several laser devices into a single source. This is particularly advantageous in single mode devices where the spectral width of the laser is narrow. The present invention enables several laser devices emitting at similar wavelengths (i.e. wavelength differences as large as 50 nm and as small as 1 nm) can be transferred to the same laser chip on a carrier wafer. Because laser die can be transferred from different substrates and placed in close proximity (within 10-100 microns) on the carrier wafer it is possible to select substrates such that the transferred die differ in wavelength by a desired amount while retaining a laser device-the laser chip-which functions equivalently to a single laser emitter. For example, an RGB chip consisting of six laser die could be fabricated. Two of the die would be lasers emitting blue light at peak wavelengths of 440 and 450 nm or between 435 nm and 465 nm. Two of the die would emit green light at peak wavelengths of 515 and 525 nm or between 505 and 540 nm. Two of the die would emit red light at peak wavelengths of 645 and 655 nm or between 630 and 660 nm. As would be obvious to someone skilled in the art, wavelength pairs could be chosen to vary both the apparent color of each of the red, green and blue laser pairs while also varying the amount of speckle reduction; and increased separation in wavelength leads to an increased reduction in laser speckle.

In an additional embodiment wherein the RGB laser or SLED chip is comprised of more than 3 laser or SLED sources, the center wavelength of the spectra of the individual sources would be chosen to maximize the area of the color gamut that can be rendered by the laser sources. FIG. 27a shows a representation of the CIE color gamut in the x and y coordinates. The commonly used RGB color space is indicated by the region 101. Laser sources have exceptionally narrow spectra compared to light emitting diodes and phosphor sources. Even for high-power, wide-ridge devices which lase from several or more lateral modes the spectral widths can be below 2 nm. Such narrow spectra mean that the color coordinates for laser primaries can be much closer to the locus of spectral (monochromatic) colors. It is therefore possible to render more colors, and specifically more saturated colors, with laser sources than with LEDs or phosphor sources. FIG. 27a shows the extent of the commonly used sRGB color space 101 along with the color space achievable for a hypothetical laser-based RGB laser chip comprised of lasers emitting at 635, 530 and 450 nm. This source is able to render saturated yellows and reds, but is far from the locus of spectral colors for cyans and short wavelength greens. By adding a fourth laser device emitting at 510 nm a wider area of the gamut can be displayed 103. Almost the entirety of the color gamut can be reached by adding a fifth laser device emitting at 495 nm and optionally shifting the 530 nm emitter to 525 nm. This is shown in the figure as area 104.

In an embodiment, an integrated 4 laser or SLED device is fabricated according to this invention with emitter center wavelengths separated by greater than or equal to 10 nm. A "red" device is provided with center wavelength less preferably between 600 and 700 nm, more preferably between 620 and 650 nm and most preferably between 630 and 640 nm. A "blue" device is provided with wavelength less preferably between 400 and 480 nm, more preferably between 430 and 470 nm and most preferably between 440 and 460 nm. A "green" device is provided with wavelength less preferably between 510 and 540 nm, more preferably between 520 and 540 nm and most preferably between 525 and 535 nm. A "short wavelength green" device is provided with wavelength less preferably between 480 and 520 nm, more preferably between 500 and 515 nm and most preferably between 505 and 515 nm.

In an embodiment, an integrated 5 laser or SLED device is fabricated according to this invention with emitter center wavelengths separated by greater than or equal to 10 nm. A "red" device is provided with center wavelength less preferably between 600 and 700 nm, more preferably between 620 and 650 nm and most preferably between 630 and 640 nm. A "blue" device is provided with wavelength less preferably between 400 and 480 nm, more preferably between 430 and 470 nm and most preferably between 440 and 460 nm. A "green" device is provided with wavelength less preferably between 510 and 540 nm, more preferably between 520 and 540 nm and most preferably between 525 and 535 nm. A "short wavelength green" device is provided with wavelength less preferably between 480 and 520 nm, more preferably between 500 and 515 nm and most preferably between 505 and 515 nm. A "cyan" device is provided with wavelength less preferably between 470 and 505 nm, more preferably between 480 and 500 nm and most preferably between 490 and 500 nm.

Of course other combinations of laser center wavelengths could be chosen. For example, a four emitter device could be chosen with lasers emitting at 635, 530 and 450 nm and the fourth device emitting at around 495 nm to enhance rendering of saturated blues. Other combinations are possible.

As an example, laser die from a red emitting AlInGaAsP laser device wafer, a green emitting GaN laser device wafer and a blue emitting GaN laser device wafer could be transferred to a single carrier wafer. Laser cavities, mirrors and electrical contacts could be processed on the die and carrier wafer using standard lithographic processes with structures similar to those described above and shown in FIGS. 26 and 27 such that laser devices on each dice are individually addressable and can be driven separately. Facets would be fabricated either with a dry etch process (e.g. RIE, ICP or CAIBE) or by cleaving the carrier wafer. After singulation, the resulting laser chip would have an effective emitter size similar to a standard laser diode device (i.e. less than 200 microns) and would allow for red-green-blue color mixing. Multiple laser die for each color could be transferred from multiple substrates, allowing for engineering of the speckle of each color. Such an RGB laser chip would greatly simplify the design and fabrication of a laser light source for projection and display applications. The laser devices would be in close proximity (i.e. within 10-100 microns) leading to the need for smaller optics. The laser devices would all be aligned to each other, thereby reducing fabrication cost by removing the need to separately align all emitters with the system optics.

An example of a red, green and blue light emitting optoelectronic device of this kind is shown in FIG. 21 for laser die. This RGB laser chip consists of a carrier wafer 310, which can be composed of a number of different materials. Bonded to the carrier are three laser die 316, which each have a single laser device structure fabricated into them. The laser die are bonded to the carrier p-side down, and the bond pads form a common p-electrode 314. Electrical passivation layers (e.g. silicon dioxide, silicon nitride or the like) are deposited selectively using a lithographic process and separate n-electrodes 311, 312 and 313 are subsequently deposited. FIG. 21 shows a single laser chip after singulation, however due to the nature of the bonding process, many laser chips can be fabricated in parallel on carrier wafers of arbitrary size. The choice of the carrier wafer material is dependent on the application. In some embodiments, where optical powers for the laser devices are low (below 100 mW), Si may be chosen as the carrier wafer due to the availability of large-diameter, low-cost Si wafers. In embodiments where emitted power is large (e.g. greater than 1 W) and the thermal resistance of the device must be kept low to ensure high efficiencies, SiC would be an appropriate carrier wafer material due to the high thermal conductivity of SiC.

In some embodiments, the RGB laser or SLED chip is formed by bonding the optoelectronic die such that they partially or fully overlay one another. Such a configuration is shown in FIG. 22 for laser die. Here the ridge-side electrical contact also forms part or all of the bonding layer for the next laser die. By including passivating layers such as silicon dioxide, silicon nitride or the like current can be restricted to flow only through the ridges. This laser chip configuration can be operated as a multi-terminal device without current matching between the laser devices. This configuration has the advantage of allowing for the laser ridges to be spaced very closely in the lateral direction, and though shown in FIG. 21 with ridges that do not overlap other configurations are possible, including ones where the ridges overlay one another. For example, in a low power device with 2 micron wide ridges and 5 micron tolerances on lateral alignment of the lithographic process, it would be possible for the emitters to span a total lateral distance of less than 16 microns, or roughly 10% of a typical GaN laser die. In the same low power device, with epi die thicknesses of 2 microns and bonding layer thickness of 1 micron the vertical span of the RGB emitter would be only 8 microns total. It is unlikely that this configuration would be used for a high power part as it would be difficult to extract heat efficiently from the upper most die.

In some embodiments according to the present invention, the RGB laser or SLED chip is formed by bonding the optoelectronic die to a carrier wafer that is itself an epitaxial device wafer. In an example, optoelectronic die from a blue-emitting, AlInGaN-based laser device wafer are bonded to a GaAs wafer containing epitaxial device layers comprising a red-emitting, AlInGaP-based laser device. Optoelectronic die from a green-emitting, AlInGaN-based laser device wafer are then bonded to the same carrier wafer. The dice are arranged such that they are bonded in close proximity to the laser stripe of the red-emitting AlInGaP laser device. This is a preferred embodiment for very low-power RGB emitting devices emitting at less than 100 mW, where thermal conductivity of the substrate need not be optimized. Such a configuration would be less preferred for higher power emitters.

In some embodiments according to the present invention the integrated RGB laser or SLED device is optically coupled to a micro-display element to form an RGB light engine. A preferred micro-display is a MEMS scanning mirror or "flying mirror", but could also be a digital light processing (DLP) chip or a liquid crystal on silicon (LCOS). In a preferred embodiment the RGB chip and micro-display would share a common support member such as submount member comprising a material such as Si, GaAs, AlN, SiC, sapphire, Kovar, diamond, or metal materials such as Cu or CuW. In some examples the red, green, and blue output emission beams is coupled to a beam shaping optic prior to incidence on the micro-display. The optic could be a collimating lens such as an aspheric lens, ball lens, fast axis collimating lens, slow axis collimating lens, other optic types, or some combination of such optics. In some embodiments the common support member is fabricated from the carrier wafer. In alternative embodiments the common support member is an intermediate mechanical support member.

In some embodiments according to the present invention, the carrier wafer is configured to provide added functionality wherein optical or electrical components are fabricated into the common carrier wafer shared by the RGB light sources. Optical components could include one or more of beam shaping components, one or more lens, reflectors, or even the micro-display such as the MEMS scanning mirror itself. In yet additional embodiments the carrier wafer is configured to provide electrical functionality such as an integrated circuit or ASIC. A preferred example of this would be to fabricate at least one of the MEMS scanning mirror or ASIC driver for an integrated RGB light engine wherein the carrier wafer may be selected from Si, SiGe, InP, GaAs, or others.

According to an embodiment, the present invention provides a projection apparatus. The projection apparatus includes a housing having an aperture. The apparatus also includes an input interface for receiving one or more frames of images. The apparatus includes a video processing module. Additionally, the apparatus includes an integrated RGB laser or SLED source according to this invention. The laser source includes a blue laser diode, a green laser diode, and a red laser diode. The blue laser diode has a peak operation wavelength of about 430 to 480 nm. The green laser diode has a peak operation wavelength of about 500 nm to 540 nm. The red laser diode has a peak operation wavelength of about 630 nm to about 670 nm. The apparatus also includes a laser driver module coupled to the laser source. The laser driver module generates three drive currents based on a pixel from the one or more frames of images. Each of the three drive currents is adapted to drive a laser diode. The apparatus also includes a MEMS scanning mirror, or "flying mirror", configured to project the laser beam to a specific location through the aperture resulting in a single picture. By rastering the pixel in two dimensions a complete image is formed. The apparatus includes an optical member provided within proximity of the laser source, the optical member being adapted to direct the laser beam to the MEMS scanning mirror. The apparatus includes a power source electrically coupled to the laser source and the MEMS scanning mirror. Many variations of this embodiment could exist, such as copackaging the integrated RGB laser or SLED source with the MEMS mirror or integrating the MEMS mirror onto the carrier wafer. The outputs from the blue, green, and red laser diodes could be combined into a single beam.

According to another embodiment, the present invention provides a projection apparatus. The apparatus includes a housing having an aperture. The apparatus includes an input interface for receiving one or more frames of images. The apparatus includes an RGB laser or SLED source according to the present invention. The laser source includes a blue laser diode, a green laser diode, and a red laser diode. The blue laser diode has a peak operation wavelength of about 430 to 480 nm. The green laser diode has a peak operation wavelength of about 500 nm to 540 nm. The red laser diode has a peak operation wavelength of about 630 nm to about 670 nm. The laser source is configured produce a laser beam by combining outputs from the blue, green, and red laser diodes. The apparatus includes a digital light processing (DLP) chip comprising a digital mirror device. The digital mirror device including a plurality of mirrors, each of the mirrors corresponding to one or more pixels of the one or more frames of images. The apparatus includes a power source electrically coupled to the laser source and the digital light processing chip. Many variations of this embodiment could exist, such as copackaging the integrated RGB laser or SLED source with the DLP chip. The outputs from the blue, green, and red laser diodes could be combined into a single beam.

In certain embodiments, the present invention provides a liquid crystal on silicon (LCOS) projection system. In an example, a green laser diode provides green laser light to the green LCOS; a blue laser diode provides blue laser light to a blue LCOS; and a red laser diode provides red laser light to a red LCOS. Each of the LCOS is used to form images in a predetermined single color as provided by its corresponding laser diode, and the single-colored image is combined by the x-cube component. The combined color image is projected onto the lens. In an alternative LCOS embodiment, the present invention provides a projection system with a single LCOS panel. The integrated red, green, and blue laser diodes or SLEDs are aligned where red, green, and blue laser beams are collimated onto a single LCOS. The laser diodes or SLEDs are pulse-modulated so that only one laser diode or SLED is power at a given time and the LCOS is lit by a single color. It is to be appreciated that since colored laser diodes are used, LCOS projection systems according to the present invention do not need beam splitter that split a single white light source into color beams as used in conventional LCOS projection systems. In various embodiments, one or more laser diodes or SLEDs used in the single LCOS projection system are characterized by semi-polar or non-polar orientation. In one embodiment, the laser diodes are manufactured from bulk substrate. In various embodiments, ferroelectric liquid crystal on silicon (FLCOS) systems can be deployed.

In some embodiments alternative wavelength laser devices or SLED devices are integrated onto the same chip as a red wavelength device, a blue wavelength device, a green wavelength device or a combination of red, blue, and green wavelength devices. Alternative wavelength devices could include ultra-violet devices operating in the 200 to 380 nm range formed using gallium and nitrogen containing material, violet devices operating in the 380 to 425 nm range formed using gallium and nitrogen containing material, infrared devices operating in the 700 to 1650 nm range formed using gallium and arsenic containing material or indium and phosphorous containing material. In such alternative embodiments various functionalities could be combined such as visible emitting devices for display, illumination, or communication, and/or infrared emitting devices for illumination or communication, and/or ultra-violet emitting devices for illumination or communication.

In preferred embodiments of the present invention, the integrated multi-color light source such as an RGB laser diode or SLED device is included in projection display technologies. In one example, scanning mirror micro-displays are combined with the light source to create a scanning mirror projector. A conventional example of a scanning mirror projector using light sources of three colors is shown schematically in FIG. 25a.

In principle, multiple (for full color projection, at least three or more), separate color images are generated and they are combined to superimpose on each other with the precision of less than one imaging picture element (pixel) and without any differences in orientation of these multiple images. Consequently, the alignment of optical components (these elements can be light sources themselves, collimating lenses, light combining elements, etc.) is extremely difficult, time consuming and costly. Each optical engine system requires its own unique alignment because of variability between optical components and their positions.

According to the present invention tightly integrated multiple color laser diode or SLED light sources can be positioned on the same chip within, for example, 200 um, 100 um, or 50 um, or less. The emission apertures from these different colors sources can be aligned with respect to each other using lithographic methods for precision below 10 um, 5 um, 3 um, or 1 um. The tight spacing of the different color light sources along with the relatively precise alignment of the emission apertures can enable a drastically simplified optical system including the number of components, types of components, and the alignment process. In some embodiments of the present invention, subsequent to the alignment and positioning of the optical components an image correction process is performed. For example, the separate static color images can be captured, their position and rotation determined with respect to each other, and then an electronic processing function with specified algorithms is employed to adjust the spatial resolution of different images and their projection so that they superimpose with better than pixel accuracy and no discernable rotation.

According to an example, a conventional (prior art) projection apparatus is shown in FIG. 25a. The projection apparatus includes the optical projection engine 110 and the video electronics module 150. The optical engine 110 comprises of light sources, optical components and a Micro-Electro-Mechanical Systems (MEMS) or conventional scanning mirror 160. The optical engine 110 can be enclosed in the housing having an aperture that allows the light beam from the engine to generate projected image on the screen 170.

The optical projection engine 110 includes laser sources, in particular a blue laser diode 131, a green laser diode 132, and a red laser diode 133. The blue laser diode 131 is fabricated on a nonpolar or semipolar oriented Ga-containing substrate and has a peak operation wavelength of about 430 to 480 nm, although other wavelengths can be used. The green laser diode 132 is fabricated on a nonpolar or semipolar oriented Ga-containing substrate and has a peak operation wavelength of about 490 nm to 540 nm. The red laser 133 could be fabricated from AlInGaP with wavelengths 610 to 700 nm. The laser sources are configured to produce a multicolor laser beam by combining outputs from the blue, green, and red laser diodes by collimating these lasers with the collimating lenses 121, 122 and 123 respectively and by combining them into a single multicolor beam using combiners 142 and 143, such as dichroic mirrors or dichroic cubes. The combined beam is directed to the scanning mirror or "flying mirror" 160, configured to project the laser beam to a specific location through the aperture resulting in three color beams with modulated light intensities. By rastering the mirror in two dimensions with a single biaxial, bidirectional mirror or two uniaxial mirrors, a complete image can be formed.

The apparatus also includes a video input interface for receiving one or more frames of images from video source 155. The electronics module 150 includes a display controller 151 that converts the normal video streams into the waveforms required to drive three light sources in synchronization with the scanning mirror 160, using the servo controller 153. The electronics module 150 also includes a laser driver module 152 coupled to the laser sources 131-133. The laser driver module generates three drive currents based on a video input and display controller module from the one or more frames of images. Each of the three drive currents is adapted to drive laser diodes 131-133. The electronics module 150 may also include safety monitor 154 and power monitor 155 that keep track of where the scanning beam is directed and monitor the optical engine power so that inadvertent exposure into the eyes of observers is avoided in high power operation. The apparatus also includes a power source (not shown) electrically coupled to the laser sources 131-133, the scanning mirror 160 and electronics module 150.

When the light sources are separated by small distances such as in the multi-color light source according to this invention, then no color combiners are required. The small separation of the light sources can be accomplished in particular with integrated fabrication of light sources and integrated optical components, such as collimated lenses. The separation of integrated light sources can be down to tens to hundreds of microns. In such cases, the combining optics is not needed and the inherent positioning differences can be corrected with the electronic processor.

Apart from lower cost of the engines due to significant reduction of the optical components, the alignment of the engine is simplified or eliminated. Consequently, the alignment costs, that represent the major contribution to the cost of the optical engines, are significantly reduced or eliminated. The light intensity losses from back reflections and scattering at the interfaces are also reduced, leading to improved optical efficiency of the whole engine.

The projection display according to this invention is shown in FIG. 25*b*. Many components have the same or similar functionality as those outlined in FIG. 25*a* and are described in the description of FIG. 25*a*. Here we focus only on the differences between the conventional and disclosed projection displays. The three lasers 231, 232 and 233 are closely spaced and integrated with the light beam collimating optics element 220. No light combining optics is required and no active alignment of collimating lenses and other optical elements is used, resulting with Red, Green and Blue (RGB) beams that are not fully superimposed and have differences in beam directions in two dimensions. The electronics module 250 has the conventional display controller 251, servo controller 253, optional safety monitor 254, but additionally includes electronic video processor 256 that modifies the video streams to correct the modulation of the laser drivers 252 in order to account for the misalignment and differences between directionality of the RGB beams described below.

Due to the finite separation of the tightly spaced multi-color emitters (lasers), three color images might have the positions and orientation misaligned, as schematically indicated in FIG. 25*c*. Taking the green image 310 as the reference, the red image 320 and blue image 330 are displaced and rotated with respect to the green image. This misalignment will be larger for discrete light sources (e.g. lasers) and discrete optical components and smaller for integrated light sources such the multi-color light source according to this invention wherein the lasers or SLEDs are integrated onto single chips with integrated optics. However in all practical cases the misalignment will be larger than fraction of the size of the picture element (pixel). For these reasons, complex and sensitive alignment of optical engine hardware is required or in embodiments according to this invention, device modifications described above and software and method modifications described below are used to address this challenge.

In one embodiment, after the optical engine assembly, multiple (for the full color three or more) color images 310-330 are separately captured by high resolution color camera with the resolution exceeding that of the displayed images, at least by a factor of two in each direction. As an example, if the desired image is supposed to have high definition resolution of 1920×1080, it is useful to employ the color (or black and white with multiple external filters) camera with at least 4M imaging sensors. The above step and subsequent steps are captured in the method flowchart in FIG. 25*d*.

The key steps of the method are:
1. Assembly of the optical engine 410 with passive alignment features but without active alignment.
2. Capture of individual color images 420 with high spatial resolution color camera or black and white camera.
3. Determination of displacements and rotation of images 430 with respect to reference image, such as green image. In this case, displacements and rotations of red and blue images with respect to the green image are determined. Subsequently, the image analysis software is applied to these multiple images and displacements and rotation of red and blue (or more) color images with respect to the first green image are determined. The electronic video processor of the modified optical engine shown in FIG. 25*b* with correcting algorithms is provided with the parameters needed to move and orient images to the overlap area and correct their rotational misalignment. Implementation involves modification of the driving waveforms provided into the driving electronics for the light sources.
4. Application of algorithms 440 to superimpose all single color images.
5. Test of the quality of the alignment 450 by capturing the single color images and complete white image.

If the software alignment is good, the video streams modified with the video processor and algorithms are employed to test the image quality using specialized color patterns. It the software alignment is not adequate, the alignment process is repeated until satisfactory results are obtained.

When the optical engine is used without increase of the size of the pixel array, then only images with lower resolution could be produced. In the example in FIG. 25*c*, the image size would correspond only to the area 340 shown in heavy black, while the correct images should have the size corresponding to the area defined by the green rectangle 310. In order to include this correction, the wider scanning angle of the scanning mirror and larger pixel array has to be created for multiple colors. Without increased resolution, color images could be superimposed on each other by using the video processor and appropriate algorithms with the displacement and rotation corrections, corresponding to each particular engine, but the size and spatial resolution of the resulting image would be reduced, corresponding only to the area of the complete overlap of all color, uncorrected images, shown with the heavy black rectangle 340 in FIG. 25c.

When the resolution of the images is properly increased, the full image resolution can be maintained. In such a case, there are areas 350 beyond the overlapping regions, where some light sources are turned off. The required increase in resolution is dependent on the degree of positional and rotational misalignment. The larger these initial misalignments are, larger increases of resolution are required.

The correction factors are unique for each optical engine, as they depend on misalignment of the light sources and optical components of the given engine. The correction factors can stay the same for the lifetime of the projection display or lighting system, but they can be dynamically adjusted, if necessary. When temperature variations induce significant changes in the spatial or angular position of color beams (leading to the shifts comparable with the pixel size or greater), temperature based adjustments can be implemented. The typical temperature coefficients can be determined on several engines. With temperature sensor incorporated in each engine, based on the actual, measured temperature, correction coefficients can be tuned for maintaining of the best image quality even when large temperature swings occur. Once good image quality is achieved, the parameters specific to each optical engine are stored in nonvolatile memory and then used continuously in steps 495 to correct video waveforms.

The example of addressing waveforms for modulation of light intensities of different light sources is shown in FIG. 25e. At the beginning of the scan of the scanning mirror for the first row, only one color, such as green might be on, while the remaining colors, such as red and blue are off. This is schematically illustrated in FIG. 25e by comparing the original green driving waveform with green current driver supplying current pulses 510, 511, 512, . . . to the green laser at the beginning of the first row, until the last pulse of the first row 530 for the green laser. The durations of the current pulses per each pixel are dt=T/N where t is the frame time and N is the number of pixels in the image. The corrected green driver current waveform in (ii) of FIG. 25e is the same as the original waveform in (i) of FIG. 25e, however, the durations of the pulses are shortened by δ, thus becoming dt-δ. The value of δ is dependent on the optical hardware misalignment determined in the capture of three color image in the steps 420 and 430 in FIG. 25d. The value of δ can be selected from the largest typical misalignment of different engines or alternatively, it can be adjusted according to the misalignment of each optical engine. The green driver waveform in (i) of FIG. 25e starts with driver currents being zero for several cycles depending on the degree of misalignment, followed by the current pulses 520, 521, 522 which have the same magnitude as pulses 510, 511, 512, . . . but shorter duration dt-δ. At the end of the row, the pulse 540 is the same in magnitude as original pulse 530, but it is again shorter and it ends earlier, as indicated in (ii) of FIG. 25e.

The blue and red color driver waveforms are generated in parallel, simultaneously with the green driver waveform. Illustrating the example of the blue driver with the original driver waveform in (iii) of FIG. 25e with pulses 570, 571, 572 at the beginning of one row, and the pulses 590, 591, 592 at the end of that row, the corrected waveforms are shown in (iv) of FIG. 25e with waveform having pulses 580, 581, . . . 585 at the beginning of the row scan and pulse 593, 594, 595 at the end of the first row of blue waveform. Blue color current is turned on at the right time at 580, based on experimentally determined parameters and algorithmically adjusted driver modulation. Finally at the later time, the third color is also added by appropriate driving waveforms. At the end of the scan of the first row, the drivers are turned at different times, again based on the misalignment.

When another row of the video frame is addressed, the time shifts are different from the first row, as shown by pulses 550 in the original waveform and corrected pulses 560, 561, 562, 563 . . . for green image. Also, for the illustrated blue row, time shifts and intensities of pulses are different from adjustments in the first row, as shown schematically by comparison of original blue driver pulses 596 and the corrected pulses 597, 598, etc.

As illustrated in FIG. 25e, the resulting driving waveforms are not simply shifted in time. In fact, video data from the adjacent lines are likely used to yield the correct superposition of the same color pixels as in the original image. The transforms of two dimensional arrays of multiple datasets, accounting for displacements and rotations, are employed to convert the original video trains into the corrected video trains.

When the light sources are separated by small distances such as in the multi-color light source according to this invention, then no color combiners are required. The small separation of the light sources can be accomplished in particular with integrated fabrication of light sources and integrated optical components, such as collimation lenses. The separation of integrated light sources can be down to tens to hundreds of microns. In such cases, the combining optics is not needed and the inherent positioning differences can be corrected with the above video processing module. Apart from lower cost of the engines due to significant reduction of the optical components, the alignment of the engine is simplified or eliminated. Consequently, the alignment costs, that represent the major contribution to the cost of the optical engines, are significantly decreased or eliminated. The light intensity losses from back reflections and scattering at the fewer interfaces in the disclosed optical engine in FIG. 25b are also reduced, leading to improved optical efficiency of the whole system.

With the above described corrections implemented, the images will have the correct spatial resolution and image quality as demonstrated by the full color images over the full area of the original green image 310. With the described embodiments, the hardware simplifications and assembly and alignment cost reductions are traded for increased complexity of the video processor and software.

The embodiments are described above for the full color systems with three light sources, however, the same approach is extendable to the systems with different number of light sources for one, two or multiple color lighting. It can be used with two colors or with monochromatic system when the multiple light sources of one color are used or the full color system where the multiple light sources are used for certain colors and total number of light sources exceeds three sources.

Embodiments of this invention facilitate the production of laser devices at extremely low costs relative to traditional production methods. FIG. 14 shows the process flow and material inputs for a traditional laser diode fabrication process. A substrate is provided. A laser device is grown epitaxially on the substrate. The wafer is then processed on both the epitaxial, i.e. front, and back sides to produce the laser diode ridge and electrical contacts. The wafer is then thinned to facilitate cleaving. The thinning process consumes most of the substrate, converting it into slurry. The thinned wafer is then cleaved perpendicular to the laser ridges to produce front and back facets, and the resulting linear array, or "bar", of laser devices can then be tested for quality assurance purposes and multiple bars can be stacked for coating of facets with highly reflective or anti-reflective coatings depending on the application of the laser. Finally, the laser devices are singulated from the bar and attached to a submount, which provides an electrically insulating platform for the die to sit on, allows electrical access to the substrate side of the laser device, and which is soldered or otherwise adhered to the laser packaging or heat sink.

In the traditional work flow, laser devices are processed on the epitaxial wafers at a density fixed not by the size of the laser ridge, but by the area of material needed to handle and electrically connect to the device. This results in relatively high processing costs per device, as the number of devices per wafer, especially on commercially available GaN substrates which tend to be small, is low. Moreover, after singulation of laser devices a serial pick and place process followed by a bonding process must be carried out twice; once to bond the laser die to a submount and a second time to bond the submount to the laser package.

The improved fabrication process enabled by this invention is shown in FIG. 15. A substrate is provided, which can be either a virgin substrate or one reclaimed after previous use. The epitaxial layers are grown on the substrate and then processed into die for transfer. Because the die can be bonded to a carrier at a larger pitch than they are found on the substrate, the number of die that can be prepared on the substrate is quite large. This reduces the cost of processing per die. FIG. 16 shows the number of devices that can be processed on substrate of various dimensions. The ridge length is assumed to be 1 mm, and the pitch between ridges is varied from about 50 to about 3000 microns. Practically, the pitch cannot be much smaller than about 100-150 microns as the die must be large enough to both handle and support wire bonds. As an example, on a 1 inch diameter substrate using a standard work flow, with die pitches on the order of about 150 microns nearly 3400 devices can be made. Using this epi transfer process die pitches can be shrunk to about 50 microns or less, with die width determined by the laser ridge width. As an example, for a 1 inch diameter substrate using the epi transfer work flow, with die pitches on the order of about 50 microns, over 10000 die can be made per wafer. This reduces both the cost per die for process as well as the cost per die for the epitaxial process and substrate.

When the die are transferred to a carrier wafer a certain fraction of die are transferred in each bonding step. This fraction is determined by the relative sizes of the pitch of die on the substrate (i.e. first pitch) and the pitch on the carrier (i.e. second pitch). FIG. 17 shows several examples of bonding configurations for small substrates on a 100 mm diameter round carrier wafer. This is one example of bonding configurations where the carrier wafer is not fully populated with die, though it is possible to fill the carrier more completely. For example, die from limited regions of a substrate could be bonded at the edge of the carrier, with the unbonded region of the substrate extending off the edge of the carrier. As another example, the carrier could be partially populated with mesas, and then a second set of bond pads could be patterned on the carrier with a larger thickness than the first set of bond pads, thereby providing clearance to bond in the unoccupied positions between the original bonds.

This also has a positive benefit on the cost of processing. FIG. 18 shows a table of the number of devices that can be transferred to a 100 mm diameter carrier wafer. It is assumed that the die pitch on the substrate is about 50 microns, and the die pitch on the carrier, i.e. the second pitch, is varied. It can be seen that number of devices that can be processed in parallel on a 100 mm diameter carrier when transferred from 1 inch diameter wafers is approximately 30000 when the second pitch is 150 microns. This is 10 times as high as the number of devices that can be processed on a 1 inch diameter substrate with about a 150 micron pitch. In this example, the second pitch is about 3 times as large as the first pitch, making it possible to make three transfers from the substrate to the carrier. In this example all of the die from more than one substrate could be transferred to the carrier. In some embodiments, the second pitch is around 1 mm or larger, requiring more transfers than positions available on the carrier. In another embodiment the first and second pitch are such that the number of positions available on the substrate to bond too are equal to the number of mesas on the substrate.

Once the carrier wafer is populated with die, wafer level processing can be used to fabricate the die into laser devices. For example, in many embodiments the bonding media and die will have a total thickness of less than about 10 microns, making it possible to use standard photoresist, photoresist dispensing technology and contact and projection lithography tools and techniques to pattern the wafers. The aspect ratios of the features are compatible with deposition of thin films, such as metal and dielectric layers, using evaporators, sputter and CVD deposition tools. In some embodiments front facets could be protected with thick dielectric layers while and epoxy is dispensed overlaying the laser die and carrier chip, encapsulating the laser device and sealing it from contaminants and environmental factors that might degrade performance. Here, then, you would have a truly chip-scale laser package, fabricated on a wafer level using standard semiconductor manufacturing techniques and equipment, which, once singulated from the carrier wafer, would be ready to install in a laser light system.

Moreover, the substrate can be recycled by reconditioning the surface to an epi-ready state using a combination of one or more of lapping, polishing and chemical mechanical polishing. Substrate recycling would require removal of any variation in wafer height remaining from the transfer process. This removal would be achieved by lapping the wafer surface with abrasive slurry. The abrasive media would be one or more of silica, alumina, silicon carbide or diamond. Progressively smaller particle sizes would be used to first planarize the wafer surface and then remove subsurface damage to the crystal induced by the initial removal process. Initial particle sizes in the range of about 1-10 microns could be used, followed by about 0.1-100 micron. The final step would be a chemical mechanical polish (CMP), typically comprising of colloidal silica suspended in an aqueous solution. The CMP step would restore an "epi ready" surface typically characterized by low density of crystalline defects and low RMS (<about 10 nm) roughness. Final cleaning steps may include use of a surfactant to remove residual slurry as well as cleans to remove contaminants such as exposure to acidic solutions (for example HCl, HCl:HNO$_3$, HF and the like) and exposure to solvents (for example isopropanol, methanol and acetone). We estimate a substrate could be recycled more than 10 times without significant change in thickness. In some embodiments, the epitaxial layers include thick buffers that are subsequently removed by the recycling process, thereby leaving the net thickness of the substrate unchanged.

As an example, using basic assumptions about processing and material costs, such as recycling substrates 10 times and availability of large area (i.e. greater than 2 cm$^2$) GaN substrates) it can be shown that blue-light emitting, GaN-based laser device costs below $0.50 per optical Watt and could be as low as $0.10 per optical Watt by transferring die from 4.5 cm$^2$ GaN substrates to 200 mm SiC carriers. This price is highly competitive with state of the art light emitting diodes and could enable widespread penetration of laser light sources into markets currently served by LEDs such as general lighting.

In an example, the present invention discloses Integrated Low-cost Laser-based Light Sources based on integrated arrays of high-efficiency, low-cost blue laser diodes and densified wavelength-convertors, which are capable of producing source brightness levels which exceed that of LED-based sources, while maintaining the advantages of high energy efficiency and long product lifetimes expected from solid state lighting sources. Further, lighting systems based on Integrated Low-cost Laser-based Light Sources are disclosed, which provide product performance exceeding LED-based products.

In example, we discovered that conventional GaN-based solid state lighting sources and products are limited due to source brightness, defined as the light density per unit of solid angle. With consideration of the optical concept of etendue, it is well known that the brightness cannot be increased in an optical assembly; hence the brightness or intensity of a lighting system is limited by the brightness of the source. For GaN LED light sources, there is a well-known phenomenon known as "droop" where the energy efficiency drops rapidly with an increase in input power density. Due to the difference in carrier recombination mechanism between LEDs (spontaneous emission) and laser diodes (stimulated emission), this phenomenon of efficiency droop is not seen in GaN laser diodes. This is displayed in FIG. 29 where the energy conversion efficiency is schematically illustrated for GaN-based LEDs and laser diodes. It is clear that laser diodes can achieve significantly higher conversion efficiency than LEDs when operated at high power-density. Additionally, the light emission pattern from and LED is isotropic over the surface of the device, whereas for a laser diode, the light is emitted from a small exit facet in a well-defined coherent beam. The emitting area for a laser diode is several orders of magnitude smaller, resulting in source brightness, which is several orders of magnitude higher than for LEDs. This advantage in source brightness may be maintained through an optical system, e.g. a light bulb or fixture, resulting in an inherent advantage for laser diodes.

In an example, a brief summary of wavelength conversion materials such as phosphor has been provided below for LED in reference to laser diode. For LEDs, the phosphor is as large as or larger than the LED source. For laser diode modules, the phosphor size is independent of the die size, and may be pumped from several laser diode sources. For LEDs, the phosphor is located on or around the die. The thermal dissipation is poor, or directly through the LED die. For laser diodes the phosphor is adjacent or remote the die, enabling it to be well heat sunk, enabling high input power density. For LEDs, the phosphor emits back into the LED die resulting in significant efficiency and cost trade-off. For laser diode modules, the environment of the phosphor can be independently tailored to result in high efficiency with little or no added cost. Phosphor optimization for laser diode modules can include highly transparent, non-scattering, ceramic phosphor plates. Decreased temperature sensitivity can be determined by doping levels. A reflector can be added to the backside of a ceramic phosphor, reducing loss. The phosphor can be shaped to increase in-coupling and reduce back reflections. Of course, there can be additional variations, modifications, and alternatives.

In an example, the present invention provides a laser-based light module containing one or more low-cost laser diodes; one or more wavelength conversion elements; and a common substrate providing electrical and thermal connections between the laser diodes and the wavelength conversion element. In an example, the low-cost laser diodes are composed of epitaxial material which contains GaN, AlN, InN, InGaN, AlGaN, InAlGaN, AlInGaN, combinations thereof, and the like. In an example, the emission wavelength of the low-cost laser diode is in the range of 200 nm and 520 nm, among others.

In an example, the preferred emission wavelength of the low-cost laser diode is in the range of 440 nm and 460 nm. In other embodiments the emission wavelength is in the 395 nm to 420 nm range, in the 420 nm to 440 nm range, or in the 460 nm to 480 nm range. In an example, the wavelength conversion element is phosphor material. In an example, the wavelength conversion element is a phosphor, which contains garnet host material and a doping element. In an example, the wavelength conversion element is a phosphor, which contains a yttrium aluminum garnet host material and a rare earth doping element, and others. In an example, the wavelength conversion element is a phosphor which contains a rare earth doping element, selected from one or more of Ce, Nd, Er, Yb, Ho, Tm, Dy and Sm, combinations thereof, and the like. In an example, the wavelength conversion element is a high-density phosphor element. In an example, the wavelength conversion element is a high-density phosphor element with density greater than 90% of pure host crystal.

In an example, the light emitted from the one or more low-cost laser diodes is partially converted by the wavelength conversion element. In an example, the partially converted light emitted generated in the wavelength conversion element results in a color point, which is white in appearance.

In an example, the color point of the white light is located on the Planckian blackbody locus of points. In an example, the color point of the white light is located within du'v' of less than 0.010 of the Planckian blackbody locus of points. In an example, the color point of the white light is preferably located within du'v' of less than 0.03 of the Planckian blackbody locus of points.

In an example, the common substrate is a solid material with thermal conductivity greater than 100 W/m-K. In an example, the common substrate is preferably a solid material with thermal conductivity greater than 200 W/m-K. In an example, the common substrate is preferably a solid material with thermal conductivity greater than 400 W/m-K. In an example, the common substrate is preferably a solid material with electrical insulator with electrical resistivity greater than 1×10^6 ohm-cm. In an example, the common substrate is preferably a solid material with thin film material providing electrical 1×10^6 ohm-cm. In an example, the common substrate selected from one or more of $Al_2O_3$, AlN, SiC, BeO and diamond. In an example, the common substrate is preferably comprised of crystalline SiC. In an example, the common substrate is preferably comprised of crystalline SiC with a thin film of $Si3N4$ deposited onto the top surface. In an example, the common substrate contains metal traces providing electrically conductive connections between the one or more low-cost laser diodes. In an example, the common substrate contains metal traces providing thermally conductive connections between the one or more low-cost laser diodes and the common substrate.

In an example, the one or more low-cost laser diodes are attached to the metal traces on the common substrate with a solder material. In an example, the one or more low-cost laser diodes are attached to the metal traces on the common substrate with a solder material, preferably chosen from one or more of AuSn, AgCuSn, PbSn, or In.

In an example, the wavelength conversion material is attached to the metal traces on the common substrate with a solder material. In an example, the wavelength conversion material is attached to the metal traces on the common substrate with a solder material, preferably chosen from one or more of AuSn, AgCuSn, PbSn, or In.

In an example, the one or more low-cost laser diodes and the wavelength conversion material is attached to the metal traces on the common substrate with a similar solder material, preferably chosen from one or more of AuSn, AgCuSn, PbSn, or In. In an example, two or more low-cost laser diodes are attached to the common substrate with the diodes arranged in an electrically series manner. In an example, the wavelength conversion element contains an optically reflective material interposed between the wavelength conversion element and the thermally conductive connection to the metal traces on the common substrate.

In an example, the optically reflective material interposed between the wavelength conversion element and the thermally conductive connection to the metal traces on the common substrate has a reflectivity value of greater than 50%.

In an example the optically reflective material interposed between the wavelength conversion element and the thermally conductive connection to the metal traces on the common substrate has a reflectivity value of greater than 80%. In an example, the optically reflective material interposed between the wavelength conversion element and the thermally conductive connection to the metal traces on the common substrate has a reflectivity value of greater than 90%. In an example, the optical beam shaping elements are placed between the low-cost laser diodes and the wavelength conversion element.

In an example, the wavelength conversion element contains geometrical features aligned to each of the one or more low-cost laser diodes. In an example, the wavelength conversion element further contains an optically reflective material on the predominate portion of the edges perpendicular to the common substrate and one or more low-cost laser diodes, and where the geometrical features aligned to each of the low-cost laser diodes does not contain an optically reflective material. In an example, the common substrate is optically transparent. In an example, the wavelength conversion element is partially attached to the transparent common substrate. In an example, the wavelength converted light is directed through the common substrate. In an example, the wavelength converter contains an optically reflective material on at least the top surface. In an example, the one or more low-cost laser diodes and the wavelength conversion element are contained within a sealing element to reduce the exposure to the ambient environment. In an example, the one or more low-cost laser diodes and the wavelength conversion element are contained within a sealing element to reduce the exposure to the ambient environment.

In an example, the solid-state lighting element containing at least a laser-based light module has a beam shaping element. In an example, the beam shaping element provides an optical beam where greater than 80% of the emitted light is contained within an emission angle of 30 degrees. In an example, the beam shaping element provides an optical beam where greater than 80% of the emitted light is preferably contained within an emission angle of 10 degrees. In an example, the form is within the commonly accepted standard shape and size of existing MR, PAR and AR111 lamps. In an example, the solid-state lighting element further contains an integrated electronic power supply to electrically energize the laser-based light module. In an example, the solid-state lighting element further contains an integrated electronic power supply with input power within the commonly accepted standards. Of course, there can be other variations, modifications, and alternatives.

In an example, a method for manufacturing a lighting device comprising a laser diode device includes providing a substrate having a surface region and forming an epitaxial material overlying the surface region. The epitaxial material may comprise an n-type cladding region, an active region comprising at least one active layer overlying the n-type cladding region, and a p-type cladding region overlying the active layer region. In an example, the method also includes patterning the epitaxial material to form a plurality of dice, each of the dice corresponding to at least one laser diode device, and transferring each of the plurality of dice to one or more carrier substrates. In an example, the method also includes processing at least one of the plurality of dice on at least one of the carrier substrates, packaging the die with the carrier substrate, and configuring the die with a wave length conversion element optically coupled with the die to emit electromagnetic radiation in a white light spectrum. The electromagnetic radiation may be partially converted by the wavelength conversion element or fully converted by the wavelength conversion element.

In an example, an optical apparatus includes an epitaxial growth material bonded to a sub-mount device with an interface region on a surface region of the sub-mount device. The epitaxial growth material may be characterized by a thickness of less than 10 microns and greater than 0.5 micron and detached from a substrate that the epitaxial material was grown on. In an example, at least one laser device is configured from the epitaxial growth material. The at least one laser device may comprise a laser ridge fabricated in the epitaxial growth material. In an example, a peripheral region of the sub-mount device is configured from a singulated carrier to provide the sub-mount device. The peripheral region may be configured from a sawing, scribing and breaking, or cleaving process. In an example, at least a pair of bonding pads are configured on the sub-mount device to electrically connect to the laser device and configured to inject current into the laser device.

In an example, an optical apparatus includes a common carrier member comprising a surface region and a red emitting AlInGaAsP epitaxial laser structure (RED), a green emitting gallium and nitrogen containing laser epitaxial structure (GREEN), and a blue emitting gallium and nitrogen containing laser epitaxial structure (BLUE). In an example, the red emitting AlInGaAsP epitaxial laser structure is (RED) is configured onto and transferred from a gallium and arsenic containing substrate member onto a first portion of the surface region or a red emitting AlInGaAsP laser epitaxial structure is formed on the surface region of the common carrier member. In an example, the green emitting gallium and nitrogen containing laser epitaxial structure (GREEN) is configured onto and transferred from a gallium and nitrogen containing substrate member onto a second portion of the surface region. In an example, the blue emitting gallium and nitrogen containing laser epitaxial structure (BLUE) is configured onto and transferred from a gallium and nitrogen containing substrate member onto a third portion of the surface region. In an example, a red laser device (RED Laser), a green laser device (GREEN Laser), and a blue laser device (BLUE Laser) are configured respectively from the RED, GREEN, and BLUE via processing of the RED, GREEN, and BLUE to form waveguide regions, facet regions, and contact regions.

In an example application of this invention, a RGB laser, SLED or blue laser chip could be used as a preferred light source for visible light communications (VLC) systems, such as Li-Fi communication systems. VLC systems are those that use modulation of a visible, UV, infra-red or near-infra-red light source for data transmission. VLC systems using modulation of visible light sources would be an advantageous use of this invention for two reasons. Firstly, bandwidth would be higher than that expected when using light emitting diodes due to the increase in carrier recombination rates due to the significant amount of stimulated emission found in laser diodes and SLEDs. In LEDs, diode lasers and SLEDs the recombination rate will increase with carrier density, however unlike SLEDs and diode lasers, which peak in efficiency at relatively high carrier densities, LEDs peak in efficiency at very low carrier densities. Typically LED peak efficiency is at carrier densities 2-3 orders of magnitude lower than those found at typical SLED or laser diode operating conditions. Modulation and therefore data transfer rates should be significantly higher than those achievable using LEDs.

Moreover, in white-light based VLC sources a violet or blue "pump" light source consisting of a LED or laser diode or SLED is used to optically excite or "pump" a phosphor element to produce a broad spectrum covering wavelengths corresponding to green and red and sometimes blue. The phosphor derived spectrum and unabsorbed pump light are combined to produce a white light spectrum. Laser and SLED light sources have significantly narrower spectra than blue LEDs; <1.5 nm and <5 nm, respectively as compared to approximately 20 nm for a blue LED. Narrower FWHMs make separation of the pump light signal from the phosphor emission using notch (i.e. bandpass) filters easier. This is important because though the phosphor derived component of the white light spectra comprises a significant fraction of the total optical power emitted by the device, the long recombination lifetimes in phosphors result in very low modulation rates for the phosphor emitted component of the spectra.

In an embodiment, multiple laser die emitting at different wavelengths are transferred to the same carrier wafer in close proximity to one another; preferably within one millimeter of each other, more preferably within about 200 micrometers of each other and most preferably within about 50 microns of each other. The laser die wavelengths are chosen to be separated in wavelength by at least twice the full width at half maximum of their spectra. For example, three die, emitting at 440 nm, 450 nm and 460 nm, respectively, are transferred to a single carrier chip with a separation between die of less than 50 microns and die widths of less than 50 microns such that the total lateral separation, center to center, of the laser light emitted by the die is less than 200 microns. The closeness of the laser die allows for their emission to be easily coupled into the same optical train or fiber optic waveguide or projected in the far field into overlapping spots. In a sense, the lasers can be operated effectively as a single laser light source.

Such a configuration offers an advantage in that each individual laser light source could be operated independently to convey information using for example frequency and phase modulation of an RF signal superimposed on DC offset. The time-averaged proportion of light from the different sources could be adjusted by adjusting the DC offset of each signal. At a receiver, the signals from the individual laser sources would be demultiplexed by use of notch filters over individual photodetectors that filter out both the phosphor derived component of the white light spectra as well as the pump light from all but one of the laser sources. Such a configuration would offer an advantage over an LED based VLC source in that bandwidth would scale easily with the number of laser emitters. Of course, a similar embodiment with similar advantages could be constructed from SLED emitters.

In another embodiment an RGB laser or SLED chip is used as a light source for projection of images or illumination of objects. Each color channel is driven by a current source capable of delivering an RF encoded signal to the emitter. Such an emitter would exhibit the same advantages with respect to modulation rate relative to an LED based device while also having three or more channels for transmission of data that can easily be distinguished using notch filters over photo-detectors.

In multiple embodiments according to the present invention, the device layers comprise a super-luminescent light emitting diode or SLED. In all applicable embodiments a SLED device can be interchanged with or combined with laser diode devices according to the methods and architectures described in this invention. A SLED is in many ways similar to an edge emitting laser diode; however the emitting facet of the device is designed so as to have a very low reflectivity. A SLED is similar to a laser diode as it is based on an electrically driven junction that when injected with current becomes optically active and generates amplified spontaneous emission (ASE) and gain over a wide range of wavelengths. When the optical output becomes dominated by ASE there is a knee in the light output versus current (LI) characteristic wherein the unit of light output becomes drastically larger per unit of injected current. This knee in the LI curve resembles the threshold of a laser diode, but is much softer. A SLED would have a layer structure engineered to have a light emitting layer or layers clad above and below with material of lower optical index such that a laterally guided optical mode can be formed. The SLED would also be fabricated with features providing lateral optical confinement. These lateral confinement features may consist of an etched ridge, with air, vacuum, metal or dielectric material surrounding the ridge and providing a low optical-index cladding. The lateral confinement feature may also be provided by shaping one or more of the electrical contacts such that injected current is confined to a finite region in the device. In such a "gain guided" structure, dispersion in the optical index of the light emitting layer with injected carrier density provides the optical-index contrast needed to provide lateral confinement of the optical mode.

SLEDs are designed to have high single pass gain or amplification for the spontaneous emission generated along the waveguide. The SLED device would also be engineered to have a low internal loss, preferably below 1 $cm^{-1}$, however SLEDs can operate with internal losses higher than this. In the ideal case, the emitting facet reflectivity would be zero, however in practical applications a reflectivity of zero is difficult to achieve and the emitting facet reflectivity is designs to be less than 1%, less than 0.1%, less than 0.001%, or less than 0.0001% reflectivity. Reducing the emitting facet reflectivity reduces feedback into the device cavity, thereby increasing the injected current density at which the device will begin to lase. Very low reflectivity emitting facets can be achieved by a combination of addition of anti-reflection coatings and by angling the emitting facet relative to the SLED cavity such that the surface normal of the facet and the propagation direction of the guided modes are substantially non-parallel. In general, this would mean a deviation of more than 1-2 degrees. In practice, the ideal angle depends in part on the anti-reflection coating used and the tilt angle must be carefully designed around a null in the reflectivity versus angle relationship for optimum performance. Tilting of the facet with respect to the propagation direction of the guided modes can be done in any direction relative to the direction of propagation of the guided modes, though some directions may be easier to fabricate depending on the method of facet formation. Etched facets provide the most flexibility for facet angle determination. Alternatively, a very common method to achieve an angled output for reduced constructive interference in the cavity would to curve and/or angle the waveguide with respect to a cleaved facet that forms on a pre-determined crystallographic plane in the semiconductor chip. In this configuration the angle of light propagation is off-normal at a specified angle designed for low reflectivity to the cleaved facet.

The spectra emitted by SLEDs differ from lasers in several ways. While a SLED device does produce optical gain in the laterally guided modes, the reduced optical feedback at the emitting facet results in a broader and more continuous emission spectra. For example, in a Fabry-Perot (FP) laser, the reflection of light at the ends of the waveguide limits the wavelengths of light that can experience gain to those that result in constructive interference, which is dependent on the length of the cavity. The spectra of a FP laser is thus a comb, with peaks and valleys corresponding to the longitudinal modes and with an envelope defined by the gain media and transverse modes supported by the cavity. Moreover, in a laser, feedback from emitting facet ensures that one or more of the transverse modes will reach threshold at a finite current density. When this happens, a subset of the longitudinal modes will dominate the spectra. In a SLED, the optical feedback is suppressed, which reduces the peak to valley height of the comb in the gain spectra and also pushes out thresholds to higher current densities. A SLED then will be characterized by a relatively broad (>5 nm) and incoherent spectrum, which has advantages for spectroscopy, eye safety and reduced speckle. As an example, the well-known distortion pattern referred to as "speckle" is the result of an intensity pattern produced by the mutual interference of a set of wavefronts on a surface or in a viewing plane. The general equations typically used to quantify the degree of speckle are inversely proportional to the spectral width.

As used herein, the term GaN substrate is associated with Group III-nitride based materials including GaN, InGaN, AlGaN, or other Group III containing alloys or compositions that are used as starting materials. Such starting materials include polar GaN substrates (i.e., substrate where the largest area surface is nominally an (h k l) plane wherein h=k=0, and l is non-zero), non-polar GaN substrates (i.e., substrate material where the largest area surface is oriented at an angle ranging from about 80-100 degrees from the polar orientation described above towards an (h k l) plane wherein l=0, and at least one of h and k is non-zero) or semi-polar GaN substrates (i.e., substrate material where the largest area surface is oriented at an angle ranging from about +0.1 to about 80 degrees or about 110-179.9 degrees from the polar orientation described above towards an (h k l) plane wherein l=0, and at least one of h and k is non-zero).

As used herein, the term substrate is associated with both GaN substrates as well as substrates on which can be grown epitaxially GaN, InGaN, AlGaN, or other Group III containing alloys or compositions that are used as starting materials. Such substrates include SiC, sapphire, silicon and germanium, among others. Substrate may also refer to substrates on which can be grown epitaxially GaAs, AlAs, InAs, GaP, AlP, InP, or other like Group III containing alloys or compositions that are used as starting materials. Such substrates include GaAs, GaP, Ge and Si, among others.

As used herein, the terms carrier or carrier wafer refer to wafer to which epitaxial device material is transferred. The carrier may be composed of a single material and be either single crystalline or polycrystalline. The carrier may also be a composite of multiple materials. For example, the carrier could be a silicon wafer of standard dimensions, or it could be composed of polycrystalline AlN.

As used herein, the term submount refers to material object to which a laser device is bonded in order to facilitate packaging, bonding to a heat sink and electrical contact. The submount is separate from the substrate, carrier wafer and package or heatsink.

As shown, the present device can be enclosed in a suitable package. Such package can include those such as in TO-38 and TO-56 headers. Other suitable package designs and methods can also exist, such as TO-9 or flat packs where fiber optic coupling is required and even non-standard packaging. In a specific embodiment, the present device can be implemented in a co-packaging configuration.

In other embodiments, the present laser device can be configured in a variety of applications. Such applications include laser displays, metrology, communications, health care and surgery, information technology, and others. As an example, the present laser device can be provided in a laser display such as those described in U.S. Ser. No. 12/789,303 filed May 27, 2010, which claims priority to U.S. Provisional No. 61/182,105 filed May 29, 2009 and 61/182,106 filed May 29, 2009, each of which is hereby incorporated by reference herein.

While the above is a full description of the specific embodiments, various modifications, alternative constructions and equivalents may be used. As an example, the packaged device can include any combination of elements described above, as well as outside of the present specification. As used herein, the term "substrate" can mean the bulk substrate or can include overlying growth structures such as a gallium and nitrogen containing epitaxial region, or functional regions such as n-type GaN, combinations, and the like. Additionally, the examples illustrates two waveguide structures in normal configurations, there can be variations, e.g., other angles and polarizations. For semi-polar, the present method and structure includes a stripe oriented perpendicular to the c-axis, an in-plane polarized mode is not an Eigen-mode of the waveguide. The polarization rotates to elliptic (if the crystal angle is not exactly 45 degrees, in that special case the polarization would rotate but be linear, like in a half-wave plate). The polarization will of course not rotate toward the propagation direction, which has no interaction with the Al band. The length of the a-axis stripe determines which polarization comes out at the next mirror. Although the embodiments above have been described in terms of a laser diode, the methods and device structures can also be applied to any light emitting diode device. Therefore, the above description and illustrations should not be taken as limiting the scope of the present invention which is defined by the appended claims.

REFERENCES

1. Holder, C., Speck, J. S., DenBaars, S. P., Nakamura, S. & Feezell, D. Demonstration of Nonpolar GaN-Based Vertical-Cavity Surface-Emitting Lasers. *Appl. Phys. Express* 5, 092104 (2012).
2. Tamboli, A. Photoelectrochemical etching of gallium nitride for high quality optical devices. (2009). at <http://adsabs.harvard.edu/abs/2009PhDT . . . 68T>
3. Yang, B. MICROMACHINING OF GaN USING PHOTOELECTROCHEMICAL ETCHING. (2005).
4. Sink, R. Cleaved-Facet Group-III Nitride Lasers. (2000). at <http://siliconphotonics.ece.ucsb.edu/sites/default/files/publications/2000 Cleaved-Faced Group-III Nitride Lasers.PDF>
5. Bowers, J., Sink, R. & Denbaars, S. Method for making cleaved facets for lasers fabricated with gallium nitride and other noncubic materials. U.S. Pat. No. 5,985,687 (1999). at <http://www.google.com/patents?hl=en&lr=&vid=USPAT5985687&id=no8XAAAAEBAJ&oi=fnd&dq=Method+for+making+cleaved+facets+for+lasers+fabricated+with+gallium+nitride+and+other+noncubic+materials&printsec=abstract>
6. Holder, C. O., Feezell, D. F., Denbaars, S. P. & Nakamura, S. Method for the reuse of gallium nitride epitaxial substrates. (2012).
7. Hjort, K. Jour. Micromech. Microeng. 6 (1996) 370-375

What is claimed is:

1. A method for manufacturing an integrated multi-wavelength light emitting device, the method comprising:
    providing a first substrate having a first surface region;
    forming a first epitaxial material overlying the first surface region, the first epitaxial material comprising a release region, an n-type cladding region, a first active region comprising at least one active layer overlying the n-type cladding region, and a p-type cladding region overlying the active region, the first active region being configured for emission at a first wavelength;
    providing a second substrate having a second surface region;
    forming a second epitaxial material overlying the second surface region, the second epitaxial material comprising a release region, an n-type cladding region, a second active region comprising at least one active layer overlying the n-type cladding region, and a p-type cladding region overlying the active region, the second active region being configured for emission at a second wavelength;
    patterning the first epitaxial material and the second epitaxial material to form a plurality of first epitaxial dice and a plurality of second epitaxial dice overlying the first substrate and the second substrate, respectively, each of the plurality of first epitaxial dice and the plurality of second epitaxial dice corresponding to at least one light emitting device;
    transferring at least one of the first plurality of epitaxial dice and at least one of the second plurality of epitaxial dice from the first substrate and the second substrate, respectively, to a carrier wafer by selectively etching the release region, separating from the substrate each of the epitaxial dice that are being transferred, and selectively bonding to the carrier wafer each of the epitaxial dice that are being transferred; and
    processing the transferred first epitaxial dice and the second epitaxial dice on the carrier wafer to form a plurality of light emitting devices capable of emitting at least the first wavelength and the second wavelength.

2. The method of claim 1, wherein each of the plurality of the epitaxial dice formed on the first substrate and the second substrate is characterized by a first pitch and a second pitch between each pair of adjacent epitaxial dice, the first pitch and the second pitch being less than a design width; and wherein each of the transferred epitaxial dice is characterized by a third pitch and a fourth pitch between each pair of adjacent epitaxial dice, the third and fourth pitch being larger than the first pitch and the second pitch, respectively, and corresponding to the design width.

3. The method of claim 2, wherein each of the epitaxial dice is shaped as a mesa, each of the first pitch and the second pitch is between 1 µm and 10 µm, or between 10 micron and 50 microns, or between 50 µm and 100 µm, or between 100 µm and 500 µm with a length of 50 µm to 3000 µm; and the patterning comprises an etching process.

4. The method of claim 2, wherein each of the third pitch and the fourth pitch is between 50 microns and 200 microns, or between 200 microns and 500 microns, or between 500 microns and 1000 microns, or greater than 1000 microns.

5. The method of claim 1, wherein the carrier wafer is selected from AlN, SiC, sapphire, Si, GaN, GaAs.

6. The method of claim 1, wherein the first substrate and the second substrate are gallium and nitrogen containing materials.

7. The method of claim 1 wherein each of the first wavelength and the second wavelength is in the blue wavelength range to form at least a dual blue wavelength integrated multi-wavelength light emitting device.

8. The method of claim 7 wherein the light emitting device is configured as a laser diode device or a SLED device.

9. The method of claim 1 wherein the first wavelength is selected from a blue wavelength and the second wavelength is selected from a green wavelength to form at least a blue and green light emitting integrated multi-wavelength light emitting device.

10. The method of claim 9 wherein the light emitting device is configured as a laser diode device or a SLED device.

11. The method of claim 1, wherein the first substrate is a gallium and nitrogen containing material and the second substrate is a gallium and arsenic containing material.

12. The method of claim 1, further comprising:
    providing a third substrate having a third surface region;
    forming a third epitaxial material overlying the third surface region, the third epitaxial material comprising a release region, an n-type cladding region, a third active region comprising at least one active layer overlying the n-type cladding region, and a p-type cladding region overlying the active region, the third active region being configured for emission at a third wavelength;
    patterning the third epitaxial material to form a plurality of third epitaxial dice overlying the third substrate, each of the third epitaxial dice corresponding to at least one light emitting device;
    transferring at least one of the plurality of third epitaxial dice from the third substrate to the carrier wafer by selectively etching the release region, separating from the substrate the epitaxial dice that are being transferred, and selectively bonding to the carrier wafer the epitaxial dice that are being transferred; and processing the transferred first epitaxial dice, the second epitaxial dice, and the third epitaxial dice on the carrier wafer to form a plurality of light emitting devices capable of emitting at least the first wavelength, the second wavelength, and the third wavelength.

13. The method of claim 12, wherein the first substrate and second substrate are gallium and nitrogen containing materials and the first wavelength is a blue wavelength and the second wavelength is a green wavelength; and wherein the third substrate is a gallium and arsenic containing material and the third wavelength is selected from a red wavelength such that the integrated multi-wavelength light emitting device is configured to emit a first blue wavelength, a second green wavelength, and a third red wavelength to form an RGB light emitting device.

14. The method of claim 13, further comprising processing at least one of the first transferred epitaxial dice, the second transferred epitaxial dice, or the third transferred epitaxial dice to form an RGB laser diode device.

15. The method of claim 13, further comprising processing at least one of the first transferred epitaxial dice, the second transferred epitaxial dice, or the third transferred epitaxial dice to form an RGB SLED device.

16. The method of claim 1, wherein the carrier wafer is comprised of a gallium and arsenic containing material with a third surface region;

forming a third epitaxial material overlying the third surface region, the third epitaxial material comprising an n-type cladding region, a third active region comprising at least one active layer overlying the n-type cladding region, and a p-type cladding region overlying the active region, the third active region being configured for emission at a third wavelength; and processing the gallium and arsenic epitaxial material to form light emitting devices emitting the third wavelength such that the integrated multi-wavelength light emitting device emits a first wavelength, a second wavelength, and a third wavelength.

17. The method of claim 16 wherein the first wavelength is a blue wavelength, the second wavelength is a green wavelength, and the third wavelength is a red wavelength such that the integrated multi-wavelength light emitting device is an RGB device capable of emitting a red wavelength, green wavelength, and blue wavelength.

18. The method of claim 1, wherein the optical emission comprising one or more of the wavelengths emitted from the integrated multiple-wavelength light emitting device is optically coupled to one or more optical element such as a lens, a reflector, an aperture, a fiber optic cable, or a waveguide element.

19. The method of claim 1, wherein each of the first epitaxial material and second epitaxial material comprise at least one of GaN, AlN, InN, InGaN, AlGaN, InAlN, InAlGaN, AlAs, GaAs, GaP, InP, AlP, AlGaAs, AlInAs, InGaAs, AlGaP, AlInP, InGaP, AlInGaP, AlInGaAs, or AlInGaAsP.

20. The method of claim 1, wherein the transferring comprises selectively bonding each of the epitaxial dice that are being transferred to the carrier wafer, each of the transferred epitaxial dice being coupled to a bonding pad on the carrier wafer by one of the plurality of bonds; whereupon each of the plurality of bonds is at least one of metal-metal pairs, oxide-oxide pairs, spin-on-glass, soldering alloys, polymers, photoresists, or wax, and wherein a portion of the epitaxial material remains intact following the selective etching of the release region.

21. The method of claim 1, wherein the selective etching uses a bandgap selective photo-electrical-chemical (PEC) etching of the release region and/or a compositionally selective wet etching of the release region.

22. The method of claim 1, wherein the selective etching selectively removes the release region while leaving an anchor region in tact to support the epitaxial dice during the selective bonding, and the anchor region separates after the selective bonding.

23. The method of claim 1, further comprising forming a metal material overlying the plurality of epitaxial dice before the transferring, while leaving exposed one or more anchor regions, which are configured to selectively break and separate from each of the epitaxial dice after the selective bonding.

24. The method of claim 1, wherein the first and/or second substrate is reclaimed and prepared for reuse after transferring each of epitaxial dice to one or more carrier wafers.

25. The method of claim 1 wherein forming the multi-wavelength light emitting device comprises forming a ridge to provide a lateral waveguide region in an epitaxial mesa and comprises forming facet regions at ends of an epitaxial mesa to form a laser diode device or SLED device.

26. The method of claim 1, wherein the multi-wavelength light emitting device is configured as a multi laser diode device or a multi SLED device and comprises a pair of facets configured from a cleaving process or an etching process on each of the multi laser diode devices or SLED devices; wherein the etching process being selected from inductively coupled plasma etching, chemical assisted ion beam etching, or reactive ion beam etching; wherein at least one of the pair of facets on the multi laser diode devices or SLED devices is configured as an emitting aperture to output a beam light.

27. The method of claim 1, wherein the multi-wavelength light emitting device is configured as a multi laser diode device or a multi SLED device and comprises multiple emitting apertures; wherein at least one of the multiple emitting apertures is configured to emit each of the multi wavelengths; and wherein the multiple emitter apertures are configured within 1 mm, within 500 um, within, 200 um, within 100 um, or within 50 um of each other such that the output beams are closely spaced.

28. The method of claim 27 wherein the multi-wavelength light emitting device is applied to a projection display system apparatus including a micro-display selected from a MEMS scanning mirror, DLP, or LCOS micro-display.

29. The method of claim 28 wherein at least one of the collimation or the beam combination of the multiple wavelength emission is achieved with a single optical element.

30. The method of claim 28 wherein an image correction method is applied to correct distortions that may result from the spatial displacement of the multiple-wavelength emission sources.

31. The method of claim 30 wherein the image correction method comprises an optical camera to capture displaced and rotated color images and determine displacement and rotation of images of different color with respect to each other; and wherein a video processor applying corrections to the standard video stream in order to increase the spatial resolution of displayed images to eliminate misalignment of color images and adjust timing and modulation of the light source drivers in synchronization with the motion of the scanning mirror.

32. The method of claim 30 wherein the image correction method comprises the capturing of multiple color images at simultaneously and wherein one of these color images is selected as the reference image; wherein a calibration or measurement of displacement and rotation of the color images with respect to reference color image is performed, and applying, using the calibration or measurement, an algorithmic modification of the video streams to modulate timing and intensity of multiple light sources by the electronic processor and continuous application of modified driving waveforms to light sources to each subsequent video or static image.

33. A method for manufacturing an integrated multi-wavelength light emitting device, the method comprising:
providing a first gallium and arsenic containing substrate having a first surface region;
forming a first gallium and arsenic containing epitaxial material overlying the first surface region, the first epitaxial material comprising a release region, an n-type cladding region, a first active region comprising at least one active layer overlying the n-type cladding region, and a p-type cladding region overlying the active region, the first active region being configured for emission at a first red wavelength
providing a second gallium and nitrogen containing substrate having a second surface region;
forming a second gallium and nitrogen containing epitaxial material overlying the second surface region, the second epitaxial material comprising a release region, an n-type cladding region, a second active region comprising at least one active layer overlying the n-type cladding region, and a p-type cladding region overlying the active region, the second active region being configured for emission at a second green wavelength
providing a third gallium and nitrogen containing substrate having a third surface region;
forming a third gallium and nitrogen containing epitaxial material overlying the third surface region, the third epitaxial material comprising a release region, an n-type cladding region, a third active region comprising at least one active layer overlying the n-type cladding region, and a p-type cladding region overlying the active region, the third active region being configured for emission at a third blue wavelength
patterning the first epitaxial material, the second epitaxial material, and the third epitaxial material to form a plurality of first epitaxial dice, a plurality of second epitaxial dice, and a plurality of third epitaxial dice overlying the first substrate, the second substrate, and the third substrate, respectively, each of the-epitaxial dice corresponding to at least one light emitting device;
transferring at least one of the first plurality of epitaxial dice, the second plurality of epitaxial dice, and the third plurality of epitaxial dice from the first substrate, the second substrate, and the third substrate to a carrier wafer by selectively etching the release region, separating from each of the first substrate, the second substrate, and the third substrate each of the first epitaxial dice, the second epitaxial dice, and the third epitaxial dice that is being transferred, and selectively bonding to the carrier wafer each of the first epitaxial dice, the second epitaxial dice, and the third epitaxial dice that is being transferred; and
processing the transferred first epitaxial dice, the second epitaxial dice, and the third epitaxial dice on the carrier wafer to form an RGB emitting devices capable of emitting a red wavelength, a green wavelength, and a blue wavelength.

34. The method of claim 33, wherein the integrated multiple wavelength light emitting device is an RGB laser diode device comprising a red laser diode, a green laser diode, and a blue laser diode.

35. The method of claim 33 wherein the integrated multiple wavelength light emitting device is an RGB SLED device comprising a red SLED, a green SLED, and a blue SLED.

36. The method of claim 33, wherein the optical emission comprising a red wavelength, a green wavelength, and a blue wavelengths emitted from the integrated multiple-wavelength light emitting device is optically coupled to a micro-display such as a MEMS scanning mirror, DLP, or LCOS.

* * * * *